United States Patent
Sim et al.

(10) Patent No.: US 9,997,525 B2
(45) Date of Patent: Jun. 12, 2018

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Jae-Hwang Sim, Hwaseong-si (KR); Hojun Seong, Suwon-si (KR); Bongtae Park, Seoul (KR); Woo-Jung Kim, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/398,090

(22) Filed: Jan. 4, 2017

(65) Prior Publication Data
US 2017/0221755 A1    Aug. 3, 2017

(30) Foreign Application Priority Data
Feb. 1, 2016 (KR) .......................... 10-2016-0012411

(51) Int. Cl.
*H01L 29/788* (2006.01)
*H01L 27/11529* (2017.01)
*H01L 27/11573* (2017.01)

(52) U.S. Cl.
CPC .. *H01L 27/11529* (2013.01); *H01L 27/11573* (2013.01)

(58) Field of Classification Search
CPC ... H01L 21/84; H01L 23/5226; H01L 23/528; H01L 23/5329; H01L 29/0649
See application file for complete search history.

(56) References Cited

U.S. PATENT DOCUMENTS

| | | | |
|---|---|---|---|
| 7,679,133 B2 | 3/2010 | Son et al. | |
| 8,142,986 B2 | 3/2012 | Sim et al. | |
| 8,216,947 B2 | 7/2012 | Lee et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,785,327 B2 | 7/2014 | Kikutani | |
| 8,846,541 B2 | 9/2014 | Min et al. | |
| 8,874,253 B2 | 10/2014 | Chen et al. | |
| 8,877,647 B2 | 11/2014 | Tsai | |
| 8,901,746 B2 | 12/2014 | Park et al. | |
| 8,921,233 B2 | 12/2014 | Sim et al. | |
| 2008/0280442 A1 | 11/2008 | Kwak et al. | |
| 2011/0233648 A1 | 9/2011 | Seol et al. | |
| 2012/0100706 A1* | 4/2012 | Sim | H01L 21/0337 438/591 |
| 2013/0087883 A1* | 4/2013 | Mathew | H01L 29/0649 257/510 |

(Continued)

FOREIGN PATENT DOCUMENTS

KR    10-2010-0006012 A    1/2010

*Primary Examiner* — Sitaramarao S Yechuri
(74) *Attorney, Agent, or Firm* — Lee & Morse P.C.

(57) ABSTRACT

A semiconductor device may include a first conductive pattern having a line portion and a pad portion connected to the line portion on a substrate, a gate insulating pattern and a second conductive pattern sequentially stacked on the substrate, and a capping layer disposed on the first and second conductive patterns. A first trench is defined in an upper portion of the substrate adjacent to one side of the second conductive pattern, and the capping layer at least partially fills the first trench.

20 Claims, 76 Drawing Sheets

(56) References Cited

U.S. PATENT DOCUMENTS

2014/0065820 A1   3/2014  Sim et al.
2015/0054176 A1   2/2015  Sim et al.
2016/0247909 A1*  8/2016  Matsuno ........... H01L 29/66825

* cited by examiner

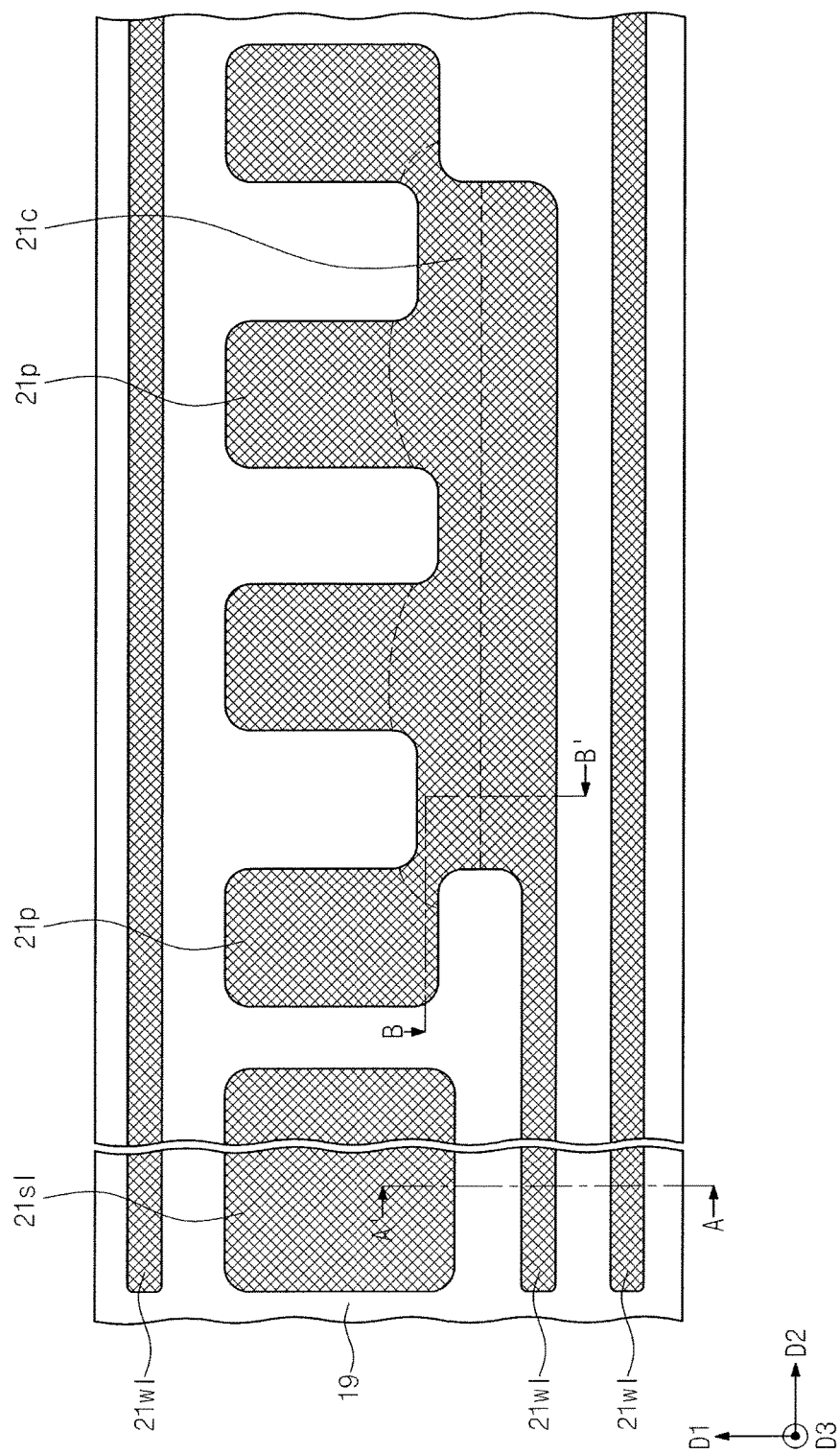

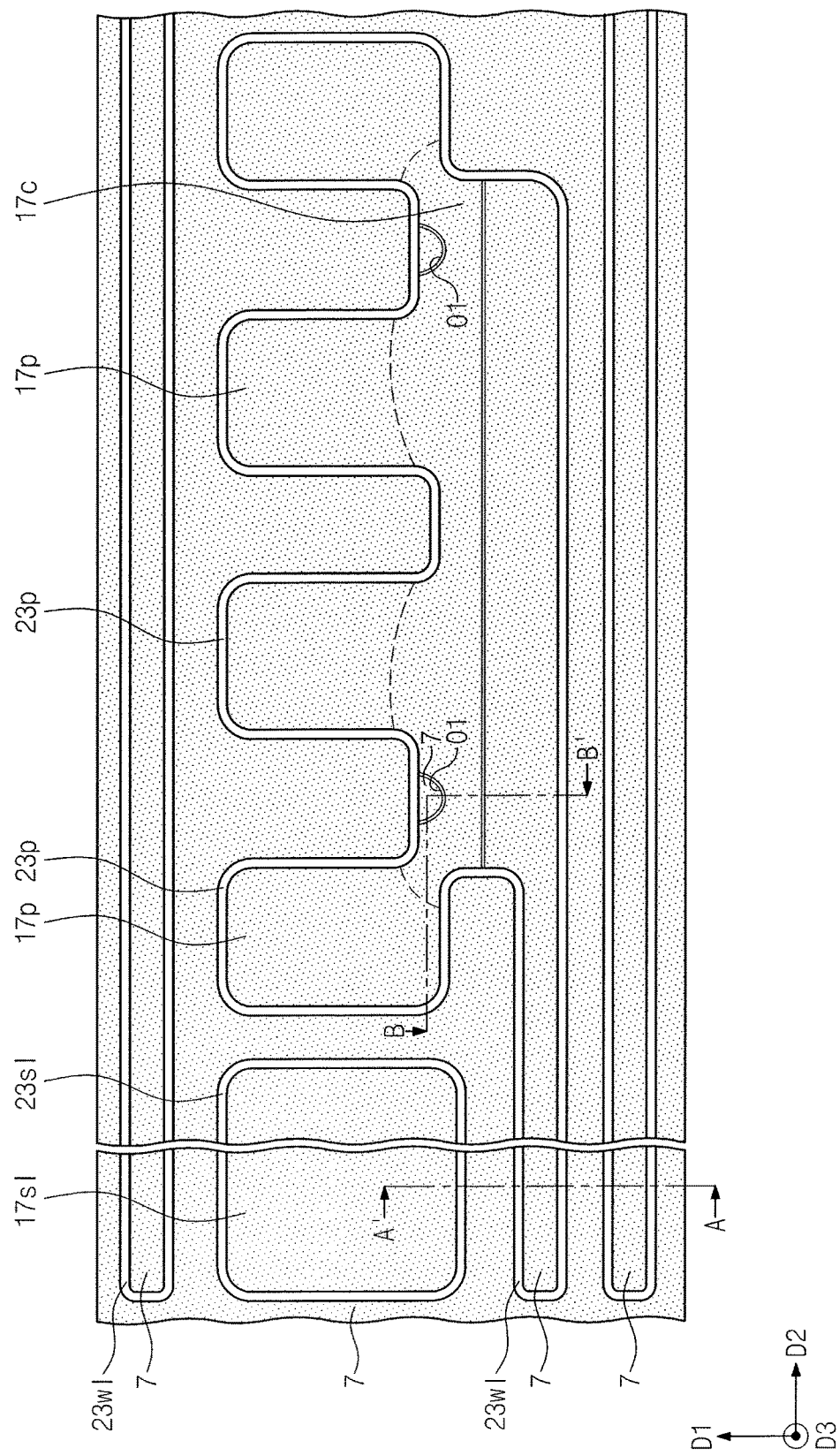

SEMICONDUCTOR DEVICES AND METHODS OF FABRICATING THE SAME

CROSS-REFERENCE TO RELATED APPLICATION

Korean Patent Application No. 10-2016-0012411, filed on Feb. 1, 2016, in the Korean Intellectual Property Office, and entitled: "Semiconductor Devices and Methods of Fabricating the Same," is incorporated by reference herein in its entirety.

BACKGROUND

1. Field

Example embodiments generally relate to semiconductor devices and, more particularly, to semiconductor devices including a flash memory device and methods of fabricating the same.

2. Description of the Related Art

Due to miniaturization, multifunction, and/or low manufacturing cost, a semiconductor device is being spotlighted as an important factor in the electronic industry. Semiconductor devices may be classified into semiconductor memory devices storing logical data, semiconductor logical devices performing operation processes of logical data, and hybrid semiconductor devices including a memory element and a logical element. As the electronic industry develops, requirements for characteristics of the semiconductor device are gradually increasing. For example, requirements for high reliability, high speed and/or multifunction with respect to a semiconductor device are gradually increasing. To satisfy those requirements, structures of the semiconductor device become more complicate and the semiconductor device is also being highly integrated.

Double patterning technology during manufacturing allows to achieve a small feature size that is beyond a resolution limitation of an exposure system. For example, when using conventional double patterning technology, the formation of fine pitch patterns may include forming sacrificial patterns, e.g., using a photolithography process, forming spacers on sidewalls of the sacrificial patterns, removing the sacrificial patterns, and etching an etch target layer using the spacers as an etch mask. However, as integration density of the semiconductor device increases, there is an increasing demand for more advanced patterning methods.

SUMMARY

Some embodiments provide a semiconductor device without a height difference between different areas of a substrate.

Some embodiments also provide a fabrication method capable of realizing fine patterns, without bridge or mask misalignment.

According to example embodiments, a semiconductor device may include a first conductive pattern including a line portion and a pad portion connected to the line portion on a substrate, a gate insulating pattern and a second conductive pattern sequentially stacked on the substrate, and a capping layer disposed on the first and second conductive patterns. A first trench may be defined in an upper portion of the substrate adjacent to a side of the second conductive pattern, and the capping layer may at least partially fill the first trench.

According to example embodiments, a semiconductor device may include a device isolation layer defining at least one active region in an upper portion of a substrate, a first conductive pattern including a first line portion and a first pad portion connecting the first line portion on the substrate; and a second conductive pattern including a second line portion and a second pad portion connecting the second line portion. The first and second conductive patterns may be adjacent to each other and each of the first and second line portions may cross over at least one of active regions. A first trench may be defined in an upper portion of the substrate between the first and second pad portions and the first trench may have a deeper depth than a depth of the device isolation layer.

According to example embodiments, a semiconductor device may include a device isolation layer defining at least one active region in an upper portion of a substrate, a first word line and a second word line crossing the active regions and extending parallel to each other in a first direction, and a first selection line and a second selection line disposed between the first and second word lines. The second word line may be spaced apart from the first word line in a second direction crossing the first direction. A first trench may be defined in an upper portion of the substrate between the first and second selection lines and the first trench may have a deeper depth than a depth of the device isolation layer.

According to example embodiments, a semiconductor device may include a first conductive pattern including a line portion and a pad portion connected to the line portion on a substrate, a gate insulating pattern and a second conductive pattern sequentially stacked on the substrate, a first trench in an upper portion of the substrate, a lateral sidewall of the gate insulating pattern and a lateral sidewall of the second conductive pattern being level with each other and facing the first trench, and the lateral sidewall of the gate insulating pattern abutting a top of the first trench, and a capping layer on the first and second conductive patterns, the capping layer at least partially filling the first trench.

According to example embodiments, a method of fabricating a semiconductor device may include sequentially forming a gate insulating layer and a conductive layer on a substrate, patterning the conductive layer to form conductive patterns, forming an insulating layer on the conductive patterns, and removing at least a portion of the insulating layer and the conductive patterns. Forming a first conductive pattern of the conductive patterns may include forming a plurality of line portions and a pad portion connecting at least one of the line portions, and forming air gaps between the line portions during formation of the insulating layer.

BRIEF DESCRIPTION OF THE DRAWINGS

Features will become apparent to those of skill in the art by describing in detail exemplary embodiments with reference to the attached drawings, in which:

FIGS. 2A to 17A illustrate plan views of processing stages in the fabrication of a semiconductor device according to example embodiments.

FIGS. 2B to 17B illustrate cross-sectional views taken along lines A-A' and B-B' of FIGS. 2A to 17A, respectively.

FIGS. 19A to 25A illustrate plan views of processing stages in the fabrication of a semiconductor device according to example embodiments.

FIGS. 19B to 25B illustrate cross-sectional views taken along lines A-A' and B-B' of FIGS. 19A to 25A, respectively.

FIGS. 27A to 37A illustrate plan views of process stages in the fabrication of a semiconductor device according to example embodiments.

FIGS. 27B to 37B illustrate cross-sectional views taken along lines A-A' and B-B' of FIGS. 27A to 37A, respectively.

DETAILED DESCRIPTION

Figure 1A:
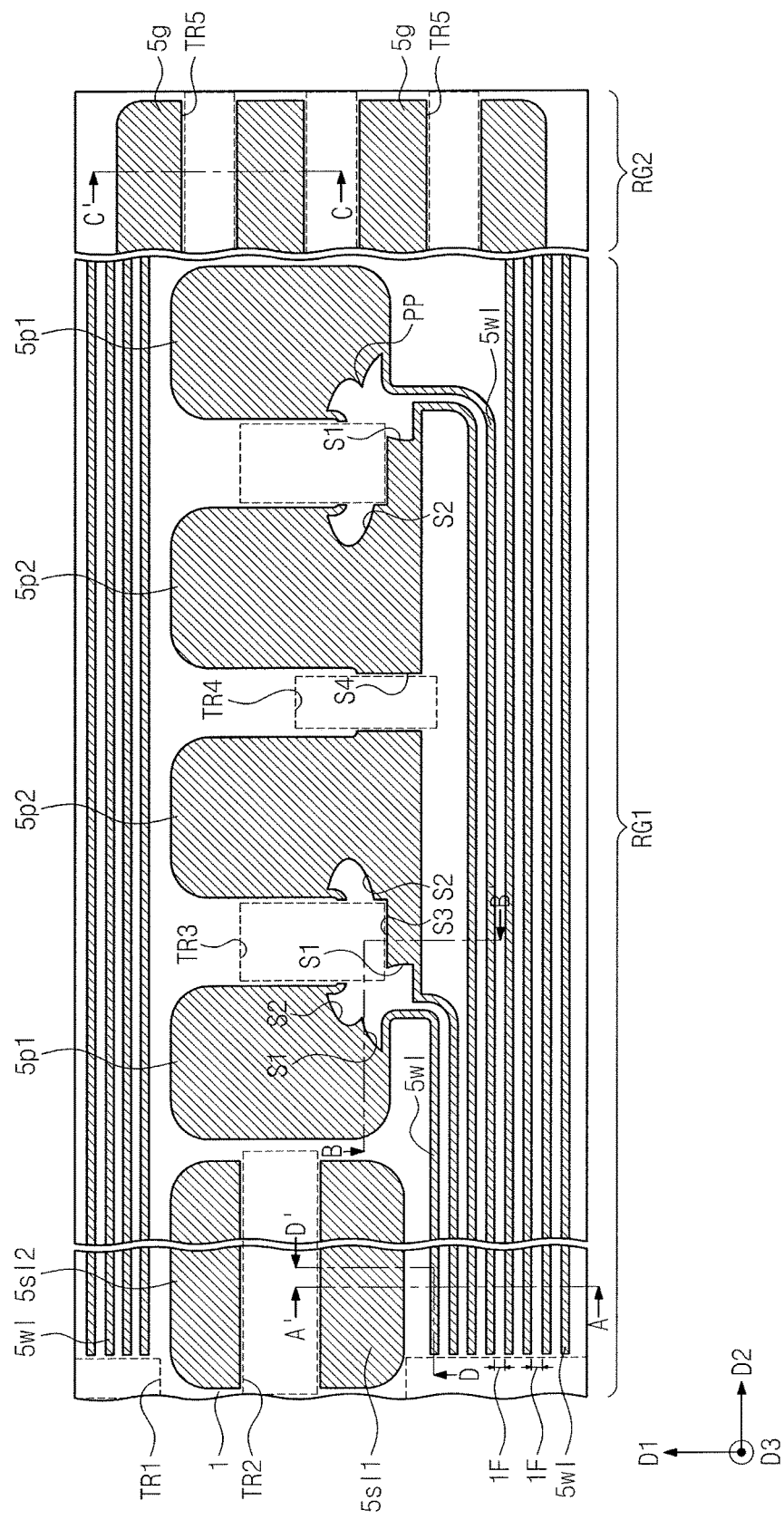
FIG. 1A illustrates a plan view of a semiconductor device according to example embodiments.
Figure 1B:
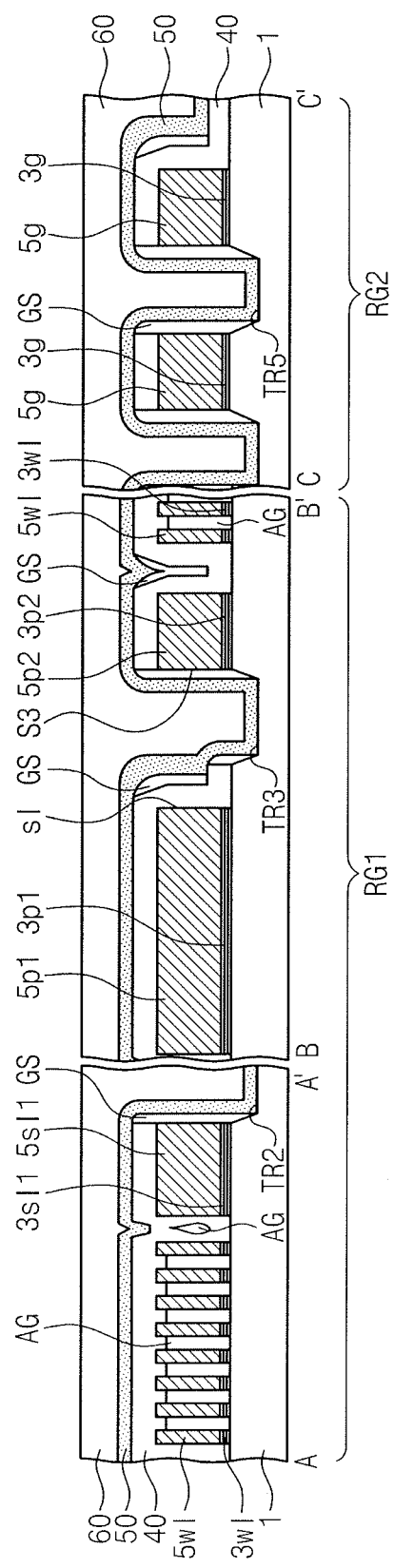
FIG. 1B illustrates a cross-sectional view taken along lines A-A', B-B' and C-C' of FIG. 1A.
Figure 1C:
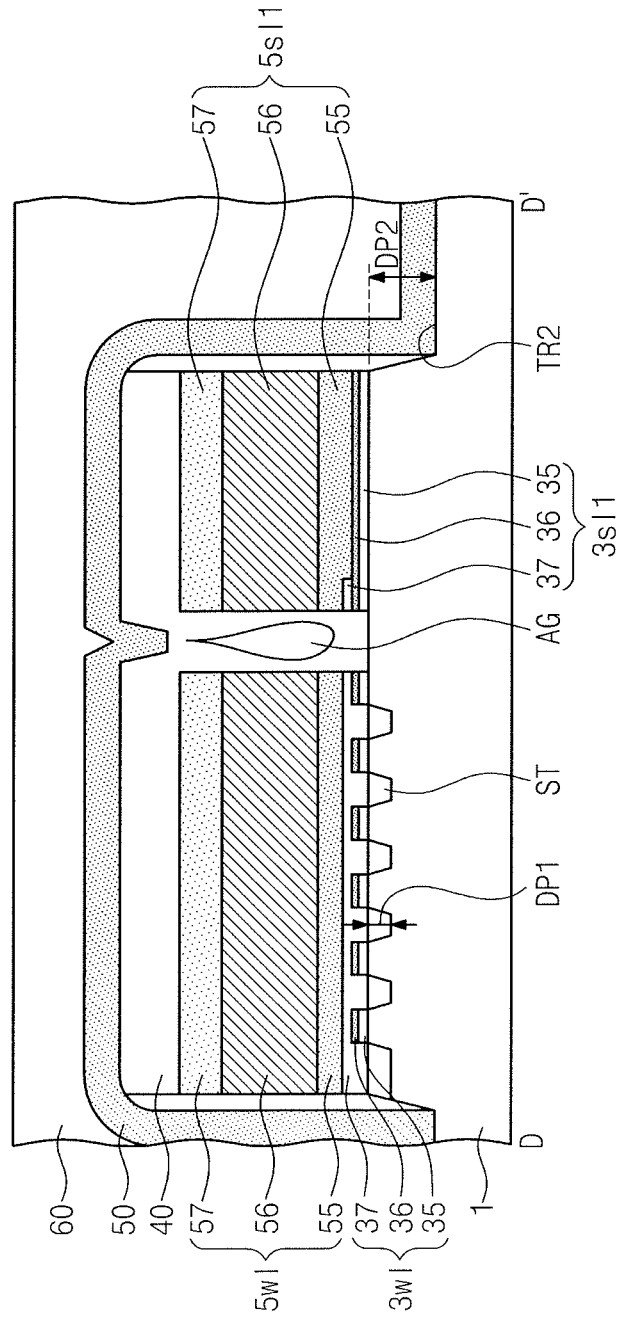
FIG. 1C illustrates a cross-sectional view taken along line D-D' of FIG. 1A.

FIG. 1A is a plan view illustrating a semiconductor device according to example embodiments. FIG. 1B is a cross-sectional view taken along the lines A-A', B-B' and C-C' of FIG. 1A. FIG. 1C is a cross-sectional view taken along the line D-D' of FIG. 1A.

Referring to FIGS. 1A to 1C, a substrate 1 including a first region RG1 and a second region RG2 may be provided. The first and second regions RG1 and RG2 may be spaced apart from each other. The first region RG1 may be a string region of NAND FLASH memory device, and the second region RG2 may be a peripheral region of NAND FLASH memory device. The substrate 1 may be a semiconductor substrate, e.g., a silicon substrate, a germanium substrate, a silicon-germanium substrate or a compound semiconductor substrate. The substrate 1 may be doped with a first type dopant.

Device isolation layer ST may be disposed in an upper portion of the substrate 1. The device isolation layer ST may define string active regions in the first region RG1 (see FIG. 1C). The device isolation layer ST may also define peripheral active regions in the second region RG2. That is, the string active regions and the peripheral active regions may be portions of the substrate 1 surrounded by the device isolation layers ST. Each of the string active regions and the peripheral active regions may include channel regions. Accordingly, when semiconductor devices according to present embodiments are operated, channels may be formed in the channel regions.

Conductive patterns $5sl1$, $5sl2$, $5wl$, $5p1$ and $5p2$ may be disposed on the first region RG1, and other conductive patterns $5g$ may be disposed on the second region RG2. The conductive patterns $5sl1$, $5sl2$, $5wl$, $5p1$ and $5p2$ may include selection lines $5sl1$ and $5sl2$ and word lines $5wl$, $5p1$ and $5p2$. The selection lines $5sl1$ and $5sl2$ and the word lines $5wl$, $5p1$ and $5p2$ may be disposed on the string active regions. Other conductive patterns $5g$ disposed on the second region RG2 may include peripheral gate patterns $5g$.

The word lines $5wl$, $5p1$ and $5p2$ may include line portions $5wl$ and pad portions $5p1$ and $5p2$. The line portions $5wl$ may extend in a second direction D2 parallel to a top surface of the substrate 1. The line portions $5wl$ may be spaced apart from each other in a first direction D1 crossing the second direction D2. In some embodiments, a width of each line portion $5w$ may be 1F, and a space between the line portions may be 1F. For example, each of the word lines $5wl$, $5p1$ and $5p2$ may serve as a word line of NAND FLASH memory device. In further embodiments, each of the word lines $5wl$, $5p1$ and $5p2$ may serve as bit lines of MRAM, PRAM or RRAM devices.

The pad portions $5p1$ and $5p2$ may include a first pad portion $5p1$ and a second pad portion $5p2$ that are separated from each other in the second direction D2. Each of the pad portions $5p1$ and $5p2$ may have a width, e.g., along the second direction D2, that is greater than a width of one line portion $5wl$, e.g., along the first direction D1. The pad portions $5p1$ and $5p2$ and the line portions $5wl$ may be electrically connected to each other, respectively.

When viewed in a plan view, the first pad portion $5p1$ may include a concave first sidewall S1 and a concave second sidewall S2. The first and second sidewalls S1 and S2 of the first pad portion $5p1$ may be adjacent to each other. A protruding portion PP may be defined between the first and second sidewalls S1 and S2 of the first pad portion $5p1$. When viewed in a plan view, the second pad portion $5p2$ may include a concave first sidewall S1, a concave second sidewall S2, and a linear third sidewall S3. The third sidewall S3 of the second pad portion $5p2$ may be disposed between the first and second sidewalls S1 and S2 thereof.

Two adjacent pairs of pad portions, each of which includes two adjacent pad portions $5p1$ and $5p2$, may have a substantial mirror symmetry with respect to a midpoint therebetween. That is, two adjacent second pad portions $5p2$ may have a substantial mirror symmetry with respect to each other. Two first pad portions $5p1$ may be substantially in mirror symmetry with respect to a pair of second pad portions $5p2$ adjacent to each other. For example, referring to FIG. 1, a left pair of first and second pad portions $5p1$ and $5p2$ are symmetrical with respect to a right pair of first and second pad portions $5p1$ and $5p2$.

The selection lines $5sl1$ and $5sl2$ may include a first selection line $5sl1$ and a second selection line $5sl2$. The selection lines $5sl1$ and $5sl2$ may extend in the second direction D2. The selection lines $5sl1$ and $5sl2$ may be spaced apart from each other in the first direction D1. In NAND FLASH memory device, each of the selection lines $5sl1$ and $5sl2$ may serve as a ground selection line or a string selection line.

The line portions $5wl$ may include first line portions $5wl$ that are disposed adjacent to the first selection line $5sl$ and second line portions $5wl$ that are disposed adjacent to the second selection line $5sl$. That is, the first and second selection lines $5sl1$ and $5sl2$ may be interposed between the first and second line portions $5wl$. In NAND FLASH memory device, the first selection line $5sl1$ and the first line portions $5wl$ may constitute a first string, and the second selection line $5sl2$ and the second line portions $5wl$ may constitute a second string.

Referring back to FIG. 1C, each of the conductive patterns $5sl1$, $5sl2$, $5wl$, $5p1$, $5p2$ and $5g$ may include a lower conductive pattern 55, an upper conductive pattern 56, and a mask pattern 57 that are sequentially stacked on the substrate 1.

Gate insulating patterns $3sl1$, $3sl2$, $3wl$, $3p1$, $3p2$, and $3g$ may be interposed between the conductive patterns $5sl1$, $5sl2$, $5wl$, $5p1$, $5p2$ and $5g$, and the substrate 1, respectively (FIG. 1B). Each of the gate insulating patterns $3sl1$, $3sl2$, $3wl$, $3p1$, $3p2$ and $3g$ may include a tunnel insulating pattern 35, a charge storage pattern 36, and a blocking insulating pattern 37 that are sequentially stacked on the substrate 1. The lower conductive patterns 55 of the conductive patterns $5sl1$, $5sl2$, $5wl$, $5p1$, $5p2$ and $5g$ may be disposed on the blocking insulating patterns 37, respectively.

The tunnel insulating pattern 35 may be a single- or multi-layered structure including at least one of a silicon oxynitride layer, a silicon oxide layer, a silicon nitride layer and a metal oxide layer.

The charge storage pattern 36 may include a doped polysilicon layer or an undoped polysilicon layer. The charge storage pattern 36 may include a charge trap layer with trap sites storing charge. For example, the charge trap layer may include at least one of a silicon nitride layer, a metal nitride layer, a metal oxynitride layer, a metal silicon oxide layer, a metal silicon oxynitride layer, and nanodots.

The blocking insulating pattern 37 may be a single- or multi-layered structure including at least one of a silicon oxynitride layer, a silicon oxide layer, a silicon nitride layer and a high-k dielectric layer. The high-k dielectric layer may include at least one of a metal oxide layer, a metal nitride layer, and a metal oxynitride layer. For example, the blocking insulating pattern 37 may be a multi-layered structure having a stacked silicon oxide/silicon nitride/silicon oxide.

The upper conductive pattern 56 may have a different material from the lower conductive pattern 55. For example, the lower conductive pattern 55 may include a doped and/or undoped polysilicon, and the upper conductive pattern 56 may include metal and/or metal silicide. The metal may include at least one of tungsten, titanium, cobalt, and tantalum. The upper conductive pattern 56 may have a specific resistance lower than that of the lower conductive pattern 55.

The mask pattern 57 may include at least one of a silicon oxynitride layer, a silicon nitride layer and a silicon oxide layer.

The lower conductive pattern 55 of each of the selection lines 5s/1 and 5s/2 may penetrate the blocking pattern to be in direct contact with the charge storage pattern 36. The peripheral gate patterns 5g may also have the same structure as the selection lines 5s/1 and 5s/2.

First to fifth trenches TR1, TR2, TR3, TR4 and TR5 may be defined in an upper portion of the substrate 1. When viewed in a plan view (FIG. 1), the first trench TR1 may be adjacent to an end portion of the line portions 5wl. The second trench TR2 may be disposed between the first and second selection lines 5s/1 and 5s/2. The third trench TR3 may be disposed between the first and second pad portions 5p1 and 5p2. The fourth trench TR4 may be disposed between two adjacent second pad portions 5p2. The fifth trench TR5 may be disposed between the peripheral gate patterns 5g. The first to fifth trenches TR1-TR5 may have a substantially same depth.

For example, referring to FIG. 1C, the second trench TR2 may have substantially the same depth DP2 as trenches TR1 and TR3-TR5 in FIG. 1A. As further illustrated in FIG. 1C, the depth DP2 of the trenches TR1-TR5 may be deeper than depth DP1 of the device isolation layers ST, e.g., the depth DP2 may be larger than the DP1 as measured from a top surface of the substrate 1 toward a bottom surface of the substrate 1. For example, the first trench TR1 may be recessed deeper in depth than the device isolation layer ST which is adjacent to the end portion of the line portions 5wl.

An insulating layer 40, a capping layer 50, and an interlayer insulating layer 60 may be provided on the conductive patterns 5s/1, 5s/2, 5wl, 5p1, 5p2 and 5g. Sidewalls of the conductive patterns 5s/1, 5s/2, 5wl, 5p1, 5p2 and 5g adjacent to the trenches TR1-TR5 may be vertically aligned with a sidewall of the insulating layer 40, e.g., a lateral sidewall of the insulating layer 40 may be coplanar and level with a corresponding lateral sidewall of a respective one of the conductive patterns 5s/1, 5s/2, 5wl, 5p1, 5p2.

Air gaps AG, which are surrounded by the insulating layer 40, may be defined between the line portions 5wl. The air gaps AG may also be defined between the line portions 5wl and the selection lines 5s/1 and 5s/2. Due to the air gaps AG, a parasitic capacitance may be reduced between the line portions 5wl, and an operation speed of the device may be improved.

Gate spacers GS may be disposed on the sidewalls of the conductive patterns 5s/1, 5s/2, 5wl, 5p1, 5p2 and 5g adjacent to the trenches TR1-TR5, e.g., the gate spacers GS may be between the capping layer 50 and corresponding lateral sidewalls of the conductive patterns 5s/1, 5s/2, 5wl, 5p1, 5p2 and 5g adjacent to the trenches TR1-TR5. The gate spacer GS may cover a sidewall of the end portion of the line portions 5wl. The gate spacer GS may cover a sidewall of the selection lines 5s/ and 5s/2 adjacent to the second trench TR2. The gate spacer GS may cover the third sidewall S3 of the second pad portion 5p2 adjacent to the second trench TR3. The gate spacer GS may cover a sidewall of the peripheral gate pattern 5g adjacent to the fifth trench TR5. Lower portions of the gate spacers GS may partially fill the trenches TR1-TR5. Furthermore, the gate spacers GS may cover the lateral sidewall of the insulating layer 40 together with the sidewalls of the conductive patterns 5s/1, 5s/2, 5wl, 5p1, 5p2 and 5g.

The capping layer 50 may cover the insulating layer 40 and the gate spacers GS. The capping layer 50 may partially fill the trenches TR1-TR5. For example, the capping layer 50 may directly cover bottom surfaces of the trenches TR1-TR5. Even though not shown in the drawings, an additional insulating layer may be interposed between the insulating layer 40 and the capping layer 50. The capping layer 50 may be spaced apart from the device isolation layer ST.

A top surface of the insulating layer 40, which is disposed on the conductive patterns 5s/1, 5s/2, 5wl, 5p1 and 5p2 of the first region RG1, may be located at substantially the same level as a top surface of the insulating layer 40, which is disposed on the peripheral gate patterns 5g of the second region RG2. Furthermore, a top surface of the capping layer 50, which is disposed on the conductive patterns 5s/1, 5s/2, 5wl, 5p1 and 5p2 of the first region RG1, may be located at substantially the same level as a top surface of the capping layer 50, which is disposed on the peripheral gate patterns 5g of the second region RG2.

An interlayer insulating layer 60 may cover the capping layer 50. The interlayer insulating layer 60 may have a substantially flat top surface. The interlayer insulating layer 60 may completely fill remaining portions of the trenches TR1-TR5, e.g., the interlayer insulating layer 60 may completely fill remaining portions of the trenches TR1-TR5 above the capping layer 50.

For example, the insulating layer 40 may include a silicon oxide layer or a silicon oxynitride layer. The gate spacers GS may include a silicon oxynitride layer or a silicon nitride layer. The capping layer 50 may include a silicon oxynitride layer or a silicon nitride layer. The interlayer insulating layer 60 may include a silicon oxide layer, a silicon oxynitride layer or a carbon-doped silicon oxide layer.

FIGS. 2A to 17A are plan views illustrating processing stages in the fabrication of semiconductor devices according to example embodiments. FIGS. 2B to 17B are cross-sectional views taken along lines A-A' and B-B' of FIGS. 2A to 17A, respectively. The present embodiments show processing stages in the fabrication of a first region RG1 of the semiconductor device previously described with reference to FIGS. 1A through 1C.

Figure 2B:
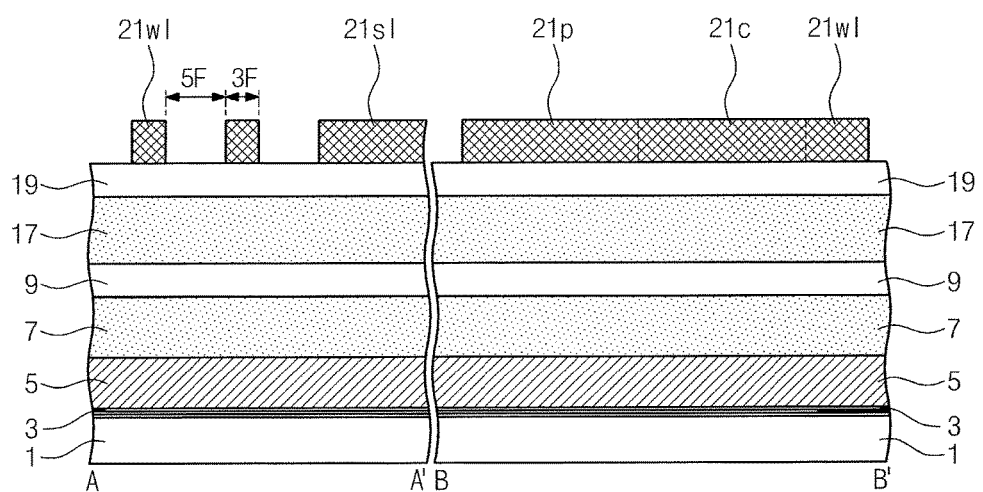

Referring to FIGS. 2A and 2B, a gate insulating layer 3, a conductive layer 5, a first mask layer 7, a second mask layer 9, a third mask layer 17, and a fourth mask layer 19 may be sequentially formed on the substrate 1. The substrate 1 may be a semiconductor substrate, e.g., a silicon substrate, a germanium substrate, a silicon-germanium substrate or a compound semiconductor substrate, but is not limited thereto.

In some embodiments, at least a portion of the conductive layer 5 may serve as an etch target layer. The conductive layer 5 may include at least one of a doped polysilicon layer, an undoped polysilicon layer, a metal layer, and a metal silicide layer. The conductive layer 5 may include a lower conductive layer, an upper conductive layer, and a mask layer that are sequentially stacked on the substrate 1. Detailed descriptions of the lower conductive layer, the upper conductive layer, and the mask layer may be similar to those of the lower conductive pattern 55, the upper conductive pattern 56, and the mask pattern 57.

The gate insulating layer 3 may be used to etch the target layer together with the conductive layer 5. The gate insulating layer 3 may be a single- or multi-layered structure including at least one of a silicon oxynitride layer, a silicon oxide layer, a silicon nitride layer, or a metal oxide layer. The gate insulating layer 3 may include a tunnel insulating layer, a charge storage layer, and a blocking insulating layer that are sequentially stacked on the substrate 1. Alternatively, the charge storage layer may be replaced with a floating conductive layer, e.g., a doped polysilicon layer or an undoped polysilicon layer. Detailed descriptions of the tunnel insulating layer, the charge storage layer and the blocking insulating layer may be similar to those of the tunnel insulating pattern 35, the charge storage pattern 36, and the blocking insulating pattern 37 described with reference to FIG. 1C.

The first and third mask layers 7 and 17 may be formed of the same material, e.g., spin-on-hard mask (SOH) or spin-on-carbon (SOC) layer. Similarly, the second and fourth mask layers 9 and 19 may be formed of the same material, e.g., a silicon oxynitride layer (SiON).

First photoresist patterns 21sl, 21wl, 21p, and 21c may be formed on the fourth mask layer 19 by performing a first photolithography process. The first photoresist patterns 21sl, 21wl, 21p, and 21c may include a first selection line photoresist pattern 21sl and a first word line photoresist pattern 21wl, 21c, and 21p.

The first word line photoresist pattern 21wl, 21c, and 21p may include a first photoresist line portion 21wl, a first photoresist pad portion 21p, and a first photoresist connecting portion 21c connecting them. The first word line photoresist pattern 21wl, 21c and 21p may be formed to serve as a word line of a NAND FLASH memory device.

The first photoresist line portion 21wl may extend in the second direction D2 parallel to the substrate 1. The first photoresist line portions 21wl may be spaced apart from each other in the first direction D1 crossing the second direction D2. A width of the first photoresist line portion 21wl may be about three times a final width 1F of the word line (see FIG. 1A). A space between the first photoresist line portions 21wl disposed adjacent to each other may be about five times the final width 1F of the word line.

The first photoresist pad portion 21p and the first photoresist connecting portion 21c may be disposed at a side of an end portion of the first photoresist line portion 21wl. Any one of the first word line photoresist patterns 21wl, 21c and 21p may include four pad portions 21p.

A width of the first selection line photoresist pattern 21sl may be greater than that of the first photoresist line portion 21wl, e.g., in the first direction D1. The first selection line photoresist pattern 21sl may be formed to serve as a ground selection line or a string selection line of a NAND FLASH memory device.

In cases where the gate insulating layer 3 includes the tunnel insulating layer, the charge storage layer, and the blocking insulating layer, there may be no blocking insulating layer below the first selection line photoresist pattern 21sl. For example, below the first selection line photoresist pattern 21sl, the conductive layer 5 may be in direct contact with the charge storage layer through the blocking insulating layer (see FIG. 1C). That is, below the first selection line photoresist pattern 21sl, a portion of the blocking insulating layer may be removed. Alternatively, there may be no charge storage layer below the first selection line photoresist pattern 21sl. For example, below the first selection line photoresist pattern 21sl, the blocking insulating layer may be in direct contact with the tunnel insulating layer.

Figure 3A:
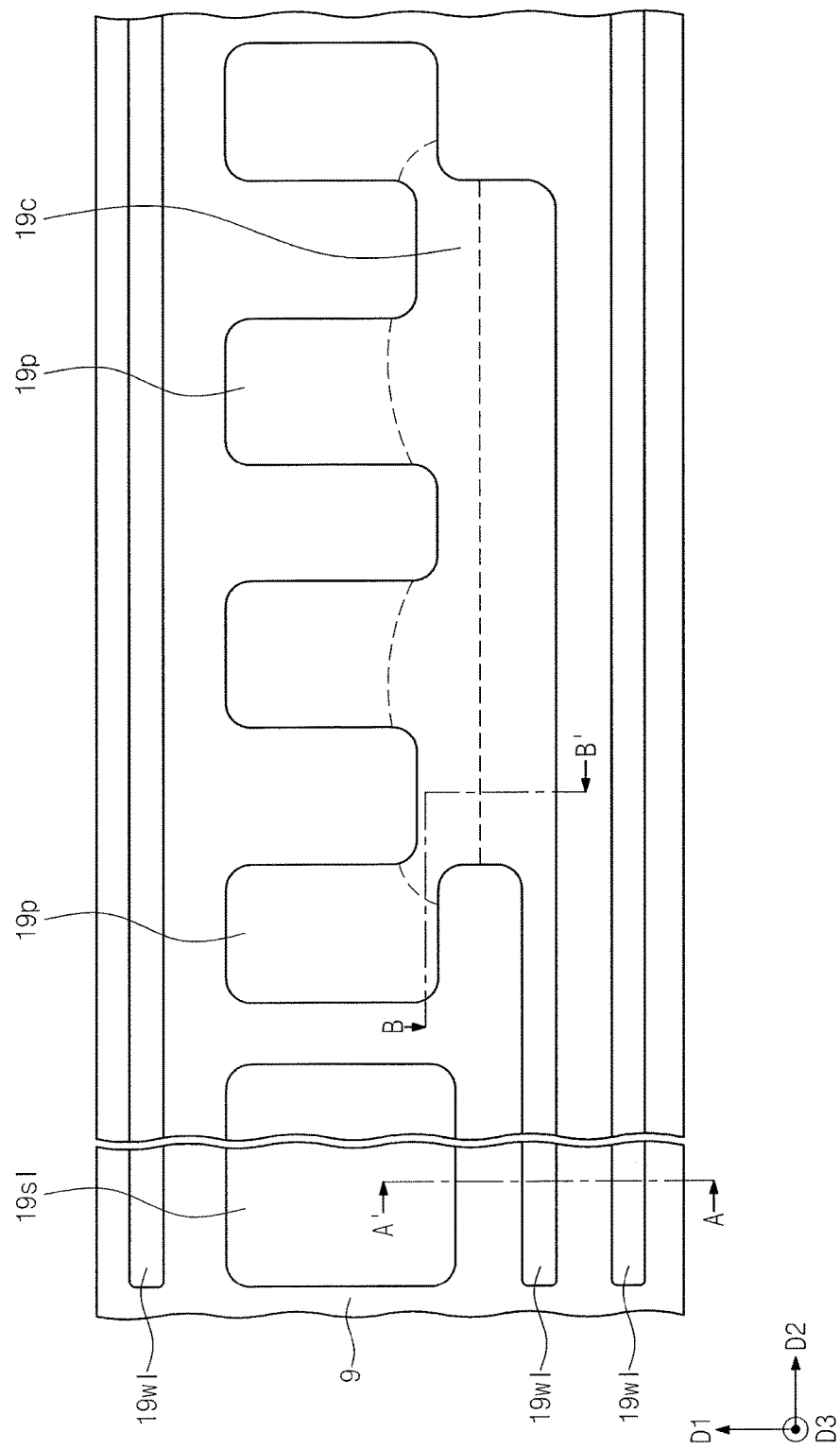
Figure 3B:
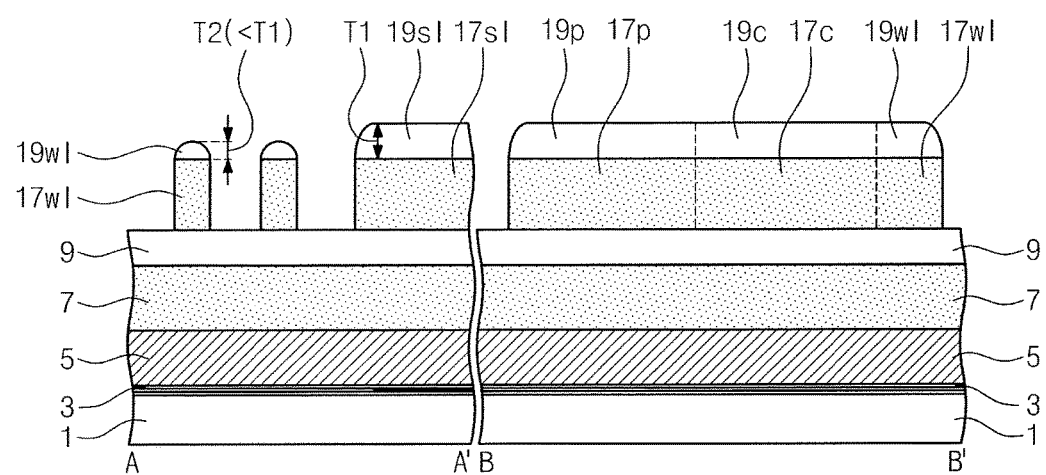

Referring FIGS. 3A and 3B, the fourth mask layer 19 may be etched using the first photoresist patterns 21sl, 21wl, 21p and 21c as an etch mask to form fourth mask patterns 19sl, 19wl, 19p and 19c. The fourth mask patterns 19sl, 19wl, 19p and 19c may be formed to have shapes transferred from the first photoresist patterns 21sl, 21wl, 21p and 21c, respectively. The fourth mask patterns 19sl, 19wl, 19p and 19c may include a fourth selection line mask pattern 19sl and a fourth word line mask pattern 19wl, 19c and 19p. The fourth word line mask pattern 19wl, 19c and 19p may include a fourth mask line portion 19wl, a fourth mask pad portion 19p, and a fourth mask connecting portion 19c connecting them.

The third mask layer 17 may be etched using the fourth mask patterns 19sl, 19wl, 19p and 19c as an etch mask to form third mask patterns 17sl, 17wl, 17p and 17c. The third mask patterns 17sl, 17wl, 17p and 17c may be formed to have shapes transferred from the fourth mask patterns 19sl, 19wl, 19p and 19c, respectively. The third mask patterns 17sl, 17wl, 17p and 17c may include a third selection line mask pattern 17sl and a third word line mask pattern 17wl, 17c and 17p. The third word line mask pattern 17wl, 17c and 17p may include a third mask line portion 17wl, a third mask pad portion 17p and a third mask connecting portion 17c connecting them.

During the formation of the third mask patterns 17sl, 17wl, 17p and 17c, the first photoresist patterns 21sl, 21wl, 21p and 21c may be wholly removed to expose the top surfaces of the fourth mask patterns 19sl, 19wl, 19p and 19c. Alternatively, the first photoresist patterns 21sl, 21wl, 21p and 21c may be selectively removed before the etching of the third mask patterns 17sl, 17wl, 17p and 17c.

During the etching of the third mask patterns 17sl, 17wl, 17p and 17c, the fourth mask patterns 19sl, 19wl, 19p and 19c may be partially etched. An etch damage is most likely to occur at the fourth line portion 19wl having a relatively small pattern width than at the fourth selection line mask pattern 19sl, the fourth mask pad portion 19p, and the fourth mask connecting portion 19c having a relatively large pattern width. Accordingly, a thickness T2 of the fourth line portion 19wl may be smaller than a thickness T1 of the fourth selection line mask pattern 19sl, the fourth mask pad portion 19p, and the fourth mask connecting portion 19c.

Figure 4A:
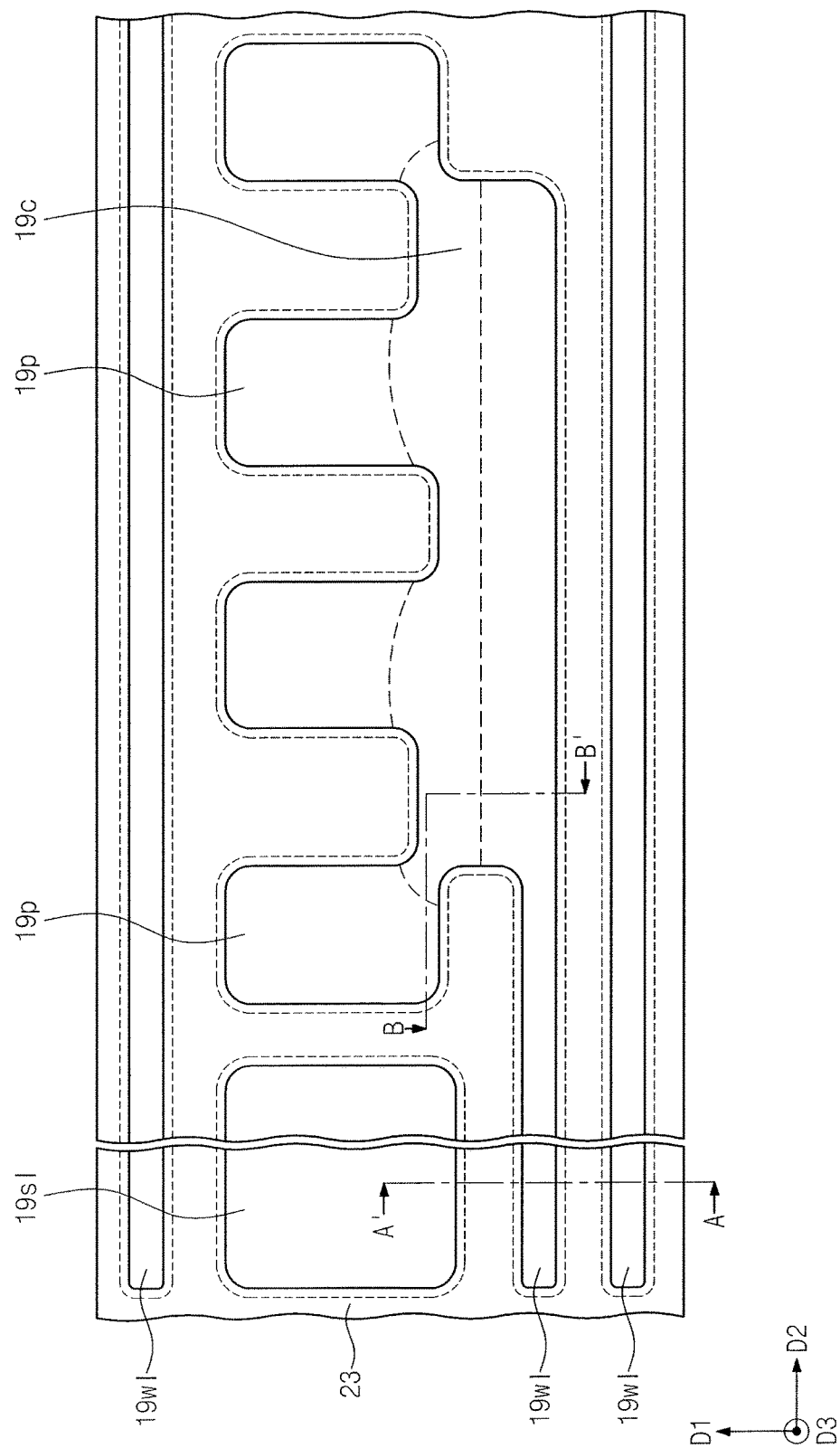
Figure 4B:
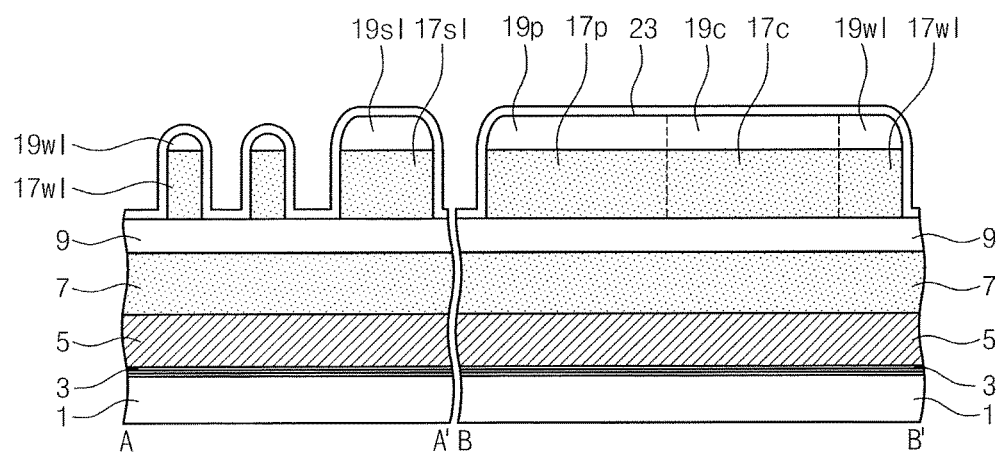

Referring to FIGS. 4A and 4B, a first spacer layer 23 may be conformally formed on the substrate 1. The first spacer layer 23 may be formed of a material having an etch selectivity with respect to all of the second to fourth mask layers 9, 17 and 19. For example, the spacer layer 23 may be a silicon oxide layer that was formed using atomic layer deposition (ALD) process. The first spacer layer 23 may have a thickness that is substantially equivalent to the final width 1F of the word line.

Figure 5A:
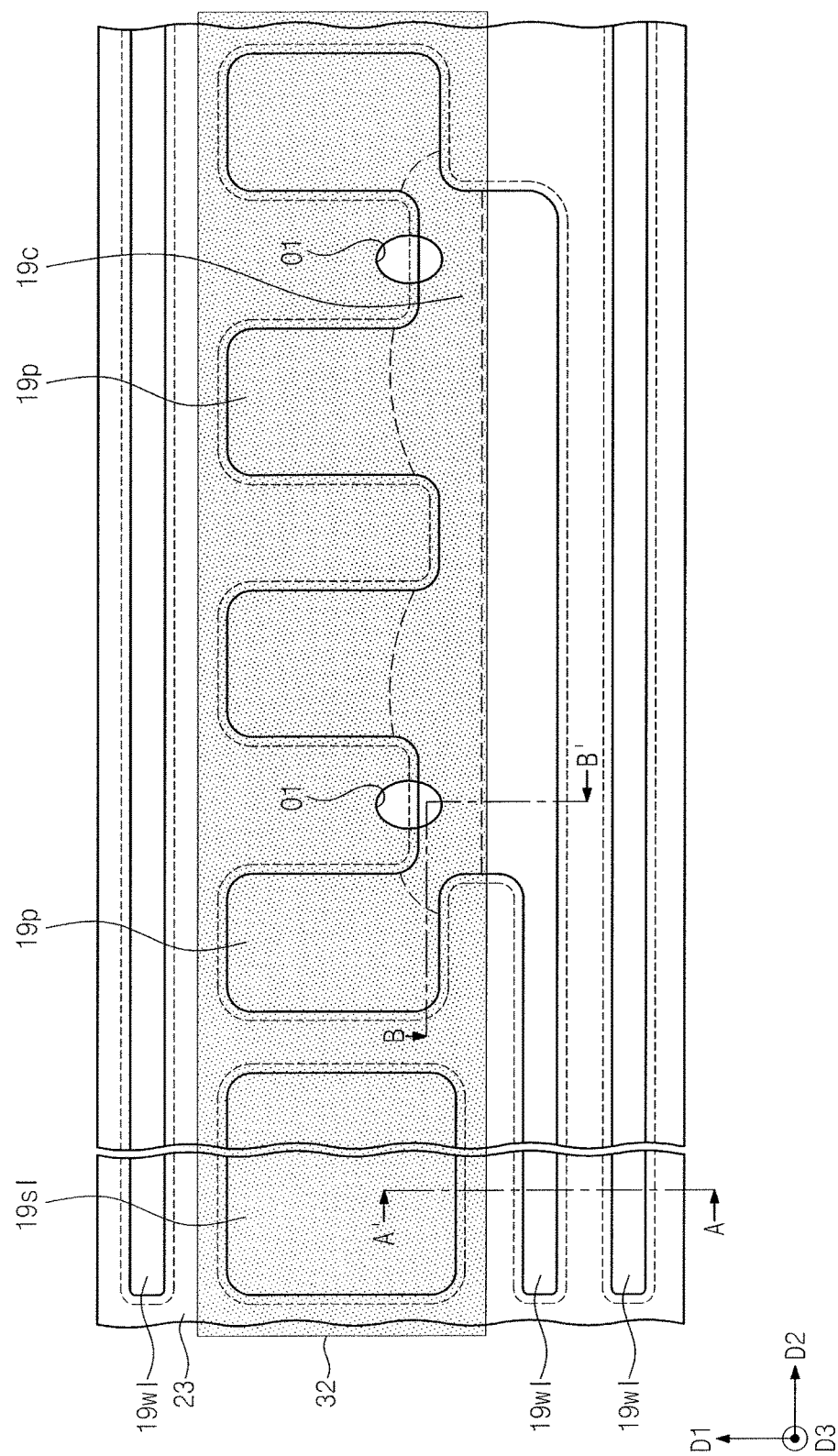
Figure 5B:
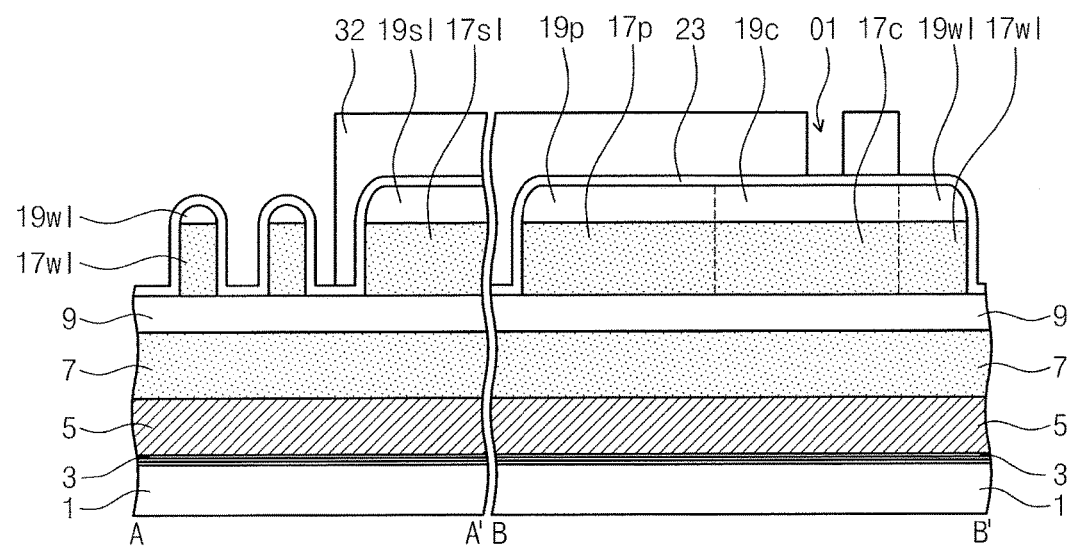

Referring to FIGS. 5A and 5B, a second photoresist pattern 32 may be formed on the first spacer layer 23 by performing a second photolithography process. First openings O1 may be formed in the second photoresist pattern 32. Each of the first openings O1 may be located at a region between the fourth mask pad portions 19p disposed adjacent to each other. Each of the first openings O1 may be located at a portion of the fourth mask connecting portion 19c. The second photoresist pattern 32 may expose the first spacer layer 23 covering the fourth mask line portions 19wl.

Figure 6A:
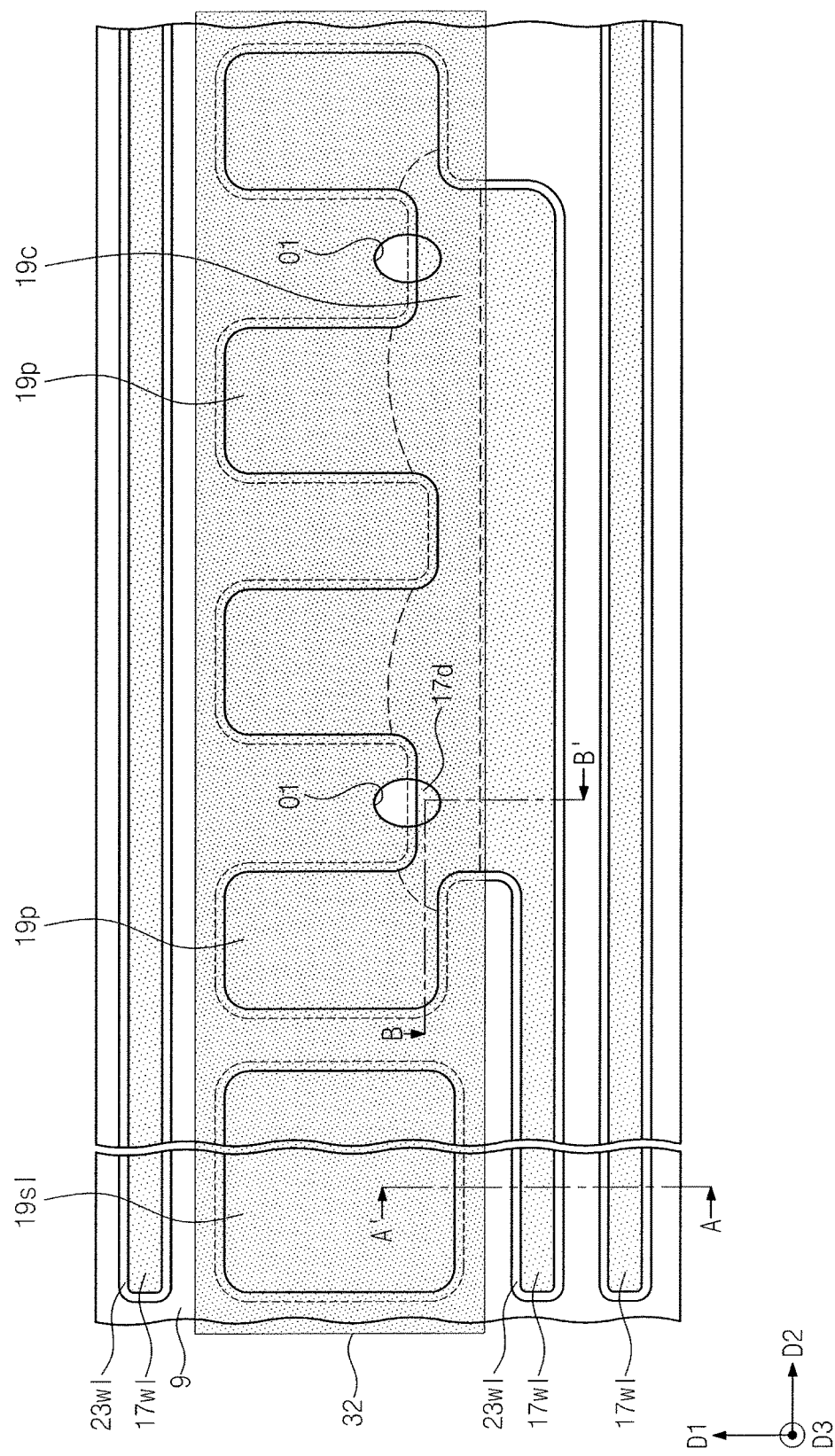
Figure 6B:
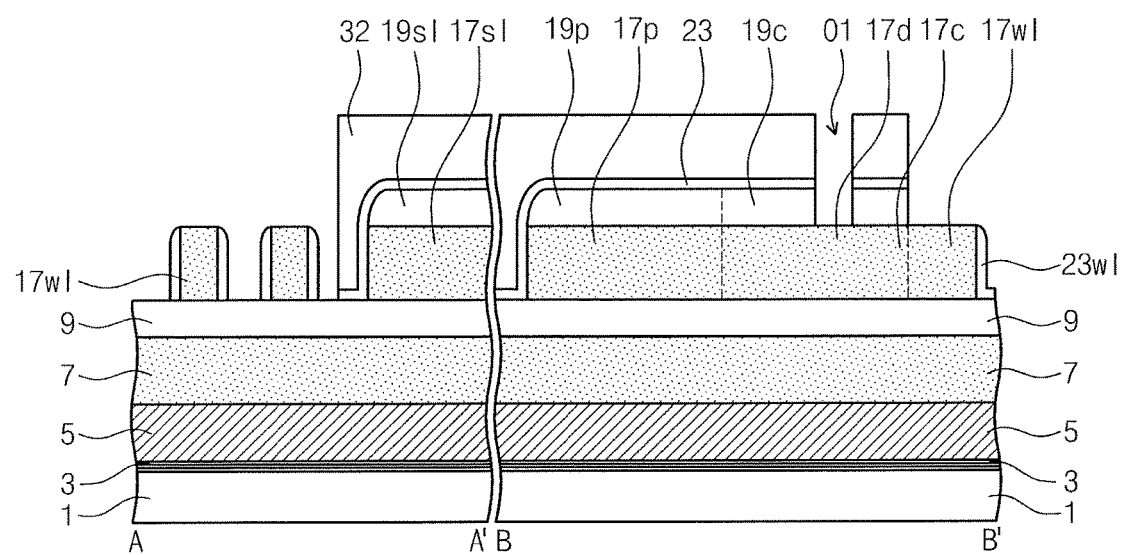

Referring to FIGS. 6A and 6B, an anisotropic etching process may be performed using the second photoresist pattern 32 as an etch mask to form first line spacers 23wl covering sidewalls of the third mask line portions 17wl and to expose a top surface of the third mask line portions 17wl.

Furthermore, a portion of the first spacer layer 23 and the fourth mask connecting portion 19c may be removed through the first opening O1. A portion 17d of the third mask connecting portion 17c may be a region which is vertically overlapped with the first opening O1. Accordingly, a top surface of the portion 17d of the third mask connecting portion 17c may be exposed through the first openings O1.

Figure 7A:
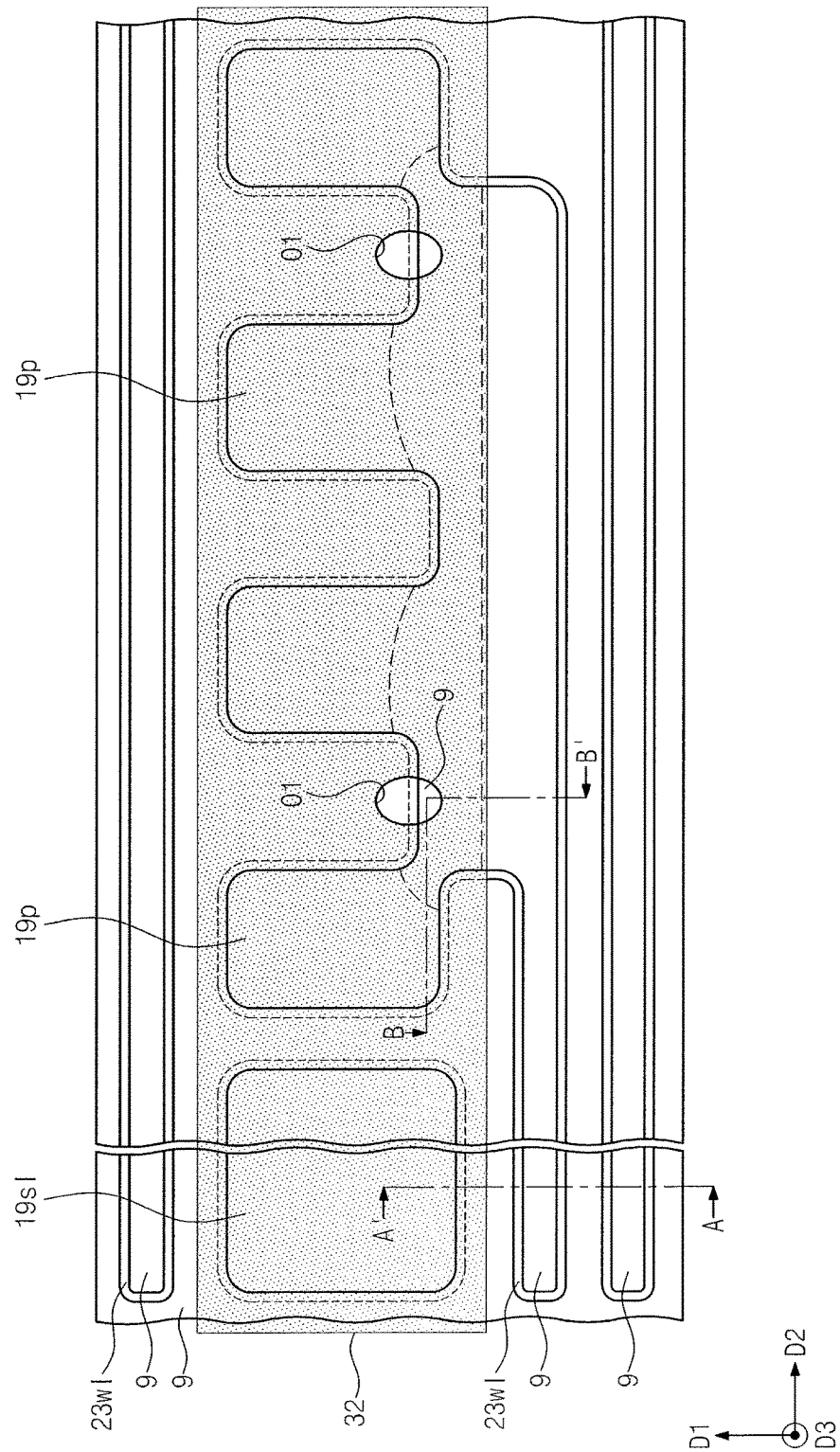
Figure 7B:
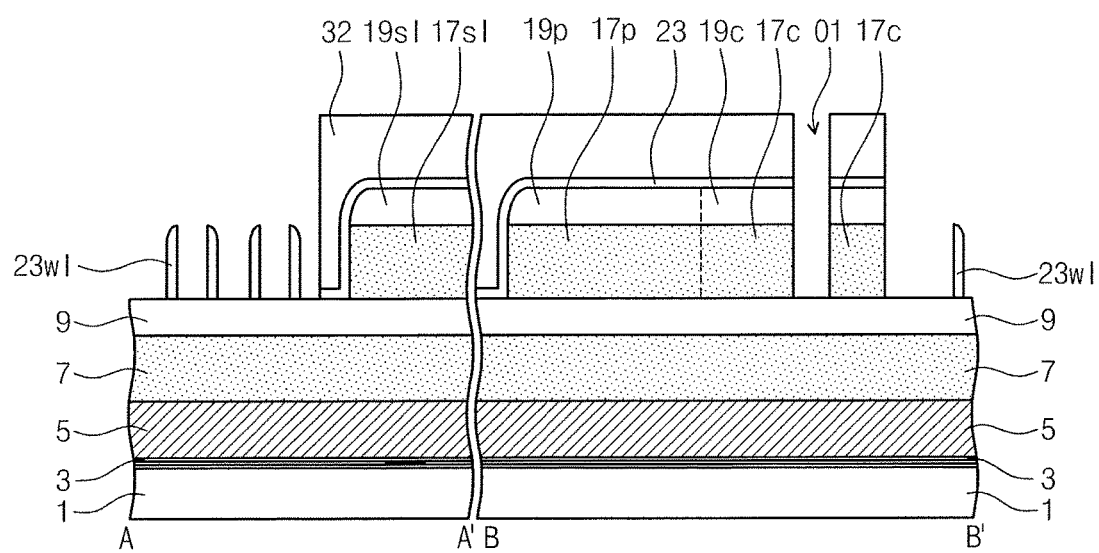

Referring to FIGS. 7A and 7B, an etching process may be performed using the second photoresist pattern 32 as an etch mask to selectively remove the third mask line portions 17wl and the exposed portion 17d of the third mask connecting portions 17c. Specifically, removal of the line portions 17wl and the portion 17d may include performing the selective etching process with respect to the third mask layer 17 on the substrate 1. Accordingly, a portion of a top surface of the second mask layer 9 may be exposed. The selective etching process may include an anisotropic etch.

Figure 8A:
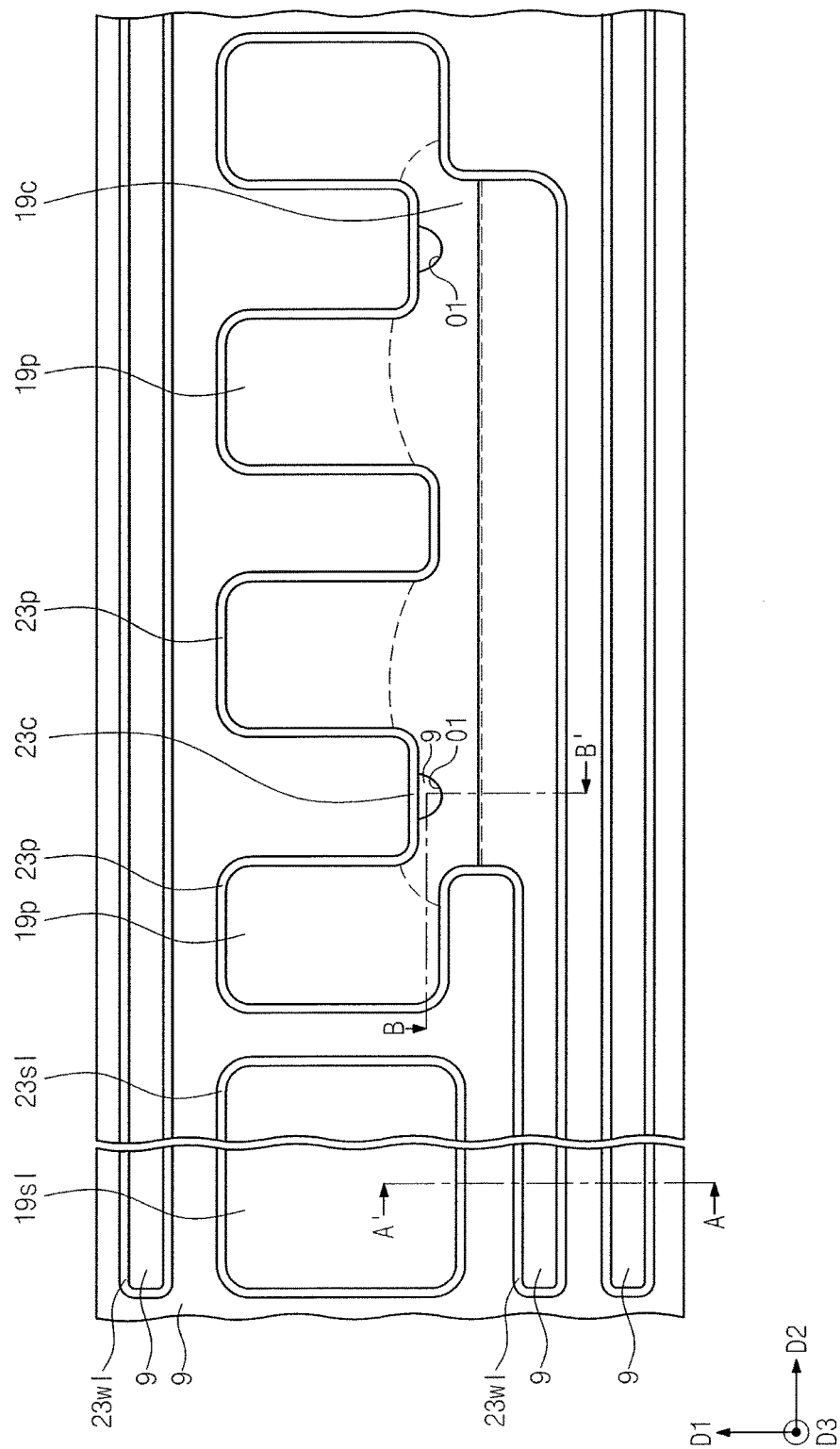
Figure 8B:
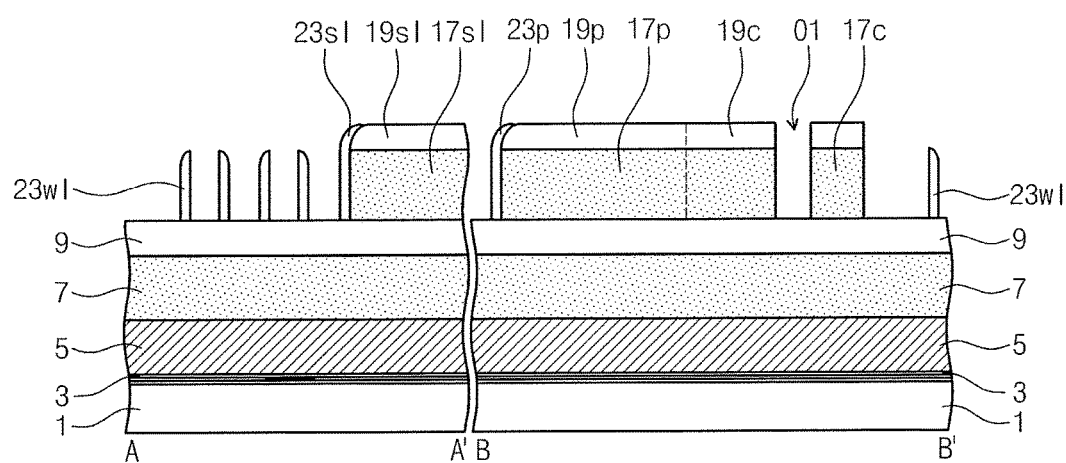

Referring to FIGS. 8A and 8B, the second photoresist pattern 32 may be removed. The first spacer layer 23, which remains on the fourth selection line mask pattern 19sl, the fourth mask pad portion 19p and the fourth mask connecting portion 19c, may be etched to form a first selection line spacer 23sl, a first pad spacer 23p and a first connecting spacer 23c respectively covering sidewalls of the third selection line mask pattern 17sl, the third mask pad portion 17p and the third mask connecting portion 17c.

Figure 9B:
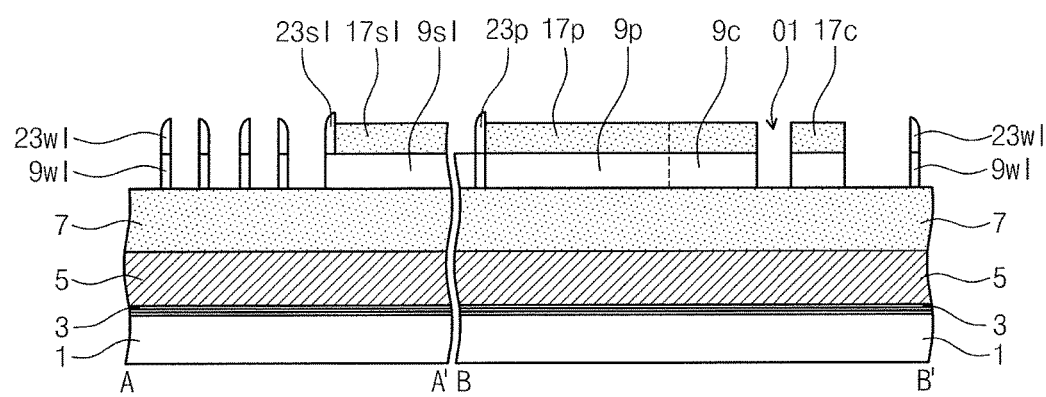

Referring to FIGS. 9A and 9B, the second mask layer 9 may be patterned using the first spacers 23sl, 23wl, 23p and 23c, and the third mask patterns 17sl, 17p and 17c as an etch mask to form a second mask patterns 9sl, 9wl, 9p and 9c. If the second mask layer 9 is formed of the same material as the fourth mask layer 19, the remaining portions of the fourth mask patterns 19sl, 19p and 19c may be removed during the etching process to form the second mask patterns 9sl, 9wl, 9p and 9c. If the second mask layer 9 is formed of a different material from the fourth mask layer 19, the remaining portions of the fourth mask patterns 19sl, 19p and 19c may be removed by an additional process. Accordingly, top surface of the first mask layer 7 and the remaining portions of the third mask patterns 17sl, 17p and 17c may be exposed as the result of the formation of the second mask patterns 9sl, 9wl, 9p and 9c.

When viewed in a plan view, the second mask patterns 9sl, 9wl, 9p and 9c may be formed to have shapes transferred from the first spacers 23sl, 23wl, 23p and 23c and the remaining portions of the third mask patterns 17sl, 17p and 17c. The second mask patterns 9sl, 9wl, 9p and 9c may include a second selection line mask pattern 9sl and a second word line mask pattern 9wl, 9p and 9c. The second word line mask pattern 9wl, 9p and 9c may include a second mask line portion 9wl, a second mask pad portion 9p and a second mask connecting portion 9c connecting them. A width of the second selection line mask pattern 9sl may be greater by about 2F than that of the third selection line mask pattern 17sl.

Figure 10A:
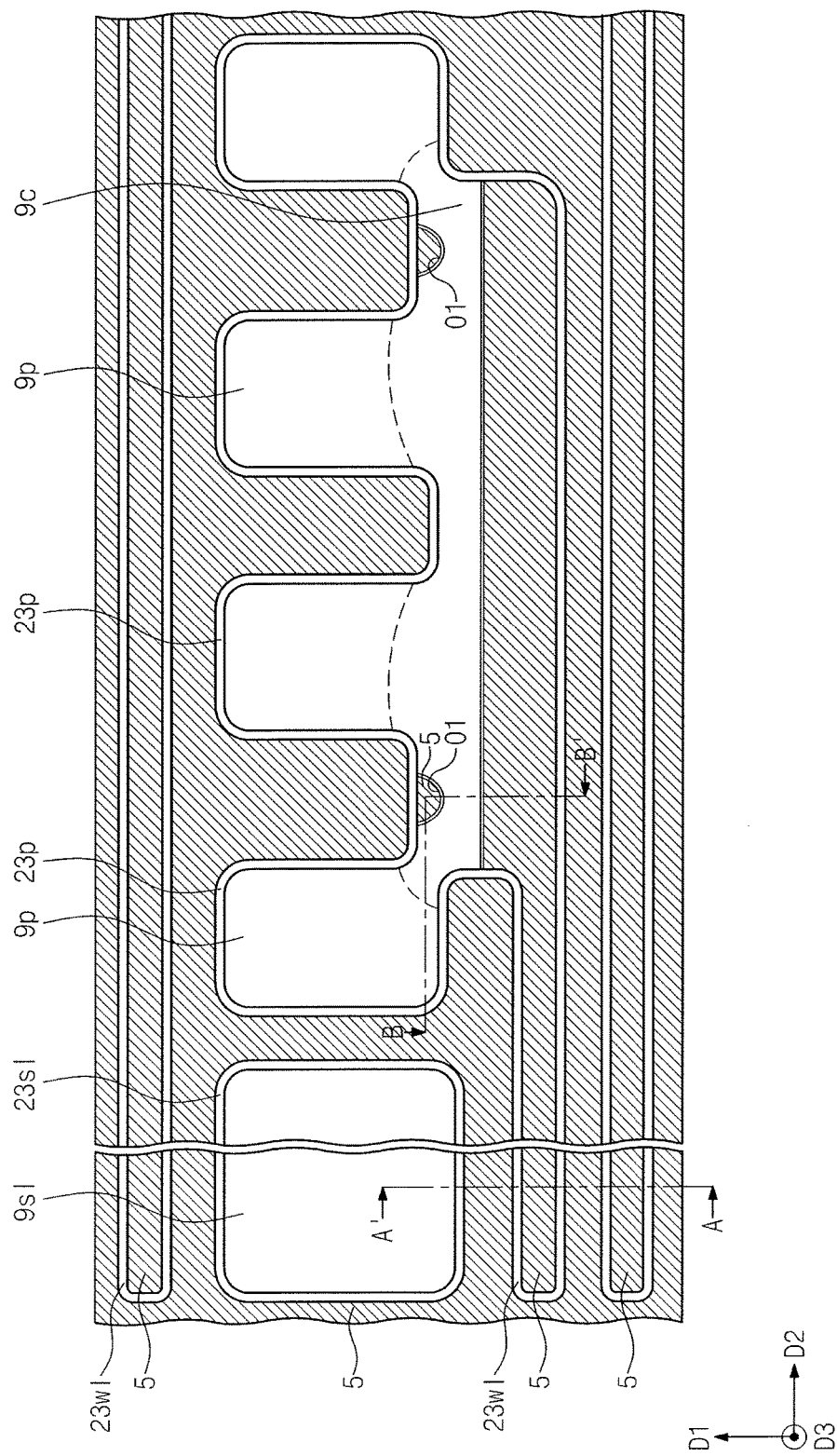
Figure 10B:
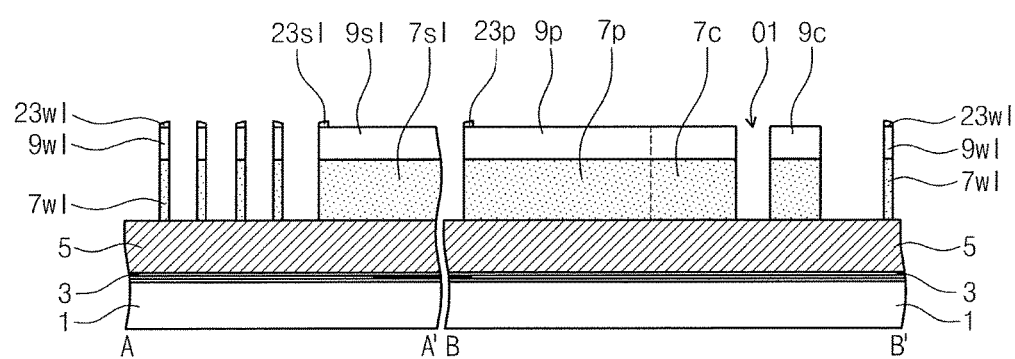

Referring to FIGS. 10A and 10B, the first mask layer 7 may be etched using the second mask patterns 9sl, 9wl, 9p and 9c as an etch mask to form a first mask patterns 7sl, 7wl, 7p and 7c. The conductive layer 5 may be exposed by the second mask patterns 9sl, 9wl, 9p and 9c. If the third mask layer 17 is formed of the same material as the first mask layer 7, the remaining portions of the third mask patterns 17sl, 17p and 17c may be removed during the etching process to form the first mask patterns 7sl, 7wl, 7p and 7c. If the third mask layer 17 is formed of a different material from the first mask layer 7, the remaining portions of the third mask patterns 17sl, 17p and 17c may be removed an additional process. Accordingly, top surfaces of the second mask patterns 9sl, 9p and 9c may be exposed as the result of the formation of the first mask patterns 7sl, 7wl, 7p and 7c.

When viewed in a plan view, the first mask patterns 7sl, 7wl, 7p and 7c may be formed to have shapes transferred from the second mask patterns 9sl, 9wl, 9p and 9c. The first mask patterns 7sl, 7wl, 7p and 7c may include a first selection line mask pattern 7sl and a first word line mask pattern 7wl, 7p and 7c. The first word line mask pattern 7wl, 7p and 7c may include a first mask line portion 7wl, a first mask pad portion 7p and a first mask connecting portion 7c connecting them.

Figure 11A:
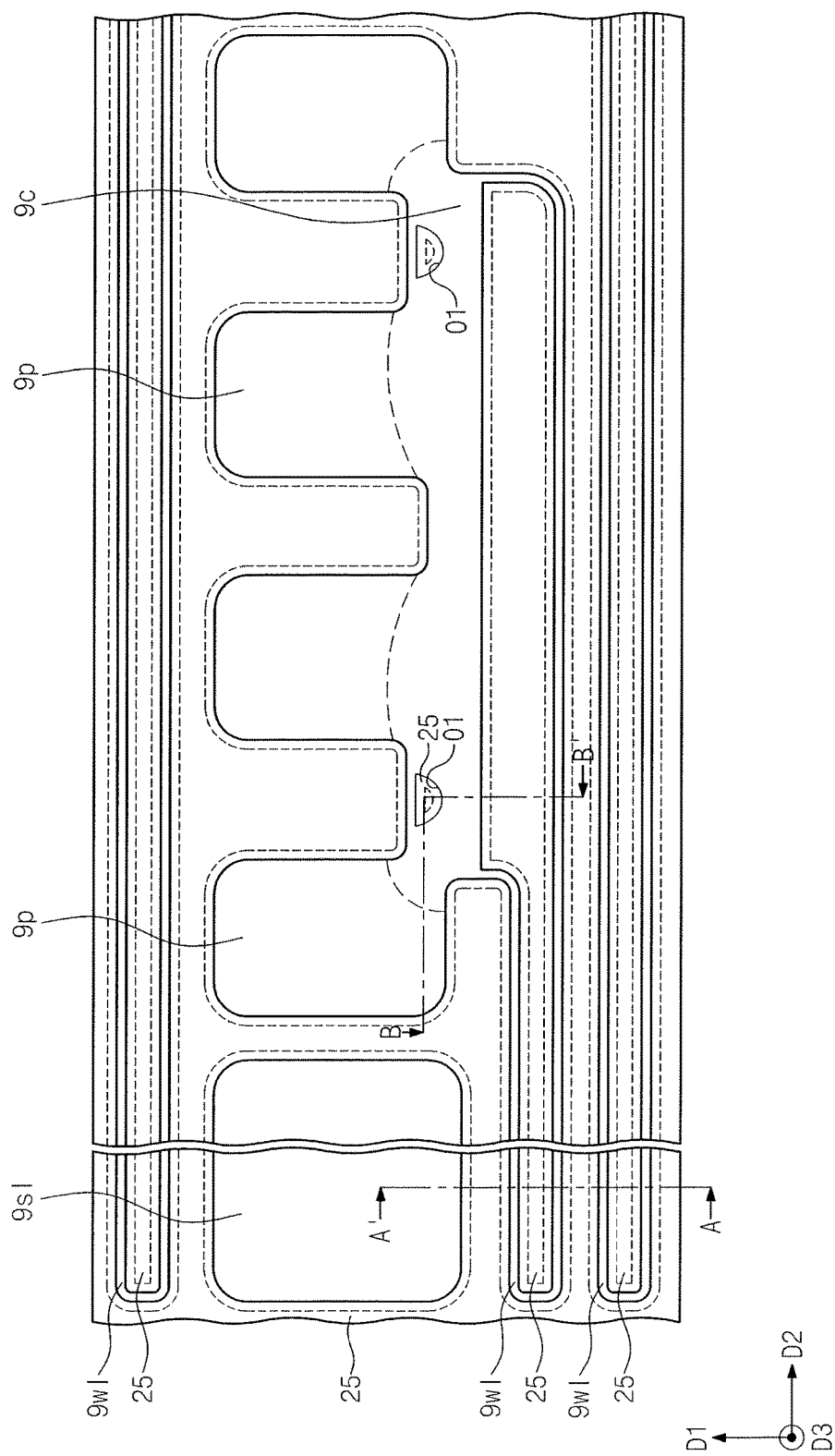
Figure 11B:
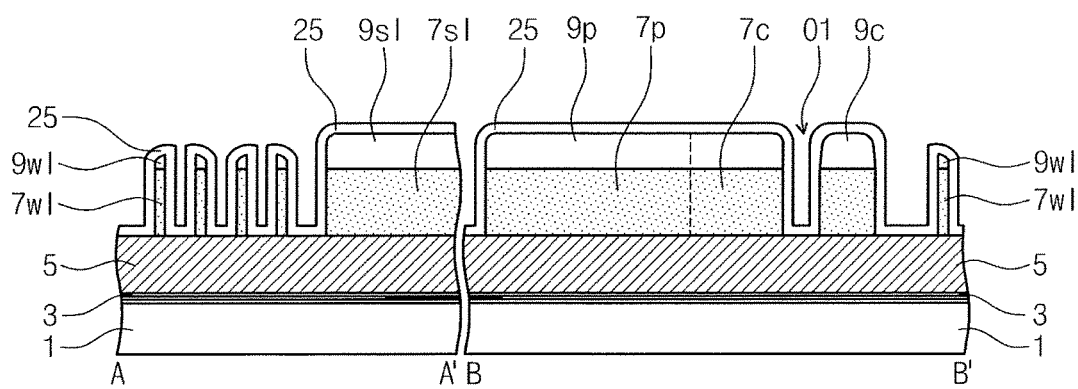

Referring to FIGS. 11A and 11B, the remaining portions of the first spacers 23sl, 23wl, 23p and 23c may be removed. Upper portions of the second mask patterns 9sl, 9wl, 9p and 9c may be partially etched during removing the first spacers 23sl, 23wl, 23p and 23c. An etch damage is most likely to occur at the second mask line portions 9wl having a relatively small pattern width than at the second selection line mask pattern 9sl, the second mask pad portion 9p and the second mask connecting portion 9c having a relatively large pattern width. Accordingly, a thickness of a remaining portion of the second mask line portion 9wl may be smaller than those of the second selection line mask pattern 9sl, the second mask pad portion 9p and the second mask connecting portion 9c.

A second spacer layer 25 may be conformally formed on the substrate 1. The second spacer layer 25 may be formed of a material having an etch selectivity with respect to all of the conductive layer 5 and the first and second mask layers 7 and 9. For example, the second spacer layer 25 may be a silicon oxide layer formed by an atomic layer deposition process (ALD). The second spacer layer 25 may have a thickness that is substantially equivalent to the final width 1F of the word line.

Figure 12A:
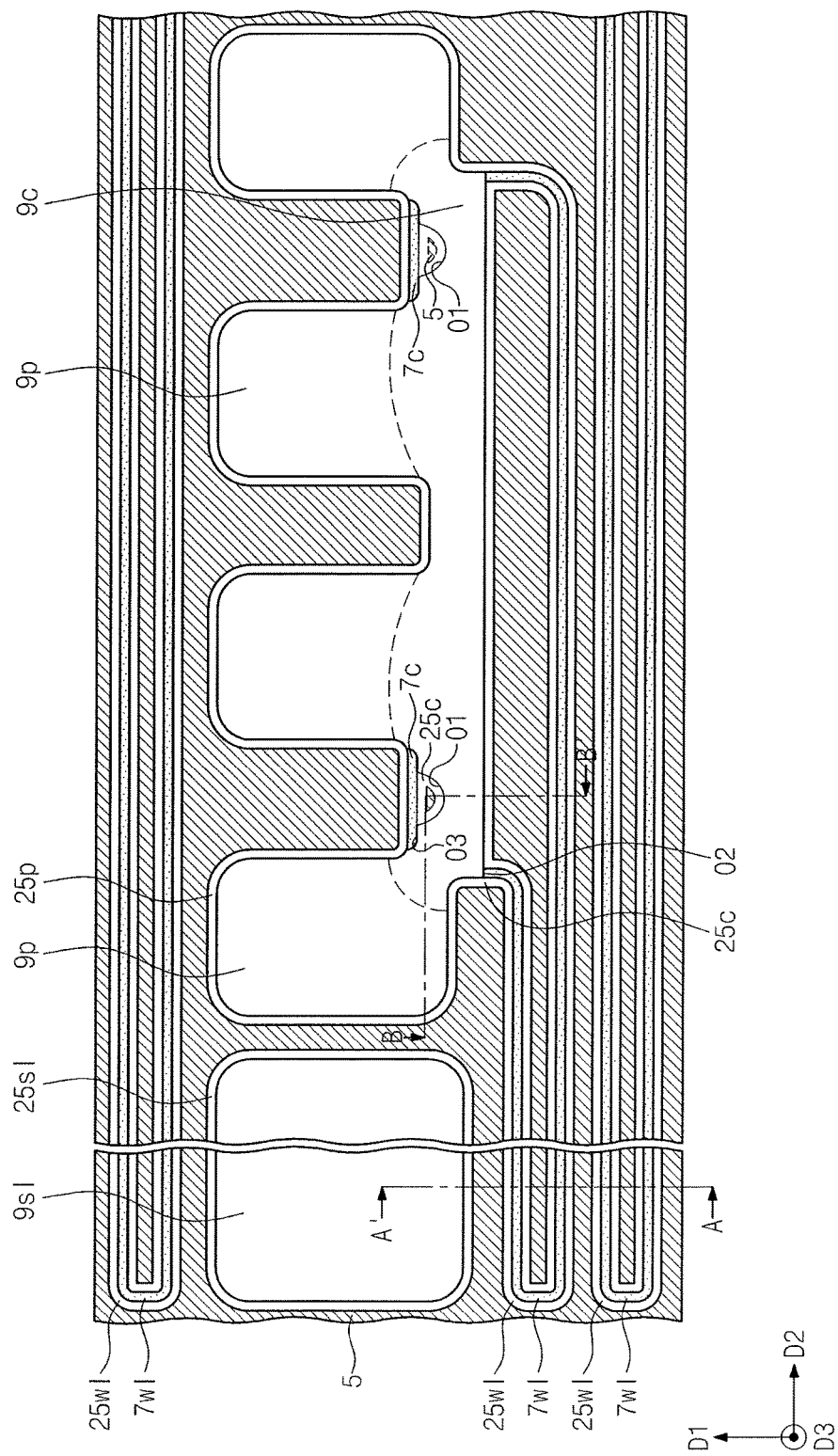
Figure 12B:
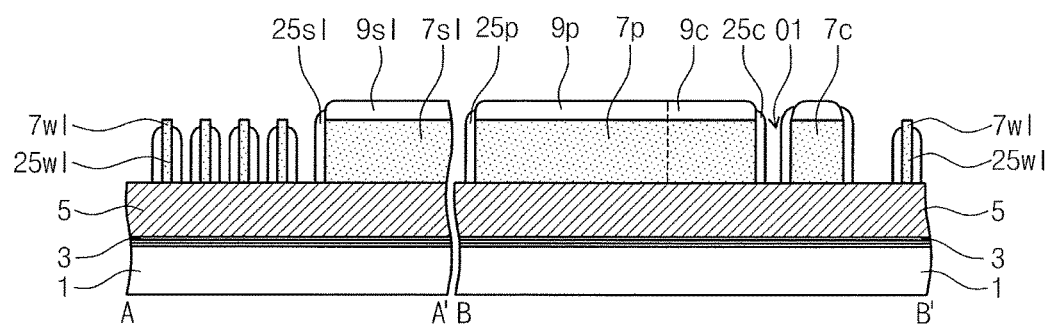

Referring to FIGS. 12A and 12B, the second spacer layer 25 may be anisotropically etched to form second spacers 25sl, 25wl, 25p and 25c. A top surface of the conductive layer may be exposed by the second spacers 25sl, 25wl, 25p and 25c. The second spacers 25sl, 25wl, 25p and 25c may include a second selection line spacer 25sl, a second line spacer 25wl, a second pad spacer 25p and a second connecting spacer 25c respectively covering sidewalls of the first selection line mask pattern 7sl, the first mask line portion 7wl, a first mask pad portion 7p and the first mask connecting portion 7c.

The remaining portion of the second mask line portion 9wl may be removed to expose a top surface of the first mask line portion 7wl. After removal of the remaining portion of the second mask line portion 9wl, a second opening O2 may be defined at the second mask connecting portion 9c which is adjacent to the exposed first mask line portion 7wl.

Because the second selection line mask pattern 9*sl* and the second mask pad portion and connecting portions 9*p* and 9*c* may be thicker than the second mask line portion 9*wl*, the second selection line mask pattern 9*sl*, the second mask pad portion 9*p* and the second mask connecting portions 9*c* may partially remain without being completely removed.

Furthermore, during removal of the remaining portion of the second mask line portion 9*wl*, a third opening O3 may be formed by removing a portion of the second mask connecting portion 9*c* which is adjacent to the first opening O1. The third opening O3 may expose a portion of a top surface of the first mask connection portion 7*c*.

Figure 13A:
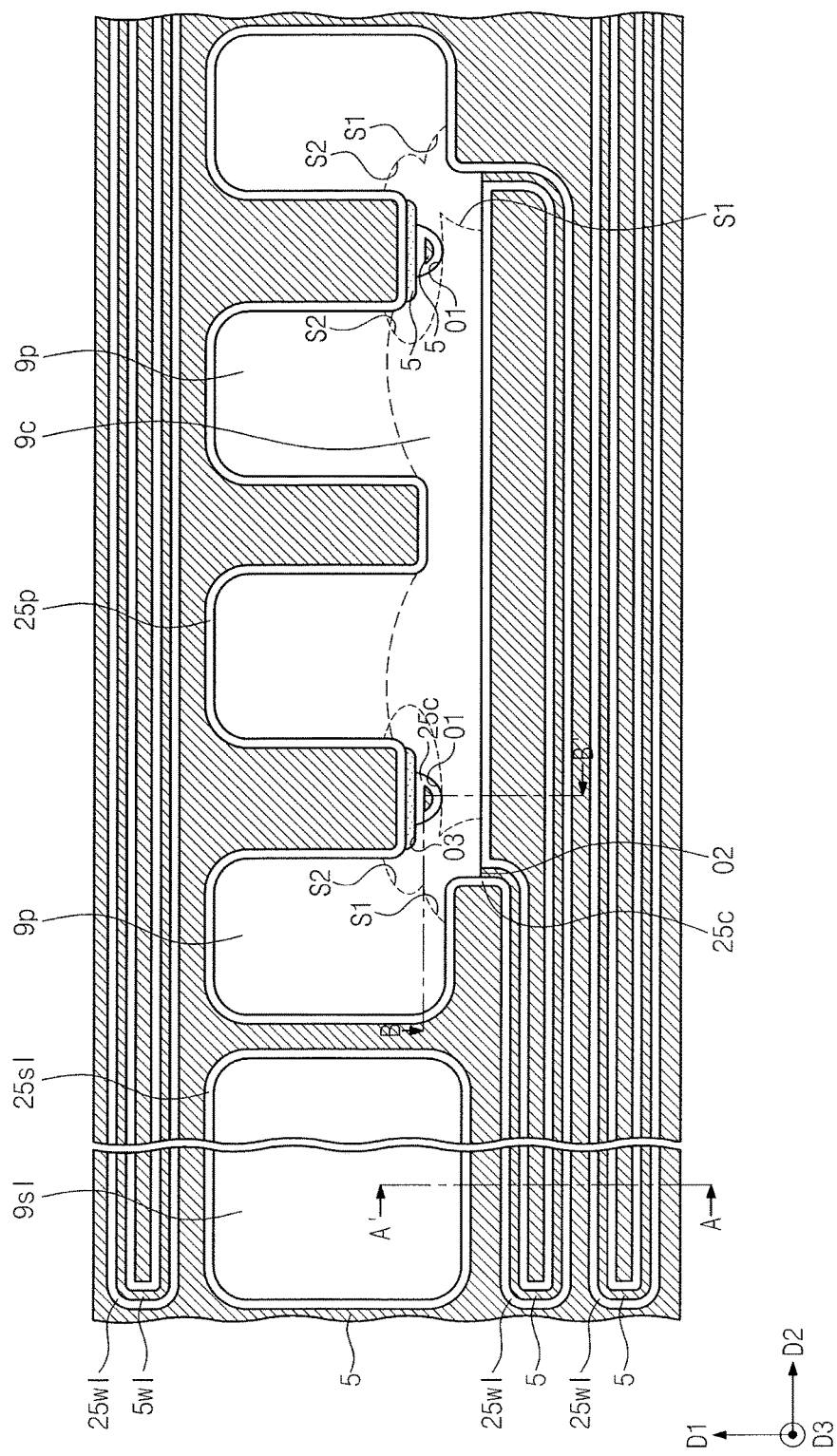
Figure 13B:
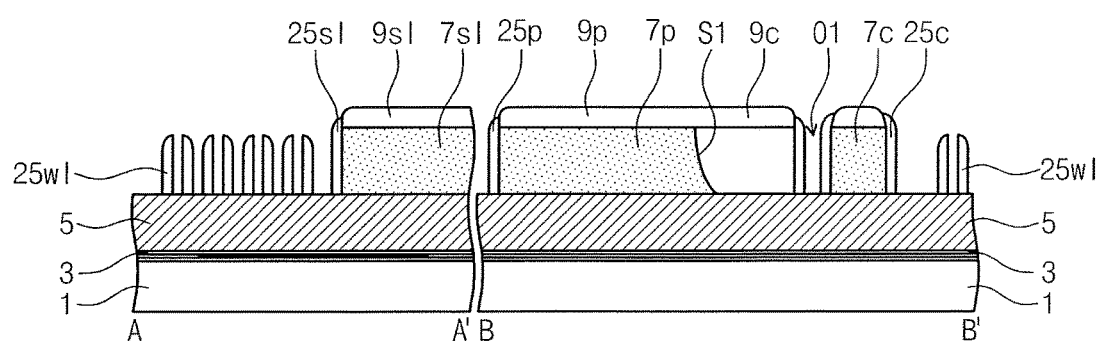

Referring to FIGS. 13A and 13B, an isotropic etching process may be performed to selectively remove the exposed first mask line portion 7*wl* and a portion of the first mask connecting portion 7*c*. Thus, a portion of the conductive layer 5 may be further exposed. In cases where the first mask layer 7 is formed of an SOH layer, the isotropic etching process may be an ashing process using an oxygen gas. By using the isotropic etching process, an etchant may be penetrated below the second mask connecting portion 9*c* through the second and third openings O2 and O3 so as to remove a portion of the first mask connecting portion 7*c*. Thus, the first mask connecting portion 7 may have a first sidewall S1 and a second sidewall S2 by the etching process. The first sidewall S1 may be formed by the etching process using the etchant which is penetrated through the second openings O2. The second sidewall S2 may be formed by the etching process using the etchant which is penetrated through the third openings O3. In the same way above, a portion of the first mask pad portion 7*p* may also be removed, and the first mask pad portion 7*p* may also have a first sidewall S1 and a second sidewall S2. When viewed in a plan view, the first and second sidewalls S1 and S2 may have a concave profile, and may be adjacent to each other.

Figure 14A:
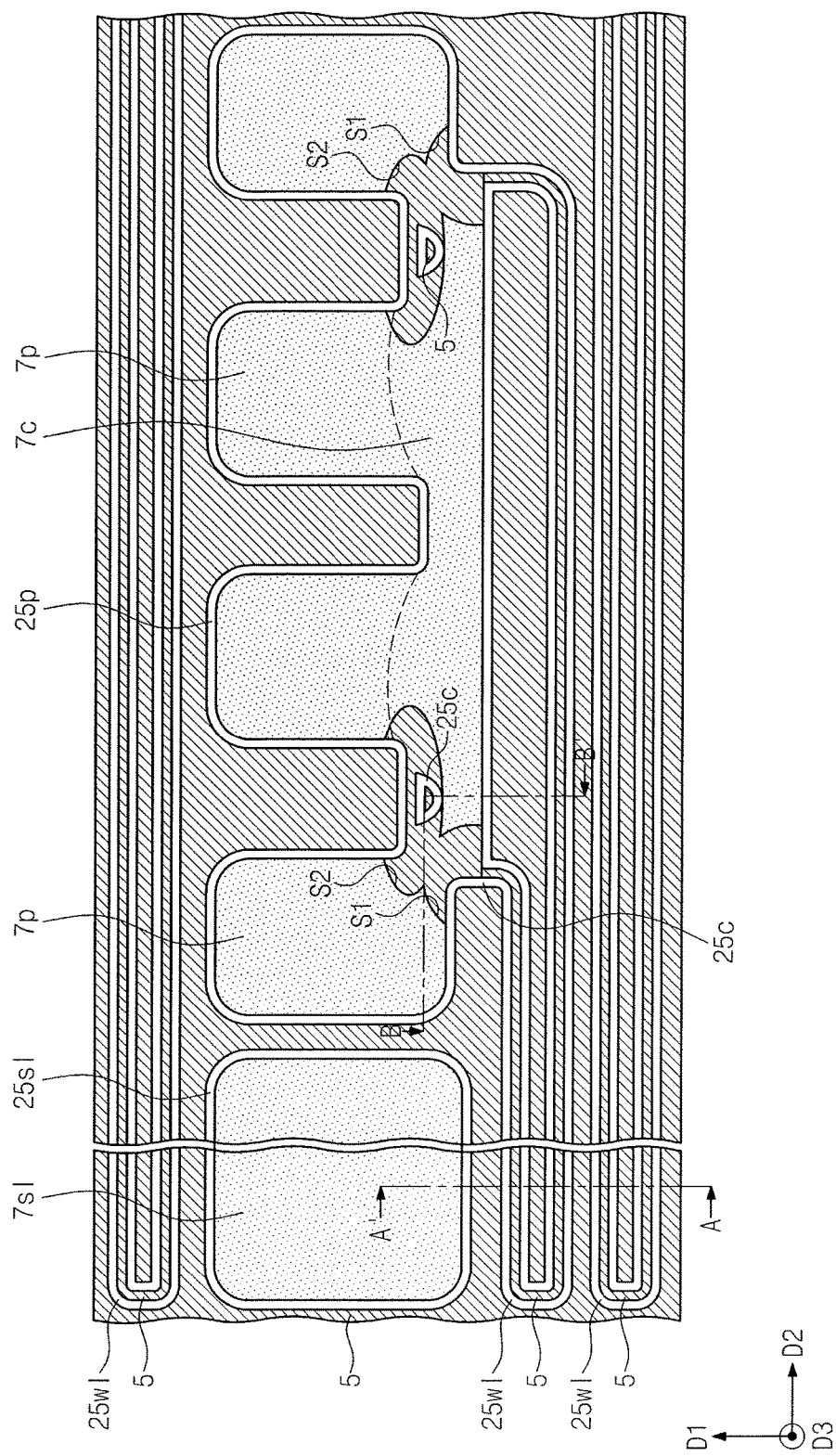
Figure 14B:
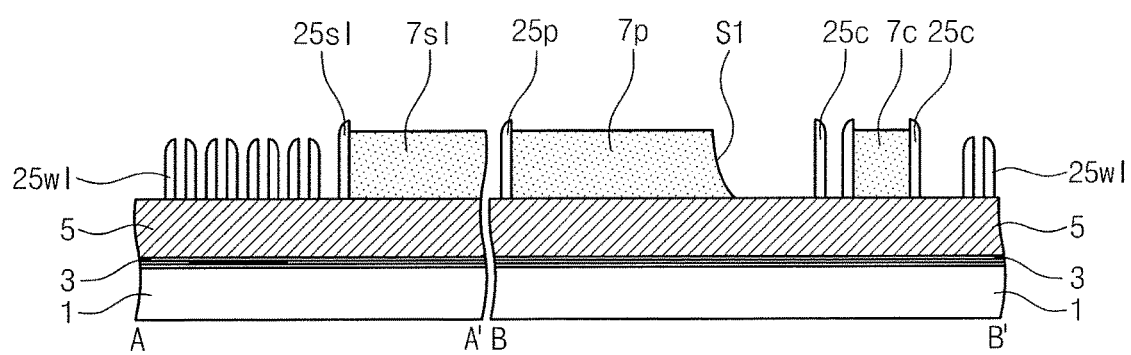

Referring to FIGS. 14A and 14B, the remaining portions of the mask patterns 9*sl*, 9*p* and 9*c* may be selectively removed to expose the first mask patterns 7*sl*, 7*p* and 7*c*.

Figure 15A:
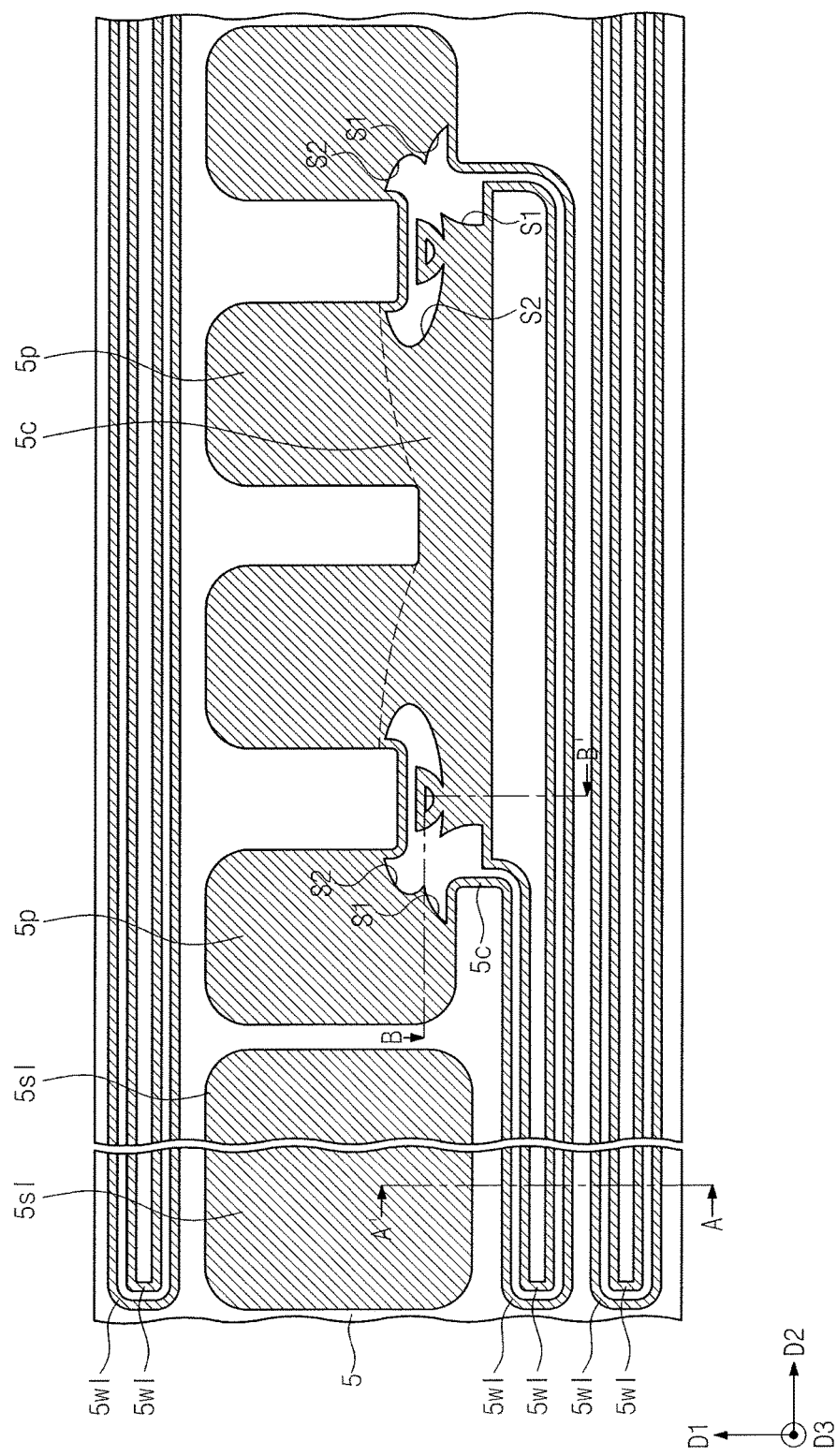
Figure 15B:
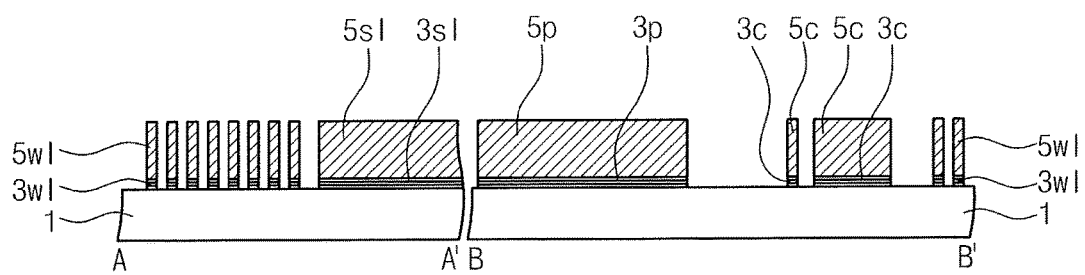

Referring to FIGS. 15A and 15B, the conductive layer 5 may be etched using the second spacers 25*sl*, 25*wl*, 25*p* and 25*c*, and the first mask patterns 7*sl*, 7*p* and 7*c* as an etch mask to form preliminary conductive patterns 5*sl*, 5*wl*, 5*p* and 5*c*. When viewed in a plan view, the preliminary conductive patterns 5*sl*, 5*wl*, 5*p* and 5*c* may be formed to have shapes transferred from the second spacers 25*sl*, 25*wl*, 25*p* and 25*c*, and the first mask patterns 7*sl*, 7*p* and 7*c*. The preliminary conductive patterns 5*sl*, 5*wl*, 5*p* and 5*c* may include a preliminary selection line 5*sl* and a preliminary word line 5*wl*, 5*p* and 5*c*. The preliminary word line 5*wl*, 5*p* and 5*c* may include a preliminary line portion 5*wl*, a preliminary pad portion 5*p*, and a preliminary connecting portion 7*c* connecting them.

Subsequently, the gate insulating layer 3 may be etched using the second spacers 25*sl*, 25*wl*, 25*p* and 25*c*, and the first mask patterns 7*sl*, 7*p* and 7*c* as an etch mask. Thus, preliminary gate insulating patterns 3*sl*, 3*wl*, 3*p* and 3*c* may be formed between the preliminary conductive patterns 5*sl*, 5*wl*, 5*p* and 5*c*, and the substrate 1.

Figure 16A:
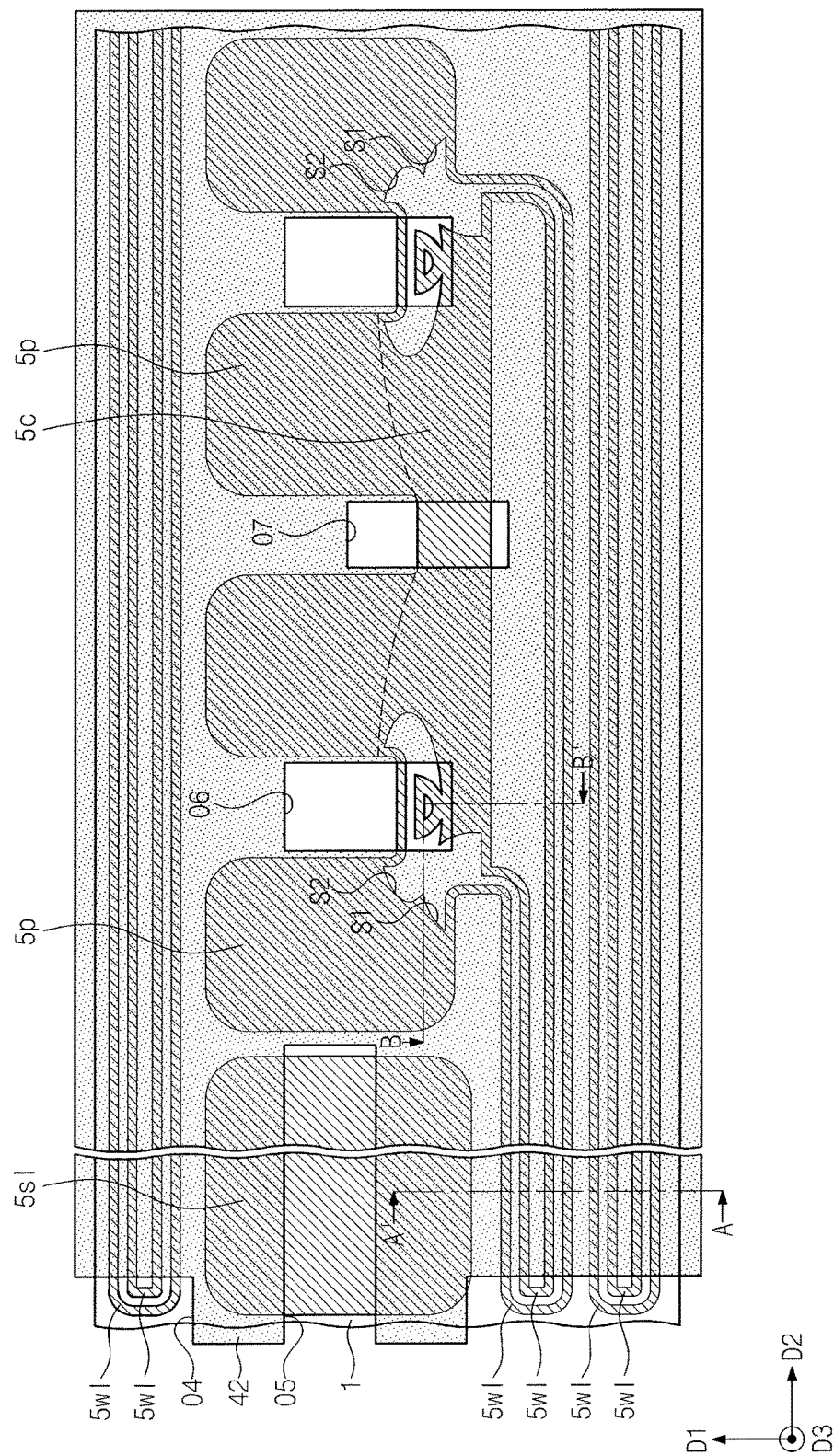
Figure 16B:
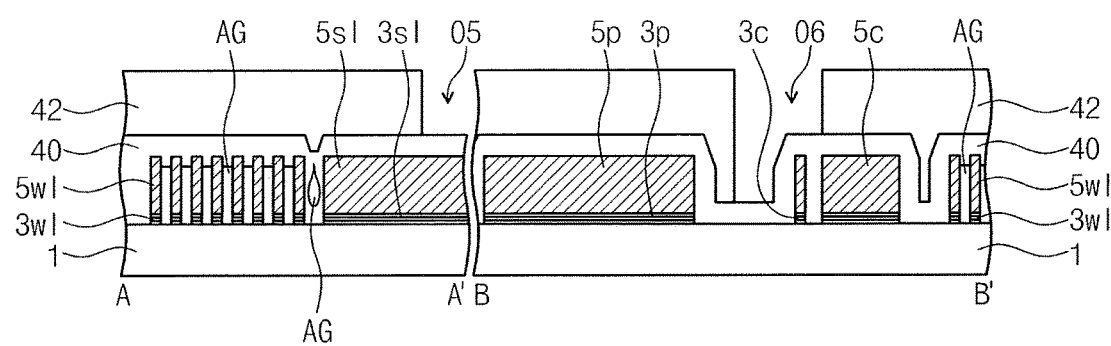

Referring to FIGS. 16A and 16B, the insulating layer 40 may be formed on the substrate 1 to cover the preliminary conductive patterns 5*sl*, 5*wl*, 5*p* and 5*c*. The insulating layer 40 may be formed using any suitable non-conformal deposition process that primarily deposits the material on horizontal surfaces rather than on vertical sides. For example, the insulating layer 40 may be formed of a silicon oxide layer or a silicon oxynitride layer.

Accordingly, when the insulating layer 40 is formed, air gaps AG may be formed between the preliminary line portions 5*wl* which have a relatively small spacing between them. Furthermore, the air gap AG may also be formed between the preliminary selection line 5*sl* and the preliminary line portions 5*wl* which have a relatively small spacing between them. The air gap AG may be surrounded by the insulating layer 40.

A third photoresist pattern 42 including fourth to seventh openings O4, O5, O6 and O7 may be formed on the insulating layer 40 by performing a third photolithography process. The fourth opening O4 may be formed to be vertically overlapped with end portions of the preliminary line portions 5*wl*. The fifth opening O5 may be formed to be vertically overlapped with a portion of the preliminary selection line 5*sl*. The sixth opening O6 may be formed between a pair of the preliminary pad portions 5*p* adjacent to each other. The seventh opening O7 may be formed to be vertically overlapped with a portion of the preliminary connecting portion 5*c*. The seventh opening O7 may be formed between the preliminary pad portions 5*p* adjacent to each other.

Figure 17A:
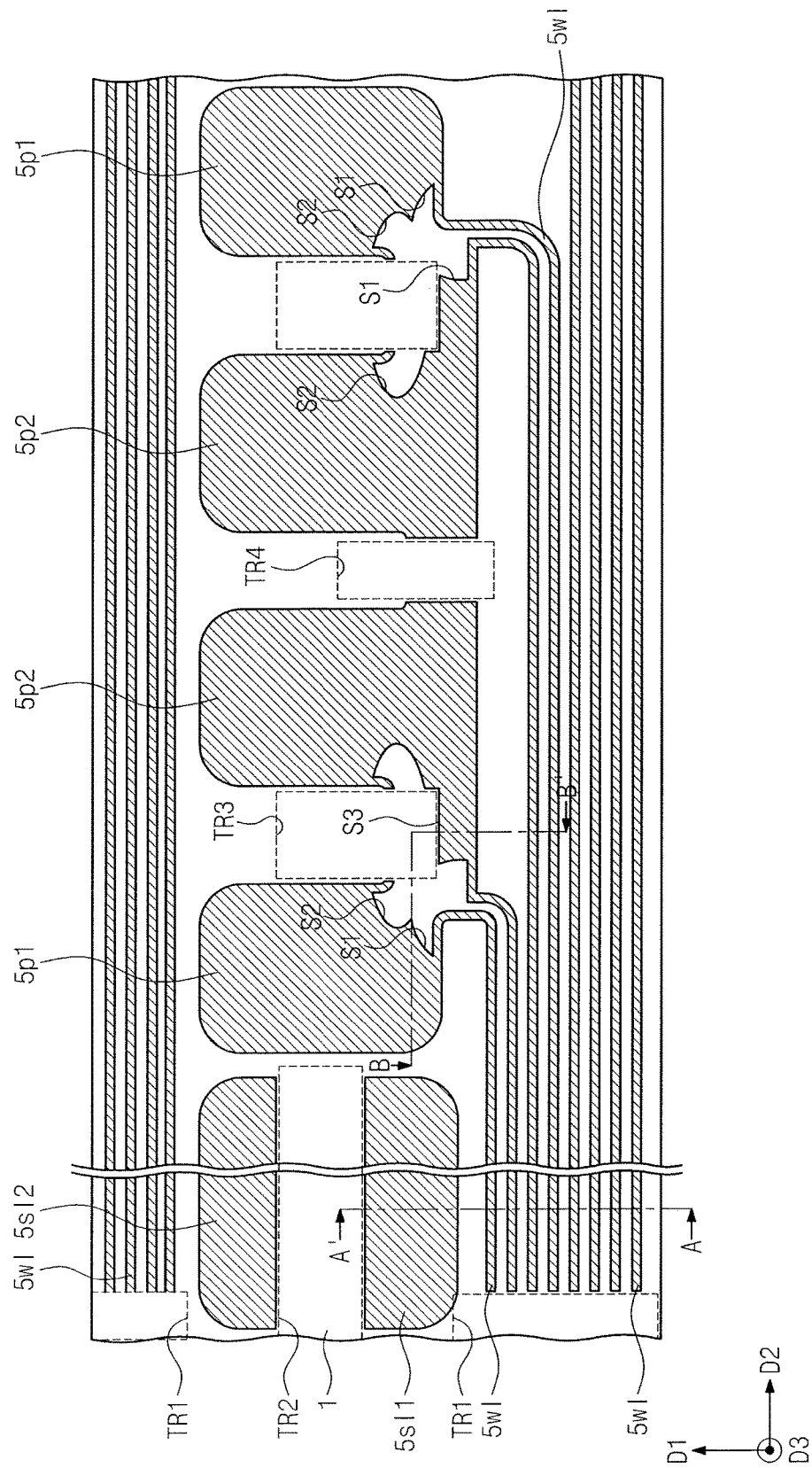
Figure 17B:
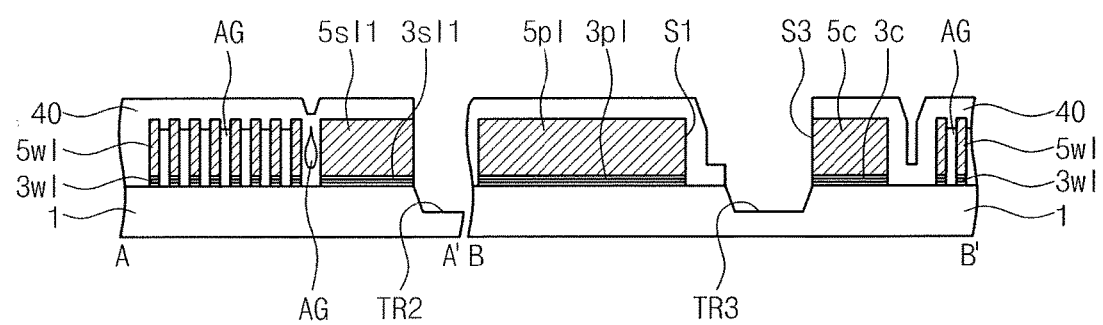

Referring to FIGS. 17A and 17B, the insulating layer 40 and the preliminary conductive patterns 5*sl*, 5*wl*, 5*p* and 5*c* may be sequentially etched using the third photoresist pattern 42 as an etch mask to form conductive patterns 5*sl*1, 5*sl*2, 5*wl*, 5*p*1 and 5*p*2. Furthermore, the preliminary gate insulating patterns 3*sl*, 3*wl*, 3*p* and 3*c* may be patterned together with the preliminary conductive patterns 5*sl*, 5*wl*, 5*p* and 5*c* to form gate insulating patterns 3*sl*1, 3*sl*2, 3*wl*, 3*p*1 and 3*p*2 between the conductive patterns 5*sl*1, 5*sl*2, 5*wl*, 5*p*1 and 5*p*2 and the substrate 1.

The conductive patterns 5*sl*1, 5*sl*2, 5*wl*, 5*p*1 and 5*p*2 may include first and second selection lines 5*sl*1 and 5*sl*2 and word lines 5*wl*, 5*p*1 and 5*p*2. The preliminary word lines 5*wl*, 5*p* and 5*c* may be separated from each other by the third photoresist pattern 42 for node separation. The word lines 5*wl*, 5*p*1 and 5*p*2 including a line portion 5*wl* and pad portions 5*p*1 and 5*p*2 may be formed as the result of the separation of the preliminary word lines 5*wl*, 5*p* and 5*c*. A line-shaped third sidewall S3 may be formed on the second pad portion 5*p*2 by the third photoresist pattern 42. The preliminary selection line 5*sl* may be divided into two parts by the third photoresist pattern 42 to form the first and second selection lines 5*sl*1 and 5*sl*2. The detailed description of the conductive patterns 5*sl*1, 5*sl*2, 5*wl*, 5*p*1 and 5*p*2 may be similar to the conductive patterns 5*sl*1, 5*sl*2, 5*wl*, 5*p*1 and 5*p*2 previously described with reference to FIGS. 1A through 1C.

During the etching of the preliminary conductive patterns 5*sl*, 5*wl*, 5*p* and 5*c*, an upper portion of the substrate 1 may be over-etched, and thereby first to fourth trenches TR1, TR2, TR3 and TR4 may be formed in the substrate 1. That is, the first to fourth trenches TR1-TR4 may have shapes and locations corresponding to shapes and locations of the fourth to seventh openings O4-O7. Subsequently, the third photoresist pattern 42 may be removed.

Referring back to FIGS. 1A to 1C, a spacer layer may be formed on the substrate 1 and an anisotropic etching process may be performed to form gate spacers GS on sidewalls of the conductive patterns 5*sl*1, 5*sl*2, 5*wl*, 5*p*1 and 5*p*2. Subsequently, the capping layer 50 and the interlayer insulating layer 60 may be sequentially formed on the substrate 1. Accordingly, each of the first to fourth trenches TR1-TR4 may be sequentially covered with the gate spacers GS, the capping layer 50 and the interlayer insulating layer 60. The detailed description of the gate spacers GS, the capping layer 50, and the interlayer insulating layer 60 may be similar to that described with reference to FIGS. 1A to 1C.

Peripheral gate patterns 5g of the second region RG2 and the conductive patterns 5s/1, 5s/2, 5wl, 5p1 and 5p2 may be simultaneously formed in the same process step as already described with reference to FIGS. 2A to 17A and FIGS. 2B and 17B. The formation of the peripheral gate patterns 5g may be substantially similar to the formation of the first and second selection lines 5sl1 and 5sl2.

According to some embodiments, after forming the insulating layer 40, the node separation of the preliminary conductive patterns 5sl, 5wl, 5p and 5c and the peripheral gate patterns 5g may be performed, and then the gate spacers GS may be simultaneously formed on the first and second regions RG1 and RG2. Accordingly, a top surface of the insulating layer 40, which is disposed on the conductive patterns 5s/1, 5s/2, 5wl, 5p1 and 5p2 of the first region RG1, may be located at substantially the same level as a top surface of the insulating layer 40, which is disposed on the peripheral gate patterns 5g of the second region RG2. Furthermore, a top surface of the capping layer 50, which is disposed on the conductive patterns 5s/1, 5s/2, 5wl, 5p1 and 5p2 of the first region RG1, may be located at substantially the same level as a top surface of the capping layer 50, which is disposed on the peripheral gate patterns 5g of the second region RG2. That is, there may be no step difference between the first region RG1 and the second region RG2.

According to some embodiments, the single first photoresist line portion 21wl of FIG. 2A can be divided into four word line portions 5wl. That is, by performing two spacer processes, patterns can be formed to have a pitch that is smaller than a limitation of photolithography process. In addition, since line and pad portions are simultaneously defined by performing the photolithography process once, there is no necessity to perform an additional photolithography process for forming the pad portion.

For example, the word line portions 5wl and the word line pad portions 5p1 and 5p2 are simultaneously patterned using the second photoresist pattern 32. Accordingly, it is possible to overcome technical problems, such as mask misalignment or bridge for formation of word line.

Figure 18A:
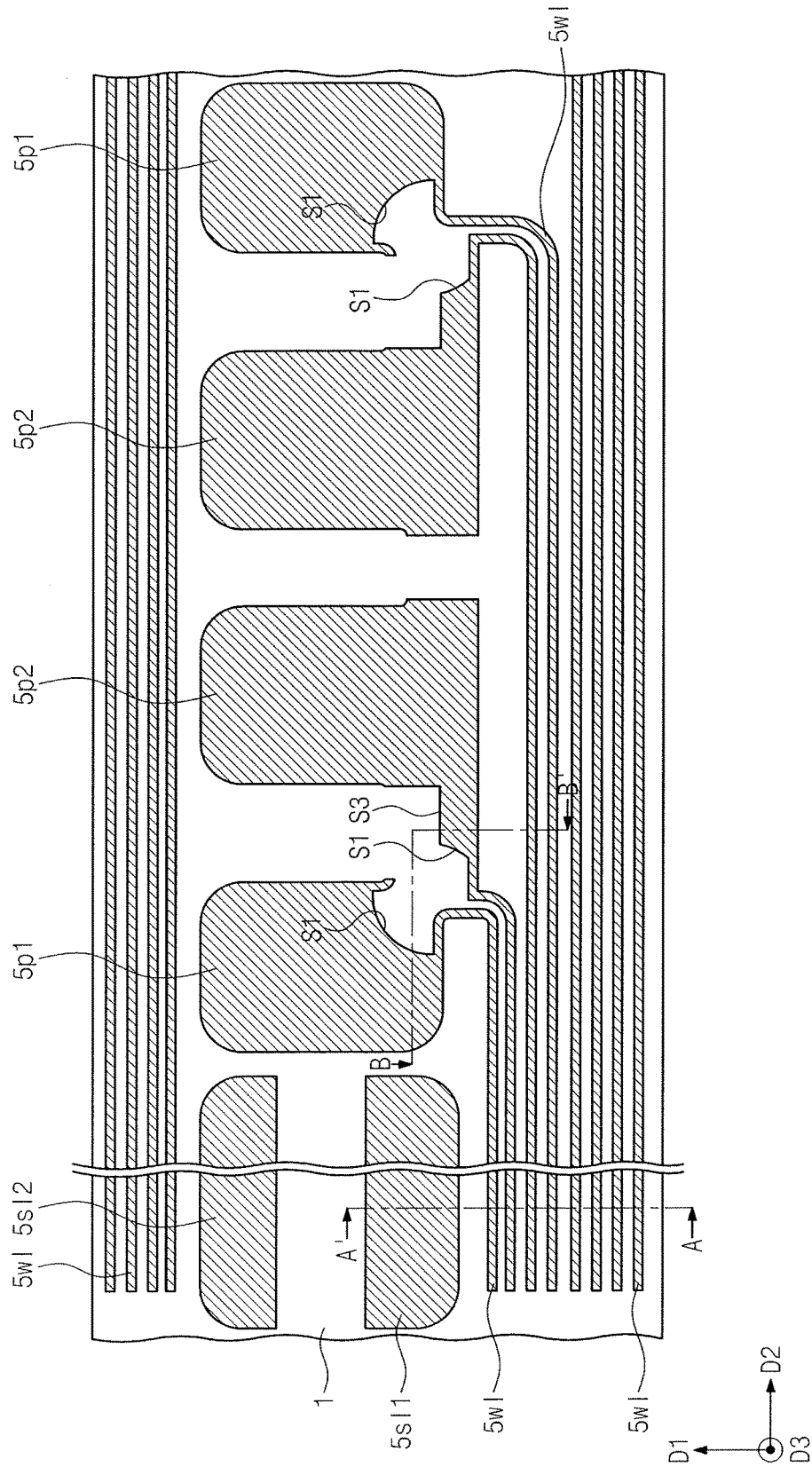
FIG. 18A illustrates a plan view of a semiconductor device according to example embodiments.
Figure 18B:
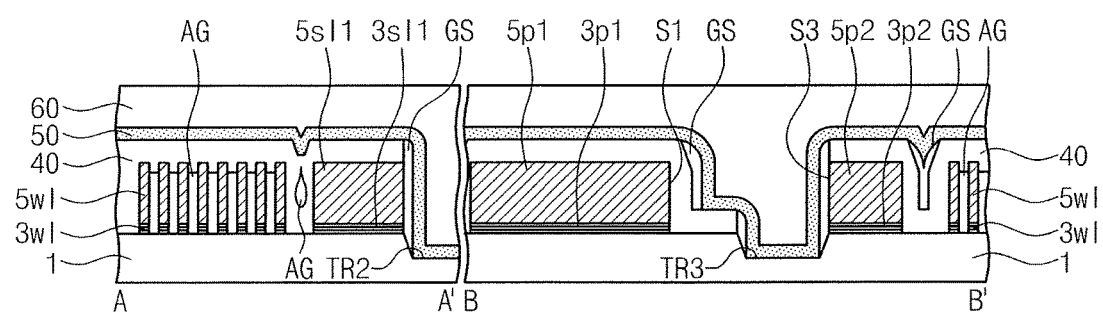
FIG. 18B illustrates a cross-sectional view taken along lines A-A' and B-B' of FIG. 18A.

FIG. 18A is a plan view illustrating a semiconductor device according to example embodiments. FIG. 18B is a cross-sectional view taken along lines A-A' and B-B' of FIG. 18A. In the present embodiment, the detailed description of parts similar to or identical to that described with reference to FIGS. 1A to 1C will be omitted, and only the difference will be described in detail.

Referring to FIGS. 18A and 18B, conductive patterns 5s/1, 5s/2, 5wl, 5p1 and 5p2 may be provided on the substrate 1. FIG. 18A may correspond to the first region RG1 shown in FIG. 1A. According to the present embodiment, peripheral gate patterns 5g disposed on the second region RG2 may be similar to those described with reference to FIGS. 1A to 1C.

The conductive patterns 5s/1, 5s/2, 5wl, 5p1 and 5p2 may include selection lines 5sl1 and 5sl2 and word lines 5wl, 5p1 and 5p2. The word lines 5wl, 5p1 and 5p2 may include line portions 5wl and pad portions 5p1 and 5p2.

When viewed in a plan view, the first pad portion 5p1 may have a first sidewall with a concave profile. Unlike the first pad portion described with reference to FIGS. 1A to 1C, the first pad portion 5p1 may not have a second sidewall S2 with a concave profile. When viewed in a plan view, the second pad portion 5p2 may have a first sidewall S1 with a concave profile and a third sidewall S3 with a linear shape. The third sidewall S3 of the second pad portion 5p2 may be adjacent to the first sidewall S1.

First to fourth trenches TR1-TR4 may be defined in an upper portion of the substrate 1, and when viewed in a plan view, their shapes and locations may be similar to those of the first to fourth trenches TR1-TR4 described with reference to FIG. 1A. Even though not shown in the drawings, the fifth trenches TR5 described with reference to FIG. 1A may be defined in the second region RG2 according to the present embodiment.

The insulating layer 40, the capping layer 50, and the interlayer insulating layer 60, which are sequentially stacked on the substrate 1, may be provided. Air gaps surrounded by the insulating layer 40 may be defined between the line portions 5wl. In addition, the air gaps surrounded by the insulating layer 40 may also be defined between the line portions 5wl and the selection lines 5sl and 5sl2.

FIGS. 19A to 25A are plan views illustrating processing steps in the fabrication of a semiconductor device according to example embodiments. FIGS. 19B to 25B are cross-sectional views taken along lines A-A' and B-B' of FIGS. 19A to 25A, respectively. In present embodiment, the detailed description of parts similar to or repeated with that described with reference to FIGS. 2A to 17A and 2B to 17B will be omitted, and only the difference will be described in detail.

Figure 19A:
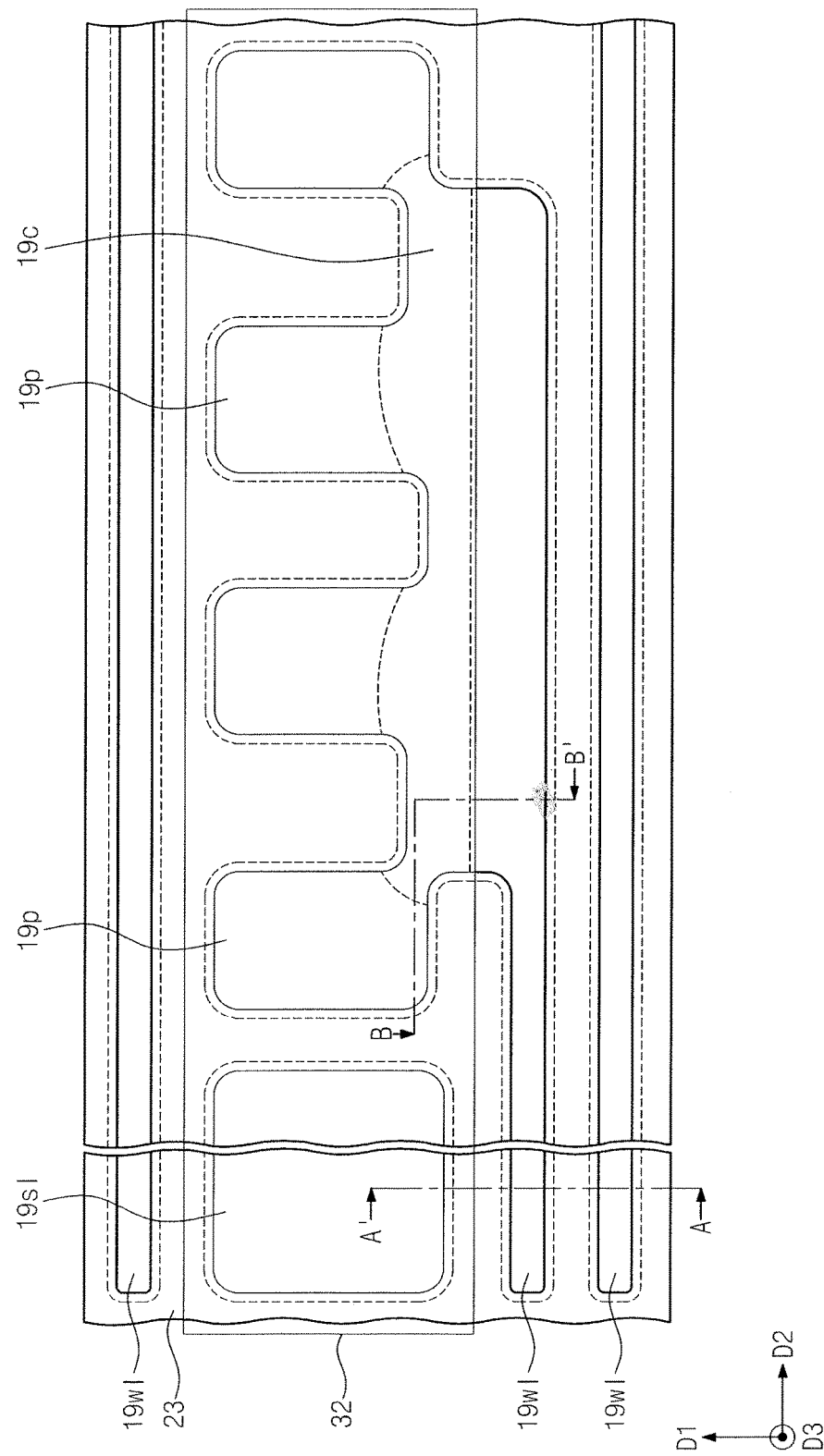
Figure 19B:
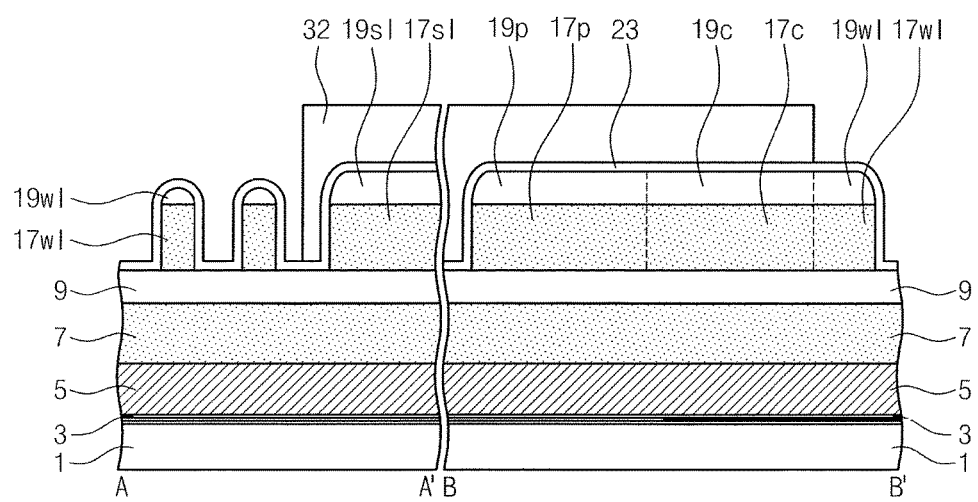

Referring to FIGS. 19A and 19B, a second photoresist pattern 32 may be formed on the structure shown in FIGS. 4A and 4B. Unlike the description described with reference to FIGS. 5A and 5B, first openings O1 may be not formed in the second photoresist pattern 32. The second photoresist pattern 32 may expose a first spacer layer 23 covering fourth mask line portions 19wl.

Figure 20A:
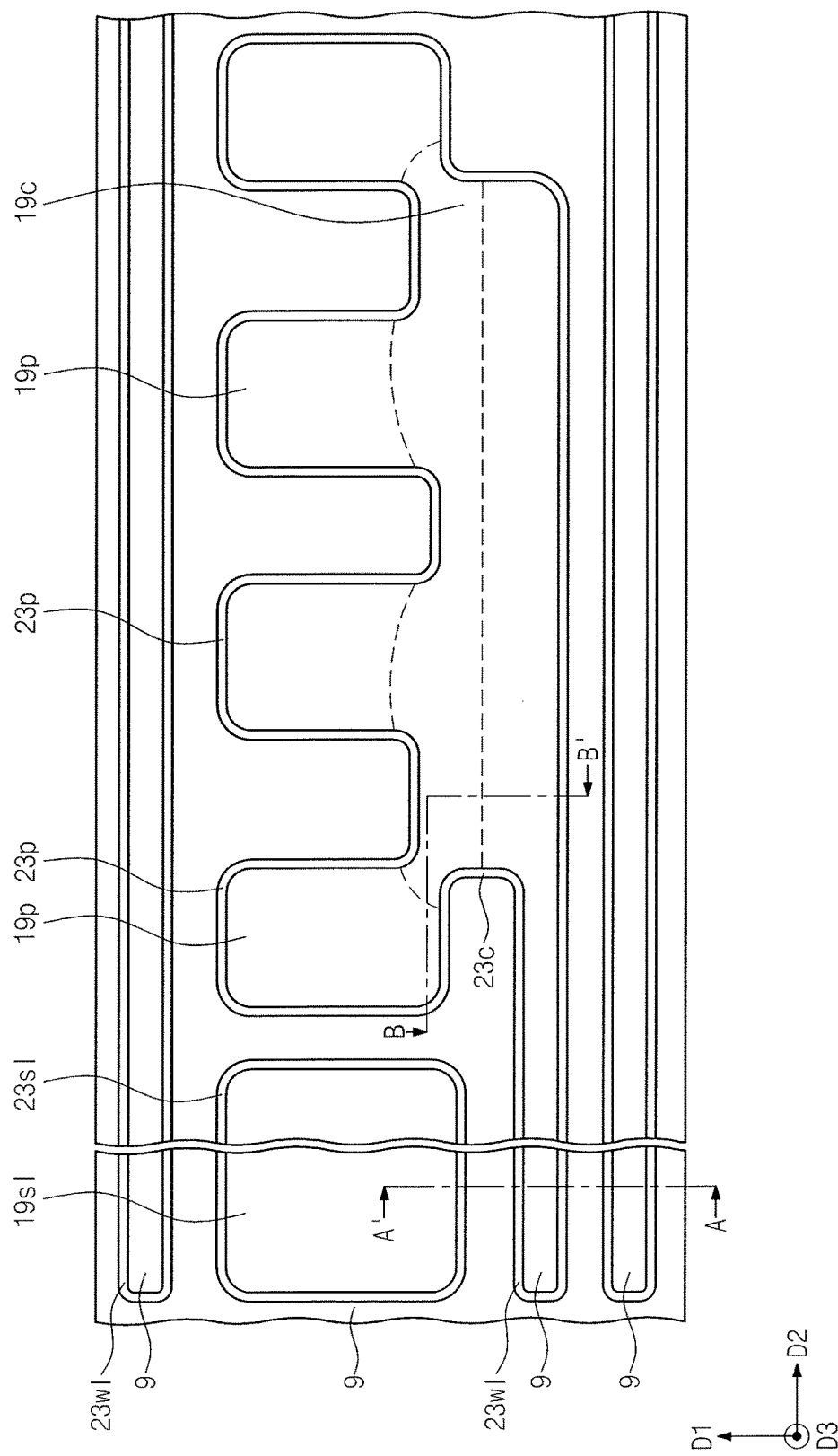
Figure 20B:
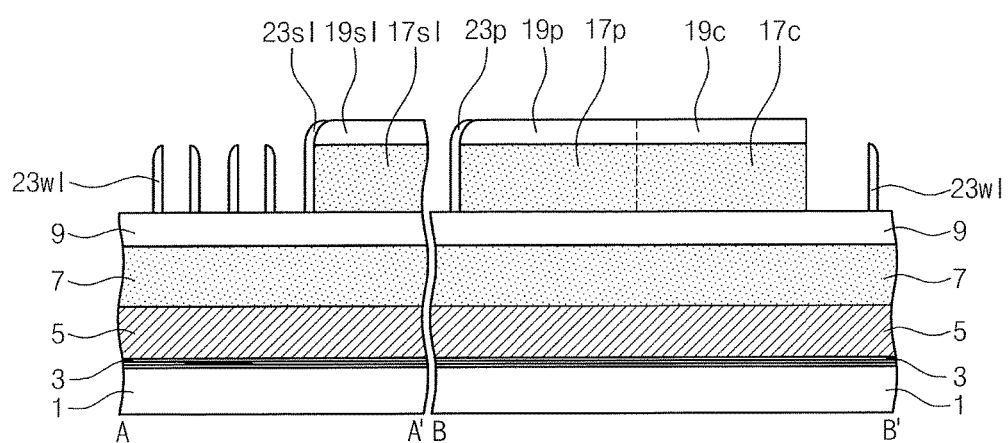

Referring to FIGS. 20A and 20B, an anisotropic etching process may be performed using the second photoresist pattern 32 as an etch mask to remove the first spacer layer 23 and the fourth mask line portions 19wl that are disposed on the third mask line portions 17wl. Then, first line spacers 23wl may be formed to cover sidewalls of the third mask line portions 17wl. Subsequently, the exposed third mask line portions 17wl may be selectively removed.

The second photoresist pattern 32 may be removed. An etching process may be performed with respect to the first spacer layer 23 remaining on a fourth selection line mask pattern 19sl, a fourth mask pad portion 19p and a fourth mask connecting portion 19c to form a first selection line spacer 23sl, a first pad spacer 23p and a first connecting spacer 23c. Accordingly, the first selection line spacer 23sl, the first pad spacer 23p and the first connecting spacer 23c may be formed on sidewalls of a third selection line mask pattern 17sl, a third mask pad portion 17p and a third mask connecting portion 17c.

Figure 21A:
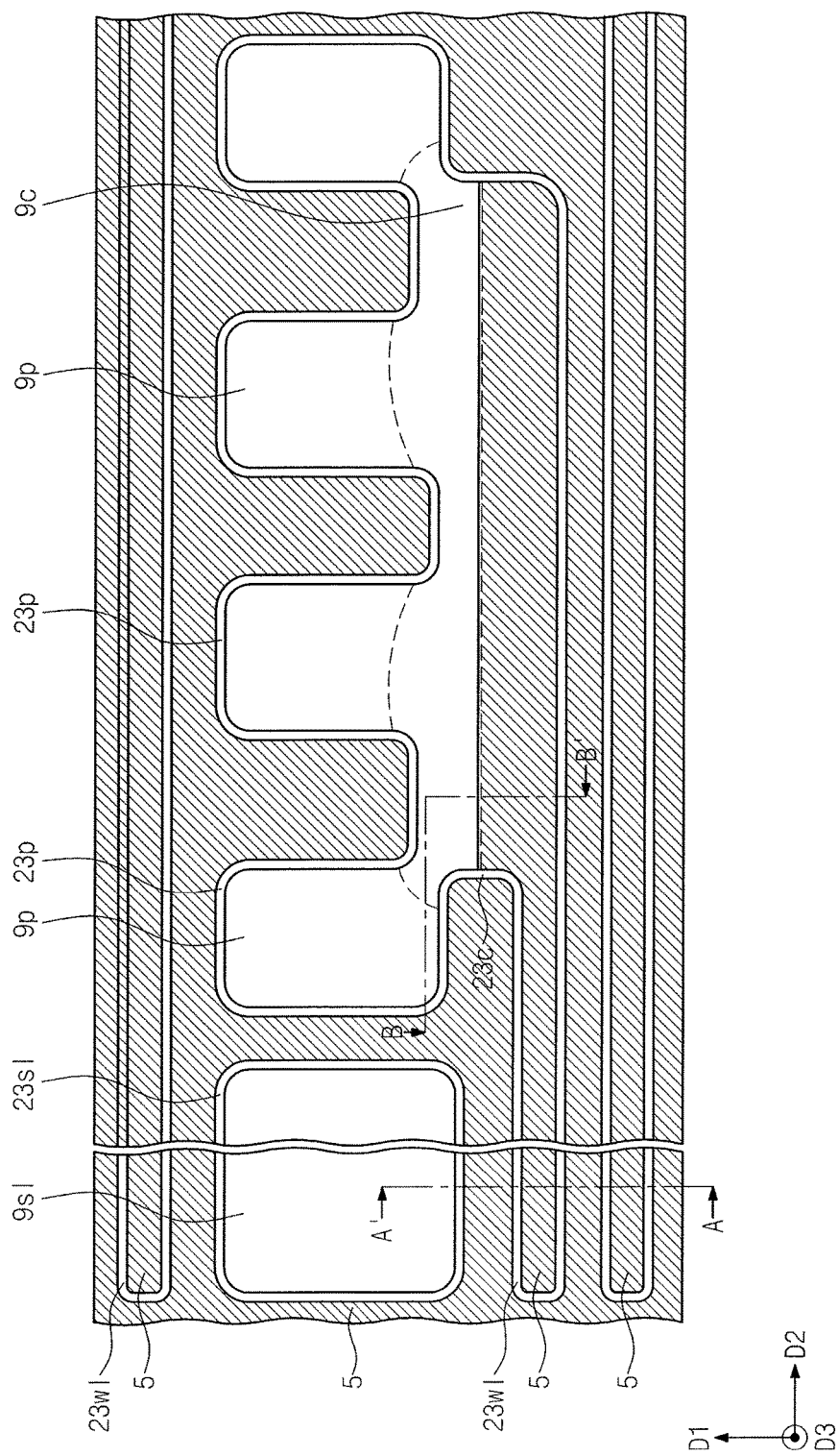
Figure 21B:
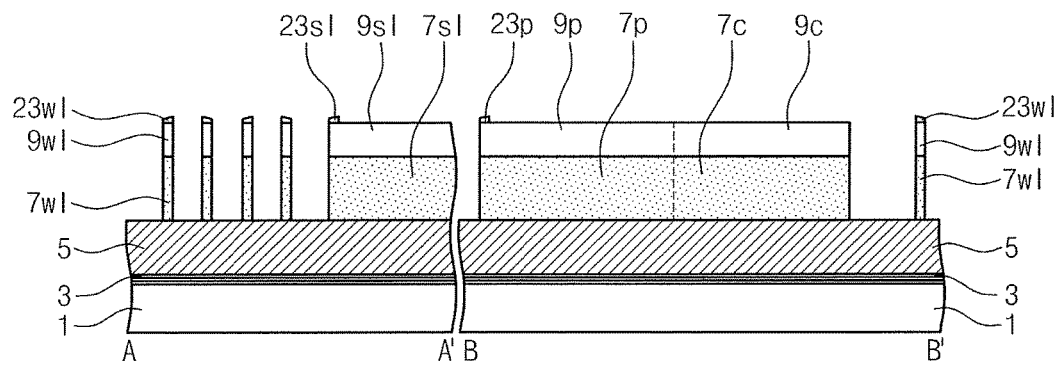

Referring to FIGS. 21A and 21B, a second mask layer 9 may be etched using the first spacers 23sl, 23wl, 23p and 23c and the third mask patterns 17sl, 17p and 17c as an etch mask to form second mask patterns 9sl, 9wl, 9p and 9c. In addition, the remaining portions of the fourth mask patterns 19sl, 19p and 19c may be removed.

A first mask layer 7 may be etched using the second mask patterns 9sl, 9wl, 9p and 9c as an etch mask to form first mask patterns 7sl, 7wl, 7p and 7c. In addition, the remaining portions of the third mask patterns 17sl, 17p and 17c may be removed.

Figure 22A:
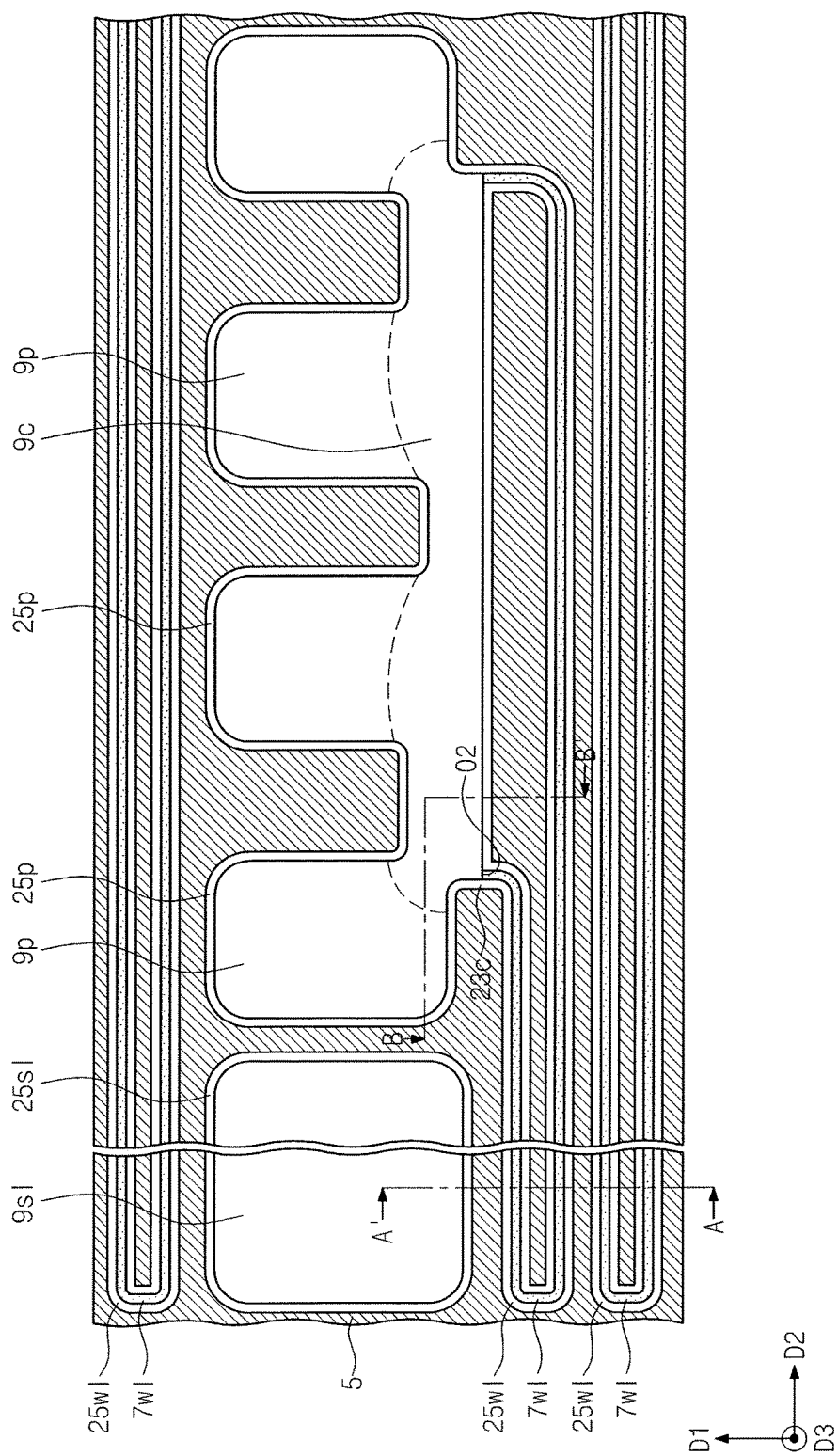
Figure 22B:
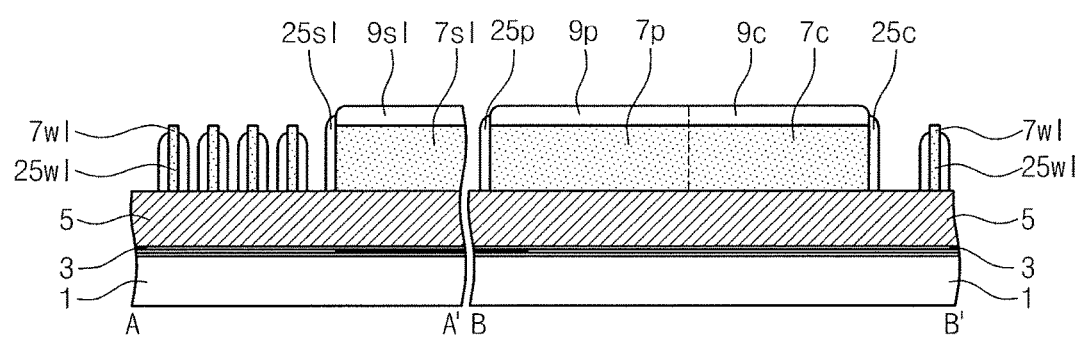

Referring to FIGS. 22A and 22B, second spacers 25sl, 25wl, 25p and 25c may be formed on sidewalls of the first mask patterns 7sl, 7wl, 7p and 7c. The formation of the second spacers 25*sl*, 25*wl*, 25*p* and 25*c* may be substantially similar to that described with reference to FIGS. 11A, 11B, 12A and 12B.

The remaining portion of a second mask line portion 9*wl* may be removed to expose a top surface of a first mask line portion 7*wl*. A second opening O2 may be defined at a second mask connecting portion 9*c* which is adjacent to the first mask line portion 7*wl*. Unlike the description with reference to FIGS. 12A and 12B, a third opening O3 may be not formed.

Figure 23A:
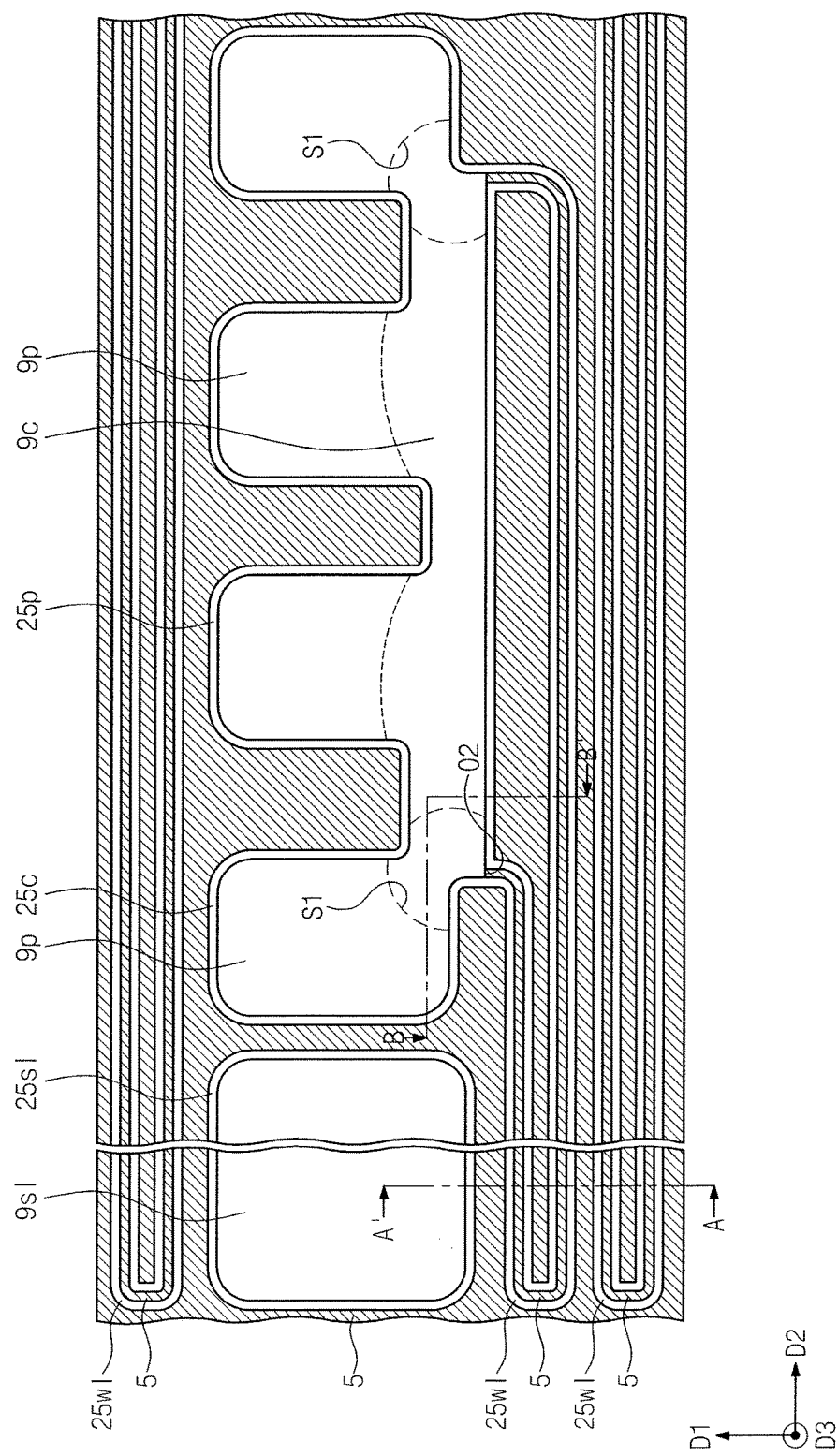
Figure 23B:
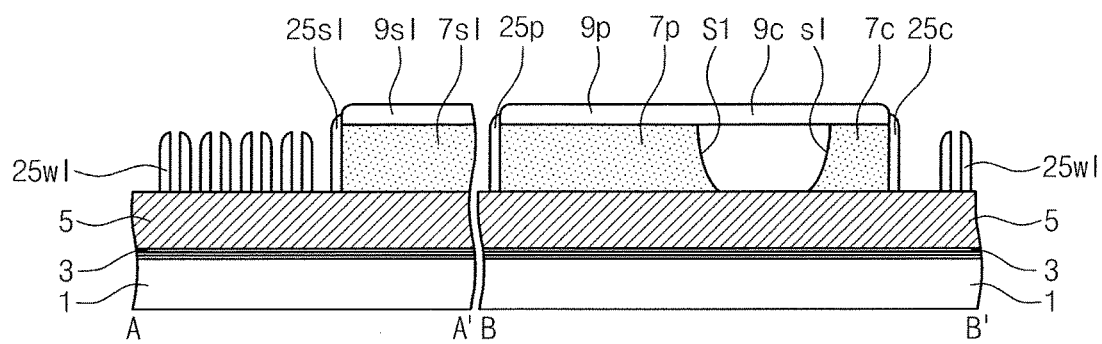

Referring to FIGS. 23A and 23B, an isotropic etching process may be performed to selectively remove the exposed first mask line portion 7*wl*. By using the isotropic etching process, an etchant may be penetrated below the second mask connecting portion 9*c* through the second openings O2 so as to remove a portion of the first mask connecting portion 7*c*. Thus, the first mask connecting portion 7*c* may have a first sidewall S1 by the etching process. The first sidewall S1 may be formed by the etching process using the etchant which is penetrated through the second openings O2. In the same way above, a first mask pad portion 7*p* may also have a first sidewall S1. When viewed a plan view, all of the first sidewalls S1 may have a concave profile. Unlike the description with reference to FIGS. 13A and 13B, a second sidewall S2 may be not formed.

Figure 24A:
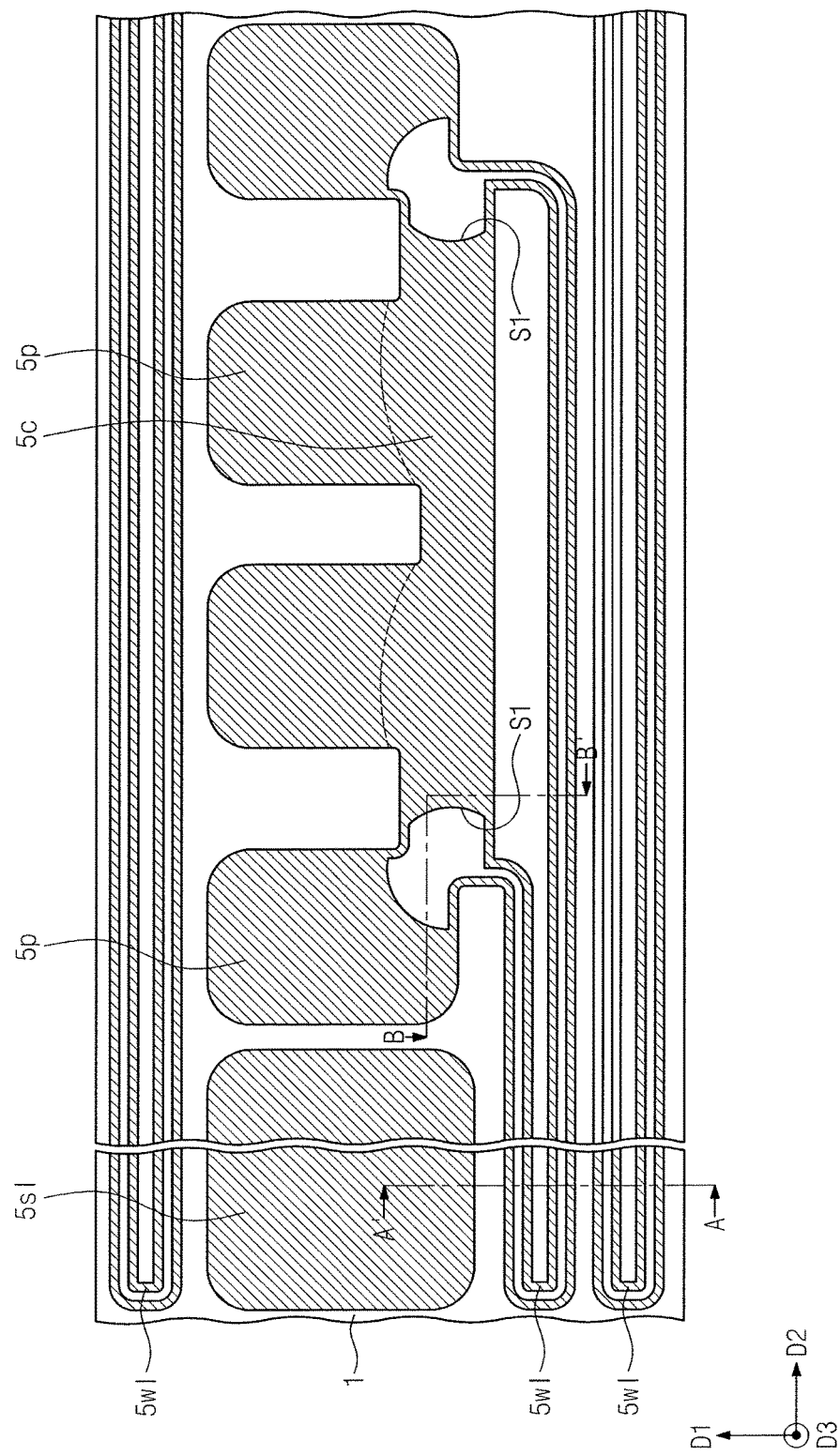
Figure 24B:
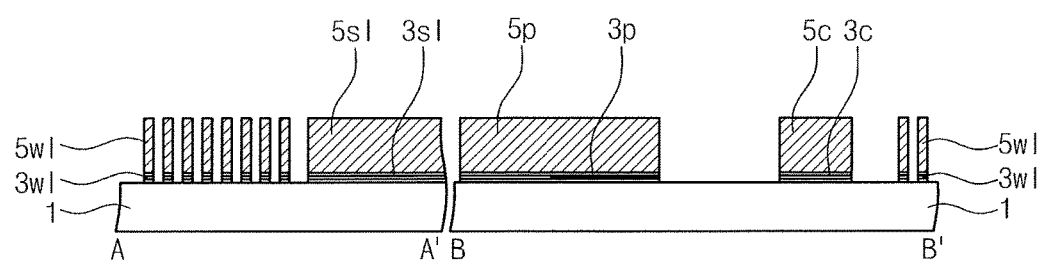

Referring to FIGS. 24A and 24B, the remaining portion of the second mask patterns 9*sl*, 9*p* and 9*c* may be selectively removed to expose the first mask patterns 7*sl*, 7*p* and 7*c*. A conductive layer 5 may be etched using the second spacers 25*sl*, 25*wl*, 25*p* and 25*c* and the first mask patterns 7*sl*, 7*p* and 7*c* as an etch mask to form preliminary conductive patterns 5*sl*, 5*wl*, 5*p* and 5*c*. Subsequently, preliminary gate insulating patterns 3*sl*, 3*wl*, 3*p* and 3*c* may be formed between the preliminary conductive patterns 5*sl*, 5*wl*, 5*p* and 5*c* and the substrate 1.

Figure 25A:
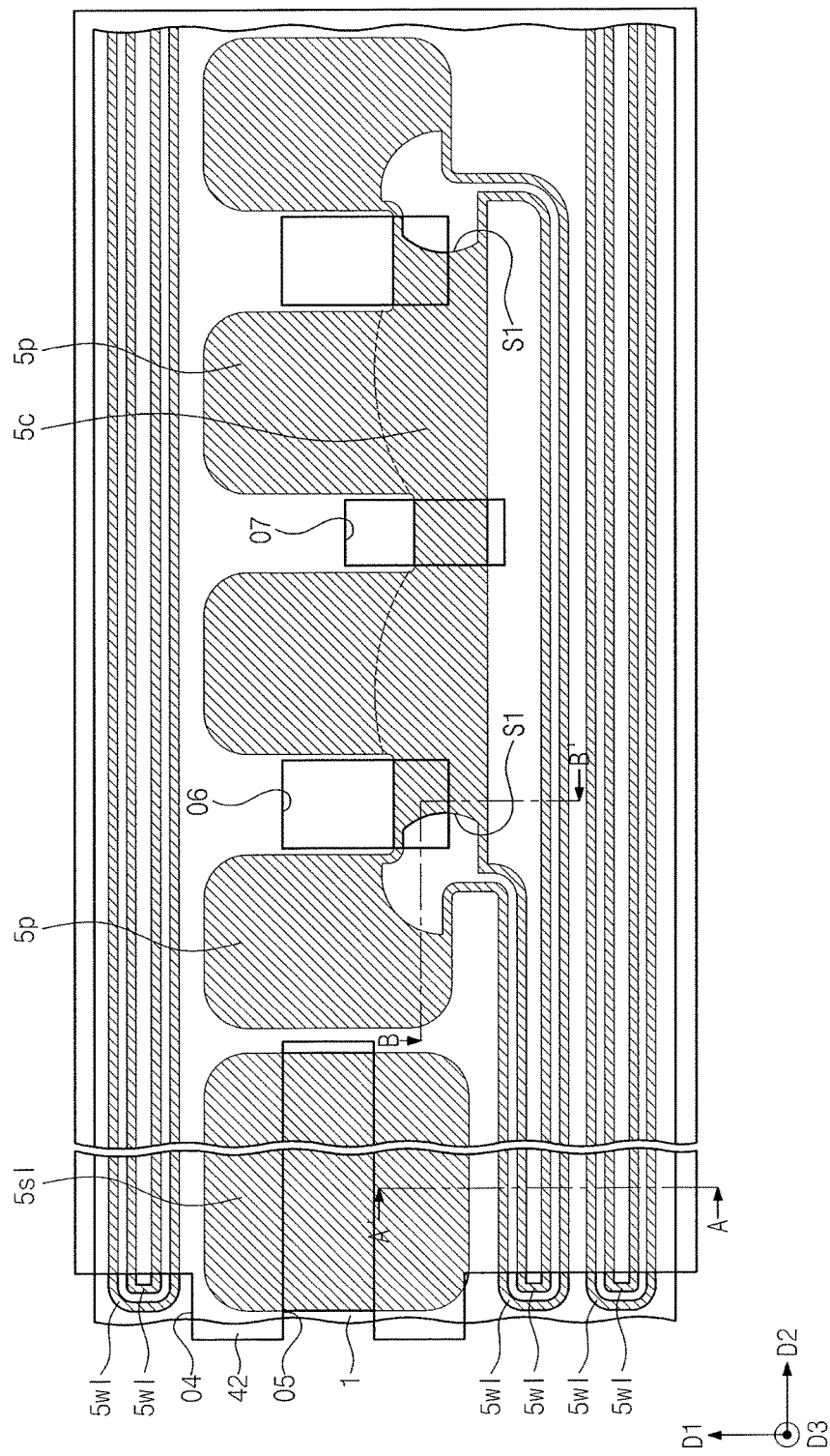
Figure 25B:
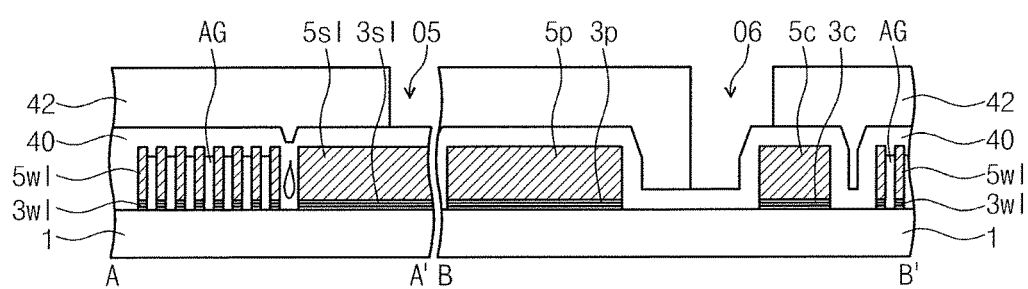

Referring to FIGS. 25A and 25B, an insulating layer 40 covering the preliminary conductive patterns 5*sl*, 5*wl*, 5*p* and 5*c* may be formed on the substrate 1. A third photoresist pattern 42 including fourth to seven openings O4, O5, O6 and O7 may be formed on the insulating layer 40

Referring back to FIGS. 18A and 18B, the insulating layer 40 and the preliminary conductive patterns 5*sl*, 5*wl*, 5*p* and 5*c* may be sequentially etched using the third photoresist pattern 42 as an etch mask to form conductive patterns 5*sl*1, 5*sl*2, 5*wl*, 5*p*1 and 5*p*2. Furthermore, the preliminary gate insulating patterns 3*sl*, 3*wl*, 3*p* and 3*c* may be patterned together with the preliminary conductive patterns 5*sl*, 5*wl*, 5*p* and 5*c* to form gate insulating patterns 3*sl*1, 3*sl*2, 3*wl*, 3*p*1 and 3*p*2.

During the etching of the preliminary conductive patterns 5*sl*, 5*wl*, 5*p* and 5*c*, an upper portion of the substrate 1 may be over-etched, and thereby first to fourth trenches TR1, TR2, TR3 and TR4 may be formed in the substrate 1. Shape and location of the first to fourth trenches TR1-TR4 may be similar to that described with reference to FIGS. 17A and 17B.

Subsequently, gate spacers GS may be formed on sidewalls of the conductive patterns 5*sl*1, 5*sl*2, 5*wl*, 5*p*1 and 5*p*2. A capping layer 50 and an interlayer insulating layer 60 may be sequentially formed on the substrate 1.

Figure 26A:
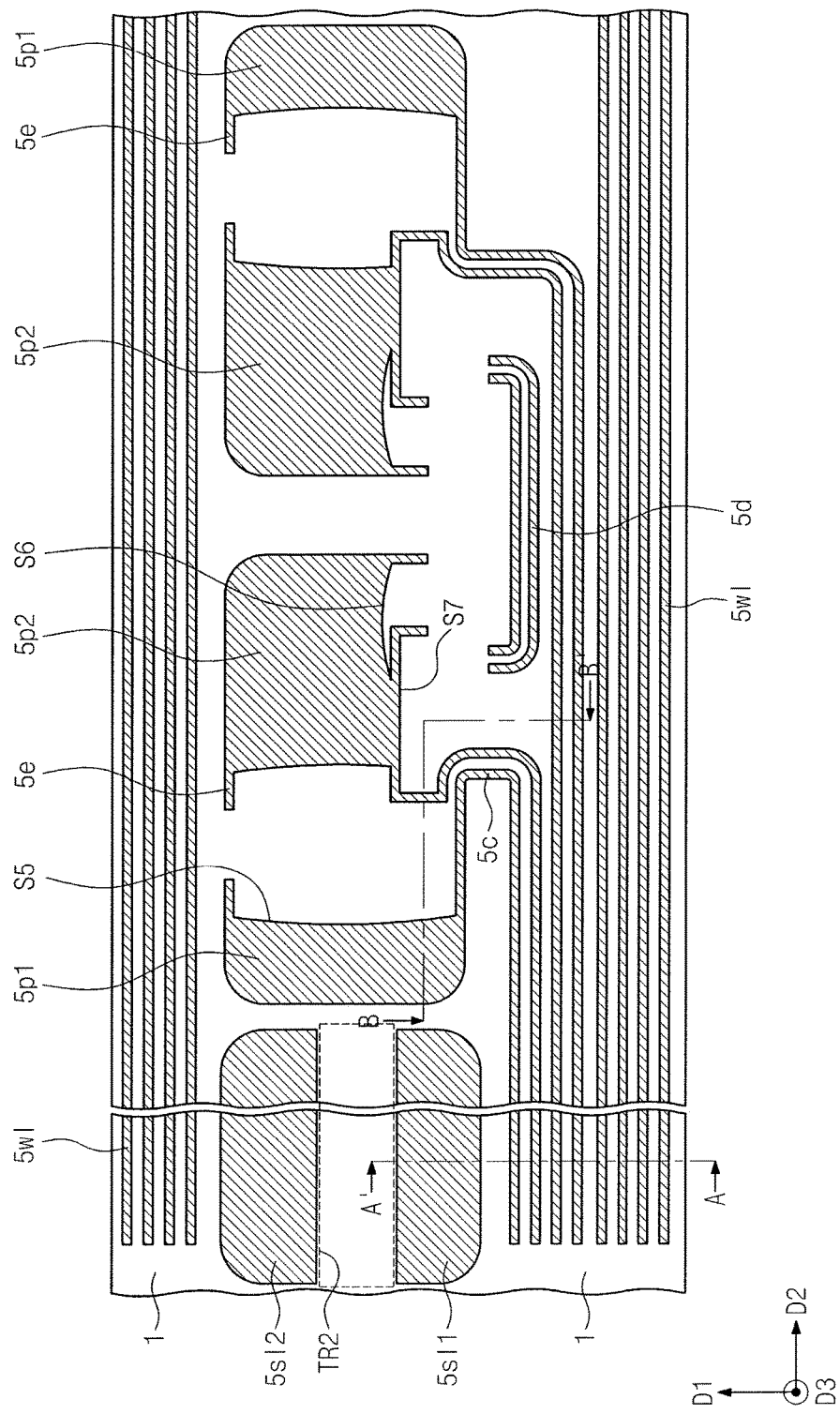
FIG. 26A illustrates a plan view of a semiconductor device according to example embodiments.
Figure 26B:
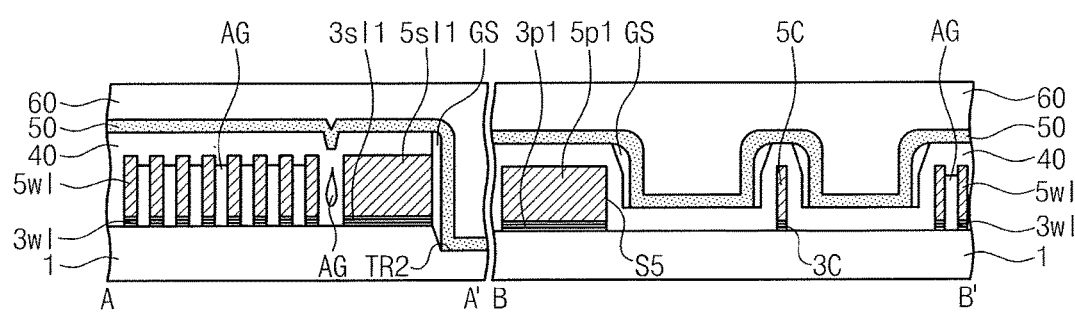
FIG. 26B illustrates a cross-sectional view taken along lines A-A' and B-B' of FIG. 26A.

FIG. 26A is a plan view illustrating a semiconductor device according to example embodiments. FIG. 26B is a cross-sectional view taken along lines A-A' and B-B' of FIG. 26A. In present embodiment, the detailed description of parts similar to or repeated with that described with reference to FIGS. 1A to 1C will be omitted, and only the difference will be described in detail.

Referring to FIGS. 26A and 26B, conductive patterns 5*sl*1, 5*sl*2, 5*wl*, 5*p*1, 5*p*2 and 5*d* may be disposed on a substrate 1. FIG. 26A may correspond to a first region RG1 shown in FIG. 1A. According to present embodiment, peripheral gate patterns 5*g* disposed on a second region RG2 may be similar to that described with reference to FIGS. 1A to 1C.

The conductive patterns 5*sl*1, 5*sl*2, 5*wl*, 5*p*1, 5*p*2 and 5*d* may include selection lines 5*sl*1 and 5*sl*2, word lines 5*wl*, 5*c*, 5*p*1 and 5*p*2 and dummy word lines 5*d*. The word lines 5*wl*, 5*c*, 5*p*1 and 5*p*2 may include line portions 5*wl*, pad portions 5*p*1 and 5*p*2 and connecting portions 5*c* connecting them. The dummy word lines 5*d* may be disposed to be adjacent to a pair of second pad portions 5*p*2 that are adjacent to each other.

When viewed in a plan view, the pad portions 5*p*1 and 5*p*2 may have at least one concave sidewall S5 and S6. The pad portions 5*p*1 and 5*p*2 may further have a line-shaped sidewall S7 between the concave sidewalls S5 and S6. The pad portion 5*p*1 and 5*p*2 may have at least one corner protruding portion 5*e* that is adjacent to the concave sidewall S5. A width of the corner protruding portion 5*e* may be equal to a width 1F of the line portion 5*wl*. The connecting portion 5*c* may be connected to an end portion of the line portion 5*wl*, and may extend in a first direction D1.

A trench TR2 may be defined in an upper portion of the substrate 1. When viewed in a plan view, its shape and location may be similar to those of the second trench TR2 described with reference to FIG. 1A. Even though not shown in the drawings, the fifth trenches TR5 described with reference to FIG. 1A may be defined in the second region RG2 according to present embodiments. But the first, third and fourth trenches TR1, TR3 and TR4 described with reference to FIG. 1A may be omitted.

An insulating layer 40, a capping layer 50 and an interlayer insulating layer 60, which are sequentially stacked, may be provided on the conductive patterns 5*sl*1, 5*sl*2, 5*wl*, 5*p*1, 5*p*2 and 5*d*. Air gaps surrounded by the insulating layer 40 may be defined between the line portions 5*wl*. In addition, the air gaps surrounded by the insulating layer 40 may also be defined between the line portions 5*wl* and the selection lines 5*sl* and 5*sl*2.

FIGS. 27A to 37A are plan views sequentially illustrating stages in a fabricating method for a semiconductor device according to example embodiments. FIGS. 27B to 37B are cross-sectional views taken along lines A-A' and B-B' of FIGS. 27A to 37A, respectively. In present embodiment, the detailed description of parts similar to or repeated with that described with reference to FIGS. 2A to 17A and 2B to 17B will be omitted, and only the difference will be described in detail.

Figure 27A:
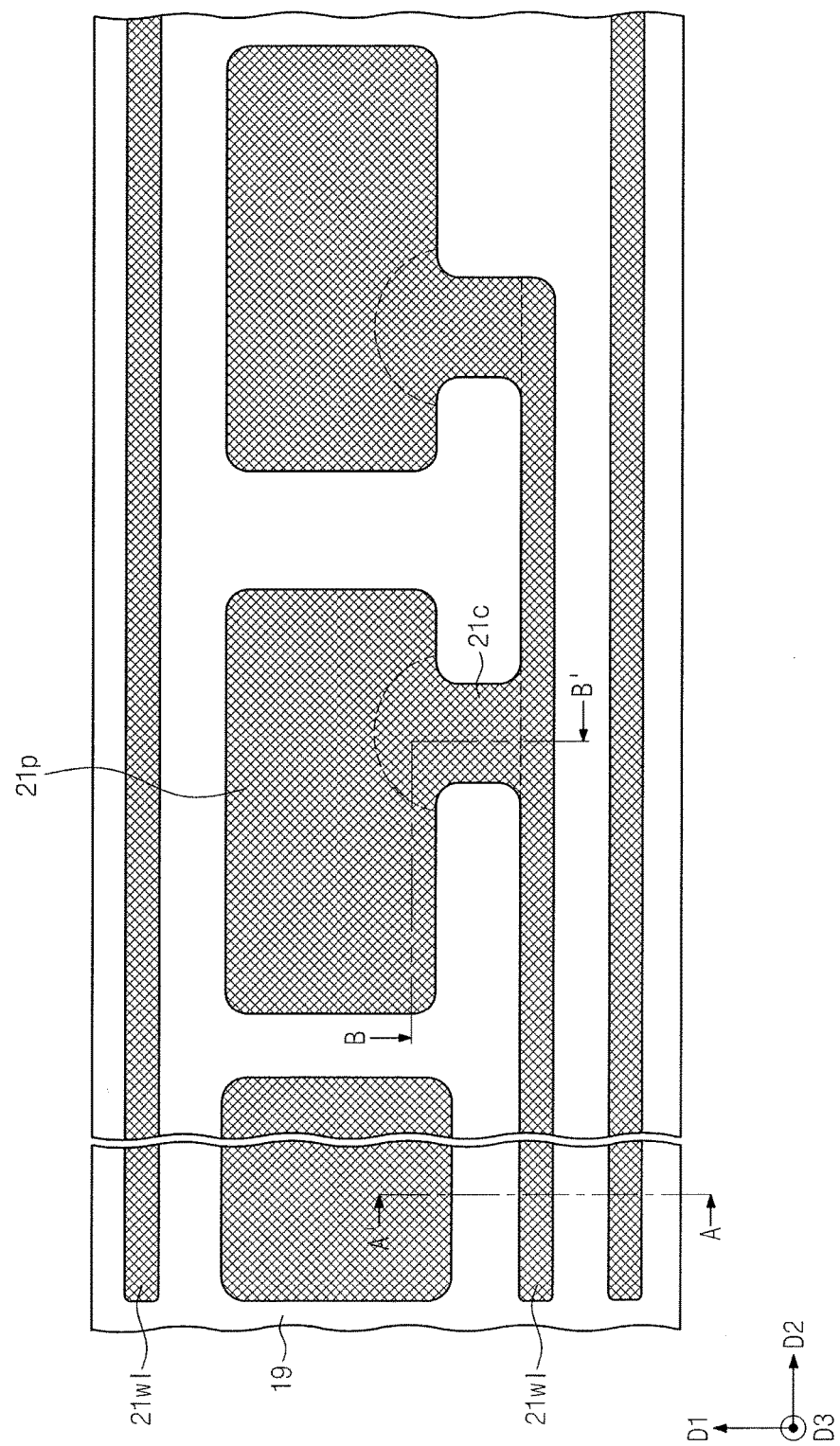
Figure 27B:
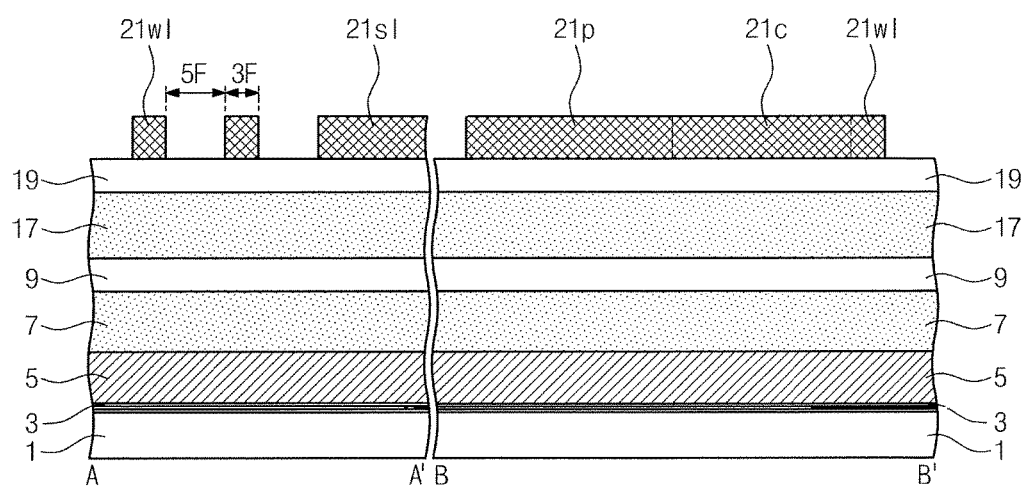

Referring to FIGS. 27A and 27B, an gate insulating layer 3, a conductive layer 5, a first mask layer 7, a second mask layer 9, a third mask layer 17 and a fourth mask layer 19 may be sequentially formed on a substrate 1.

First photoresist patterns 21*sl*, 21*wl*, 21*p* and 21*c* may be formed on the fourth mask layer 19. The first photoresist patterns 21*sl*, 21*wl*, 21*p* and 21*c* may include a first selection line photoresist pattern 21*sl* and a first word line photoresist pattern 21*wl*, 21*p* and 21*c*. The first word line photoresist pattern 21*wl*, 21*p* and 21*c* may include a first photoresist line portion 2*wl*, a first photoresist pad portion 21*p* and a first connecting portion 21*c* connecting them. Unlike the description with reference to FIGS. 2A and 2B, the first word line photoresist pattern 21*wl*, 21*p* and 21*c* may include two pad portions 21*p*.

Figure 28A:
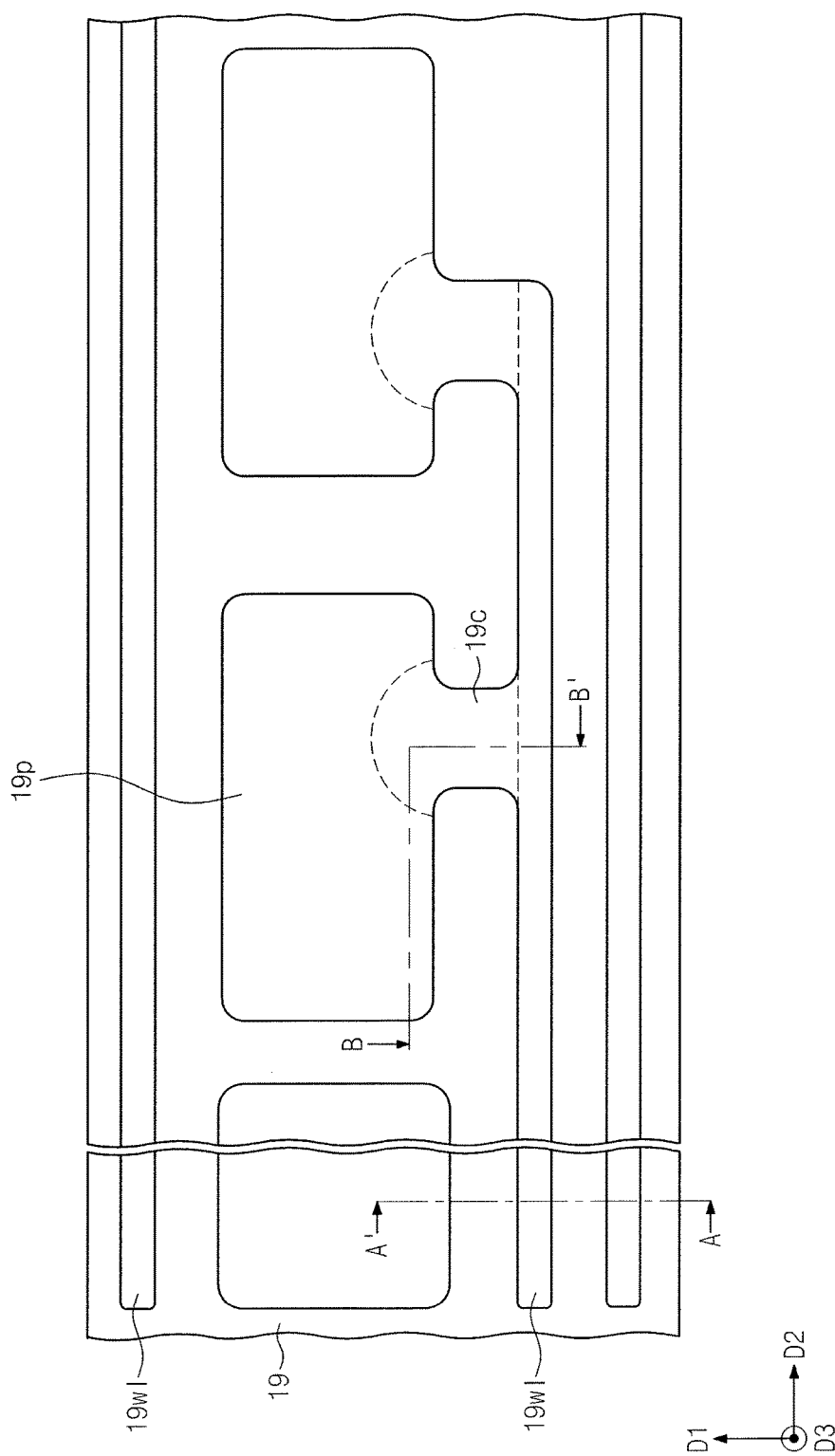
Figure 28B:
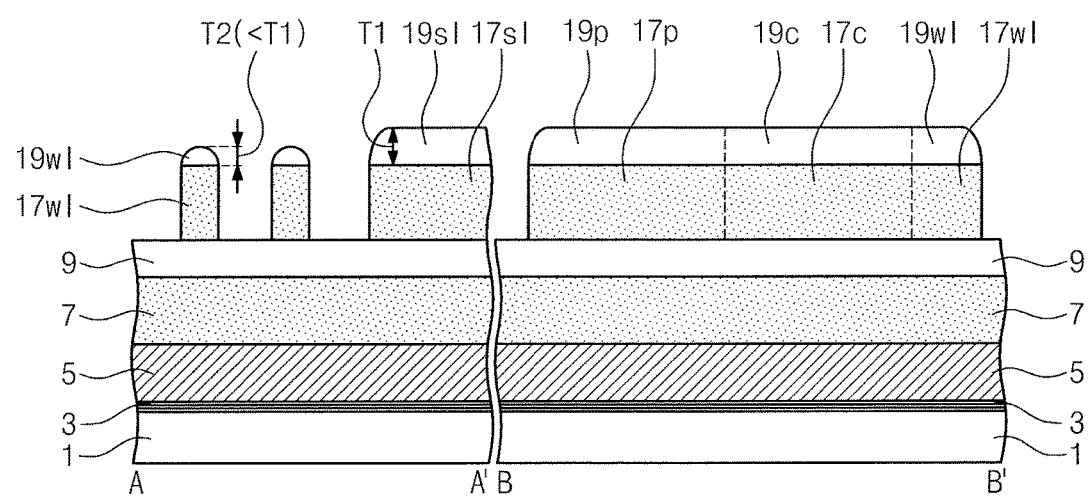

Referring to FIGS. 28A and 28B, fourth mask patterns 19sl, 19wl, 19p and 19c may be formed by etching the fourth mask layer 19 using the first photoresist patterns 21sl, 21wl, 21p and 21c as an etch mask. Third mask patterns 17sl, 17wl, 17p and 17c may be formed by etching the third mask layer 17 using the fourth mask patterns 19sl, 19wl, 19p and 19c as an etch mask.

Figure 29A:
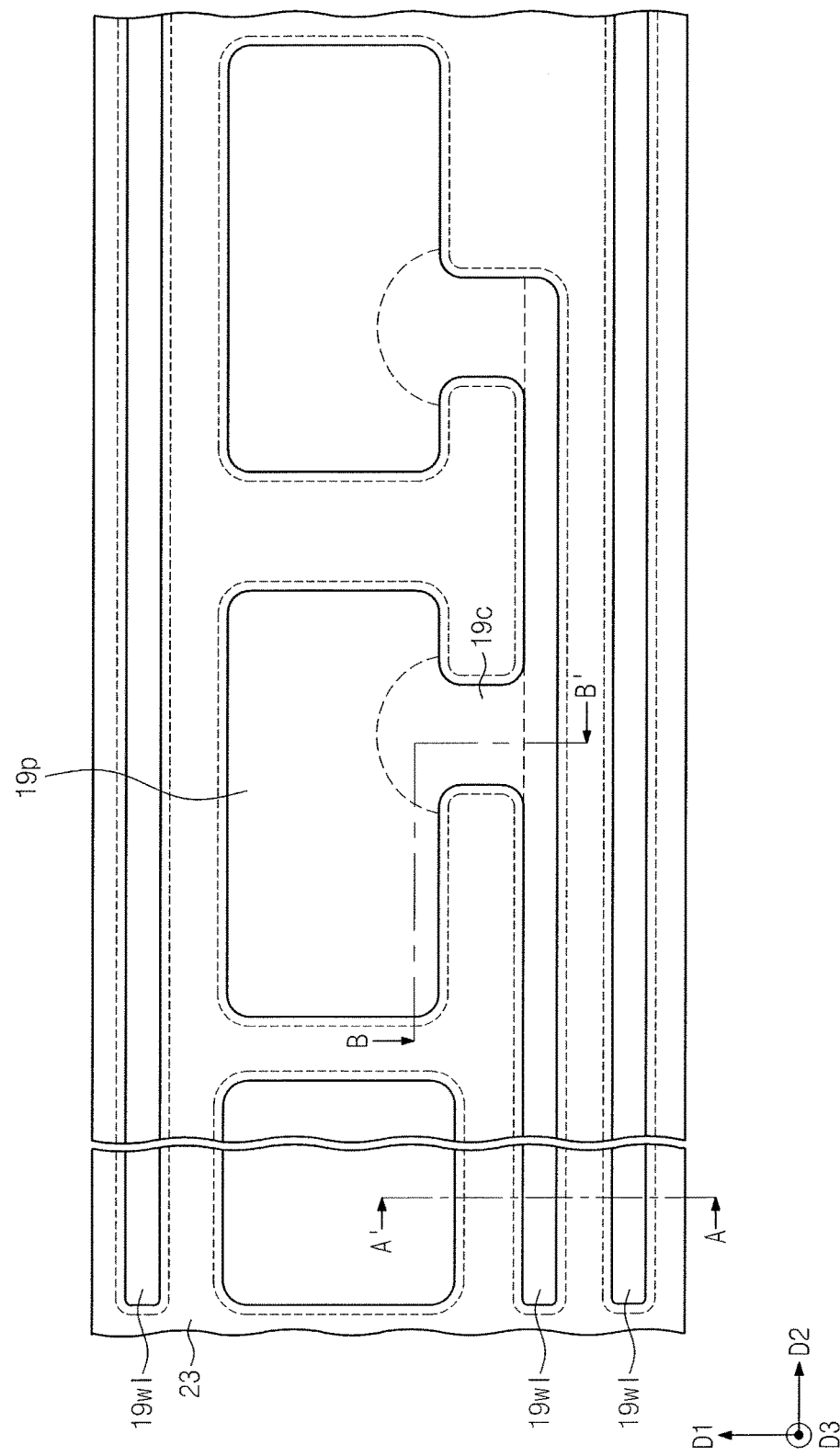
Figure 29B:
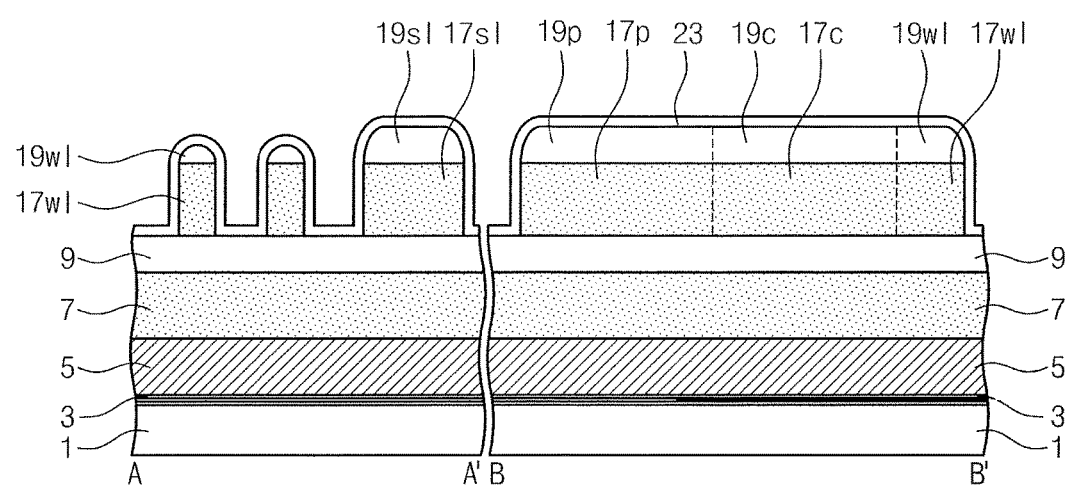

Referring to FIGS. 29A and 29B, a first spacer layer 23 may be conformally formed on the substrate 1.

Figure 30A:
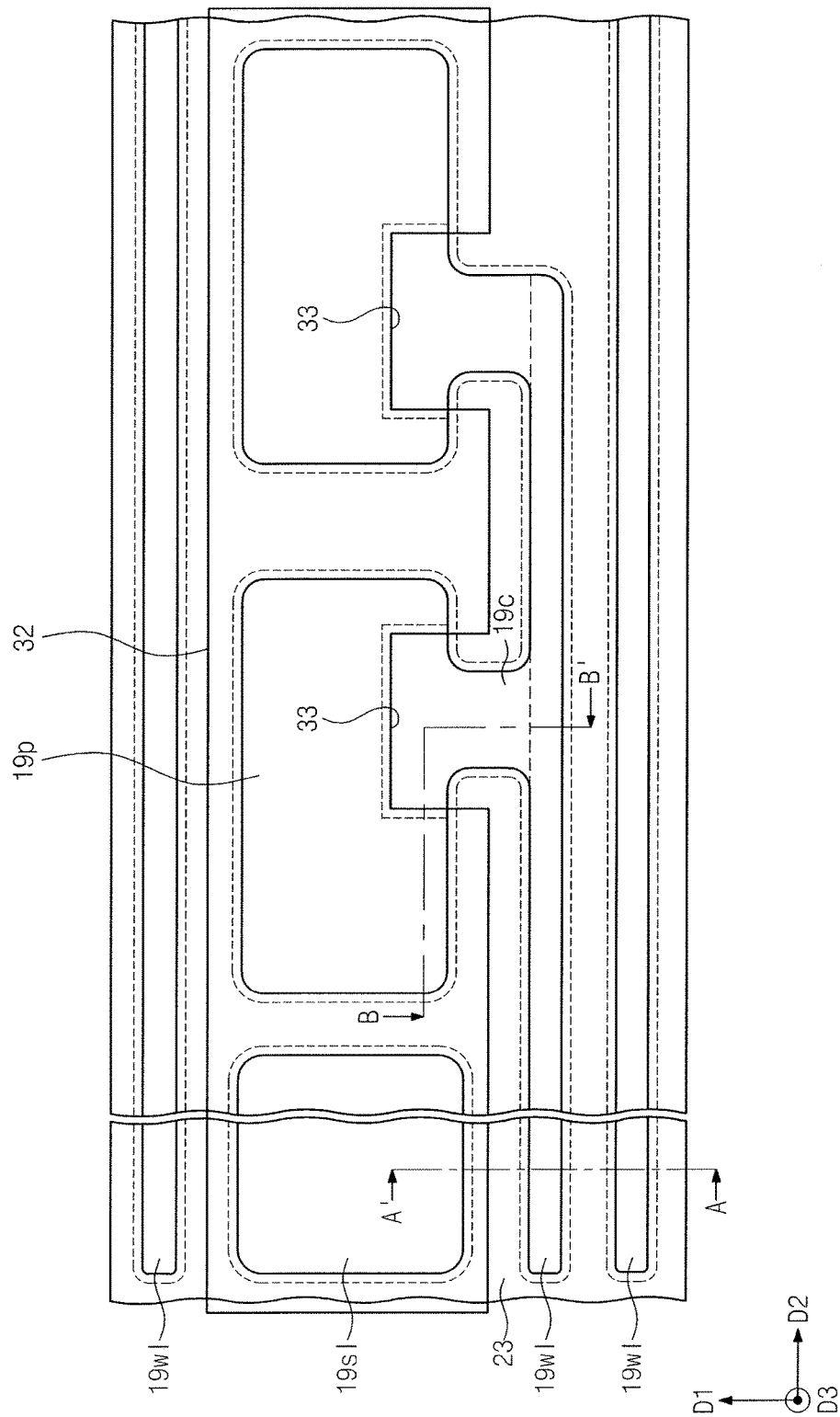
Figure 30B:
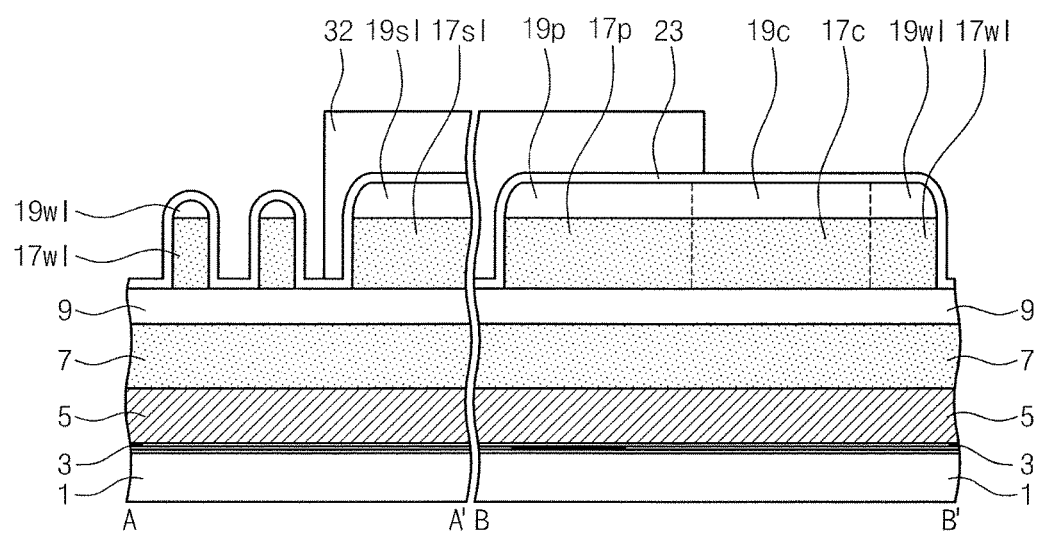

Referring to FIGS. 30A and 30B, a second photoresist pattern 32 may be formed on the first spacer layer 23. The second photoresist pattern 32 may expose the first spacer layer 23 that is disposed on the fourth mask line portions 19wl. The second photoresist pattern 32 may include a recessed opening 33. The recessed opening 33 may expose the first spacer layer 23 that is disposed on the fourth mask connecting portion 19c.

Figure 31A:
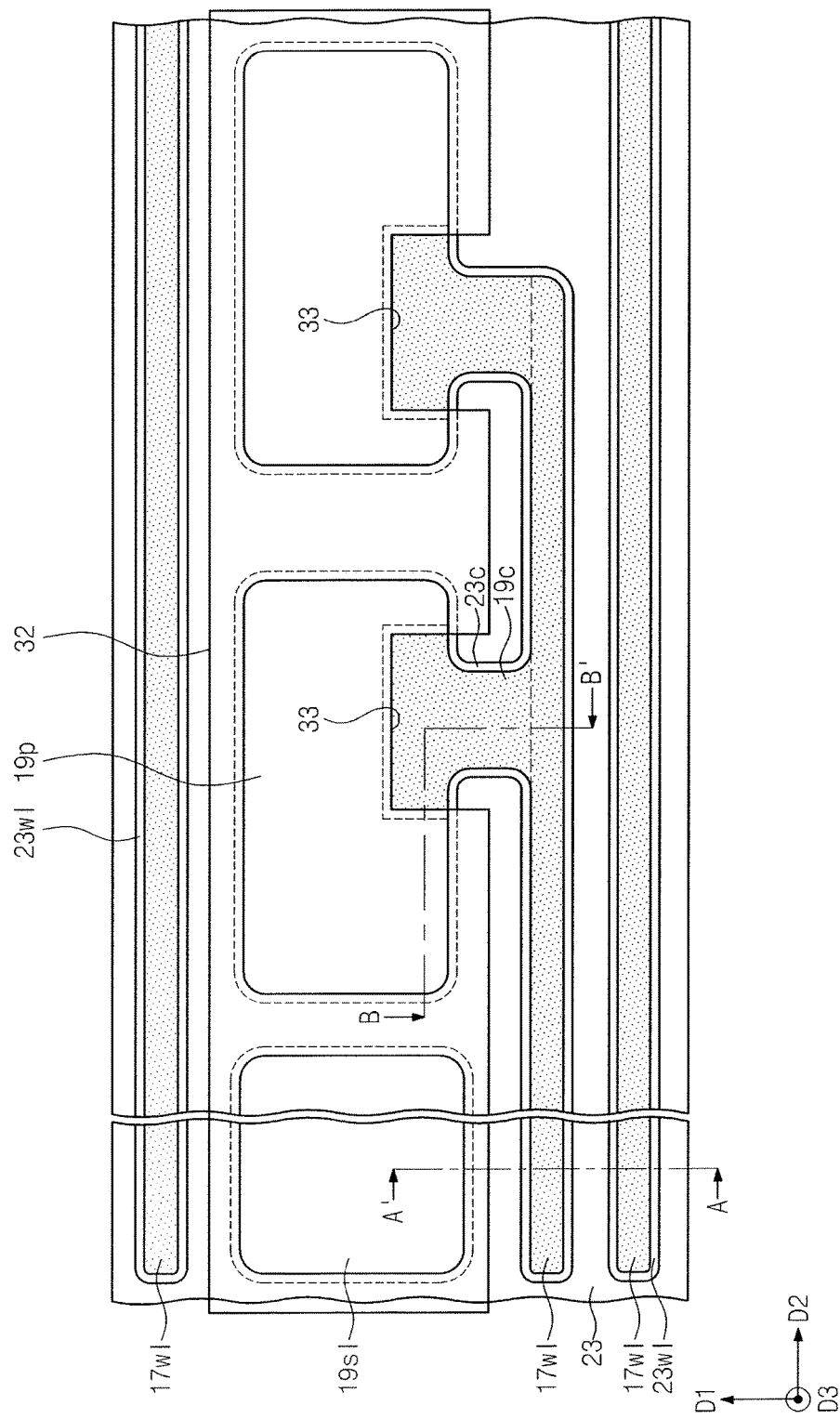
Figure 31B:
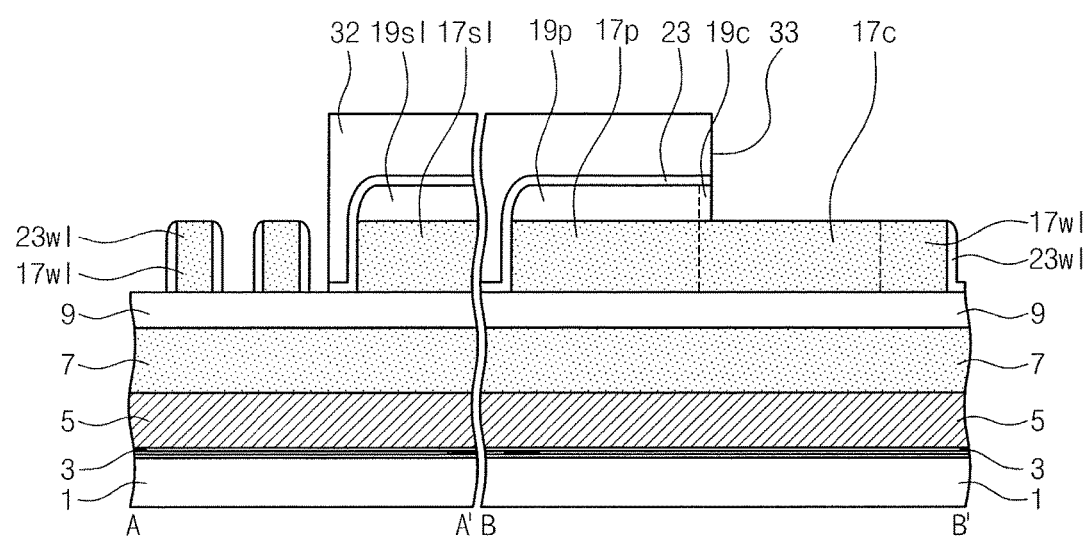

Referring to FIGS. 31A and 31B, an anisotropic etching process using the second photoresist pattern 32 as an etch mask may be performed to remove the first spacer layer 23 and the fourth mask line portions 19wl from top surfaces of the third mask line portions 17wl. In this process, first line spacers 23wl may be formed to cover sidewalls of the third mask line portions 17wl. Furthermore, due to the presence of the recessed opening 33, the first spacer layer 23 and the fourth mask connecting portion 19c may also be removed from the top surface of the third mask connecting portion 17c. In other words, the top surfaces of the third mask connecting portion 17c and the third mask line portions 17wl may be exposed. The first connection spacers 23c may also be formed to cover sidewalls of the third mask connecting portion 17c.

Figure 32A:
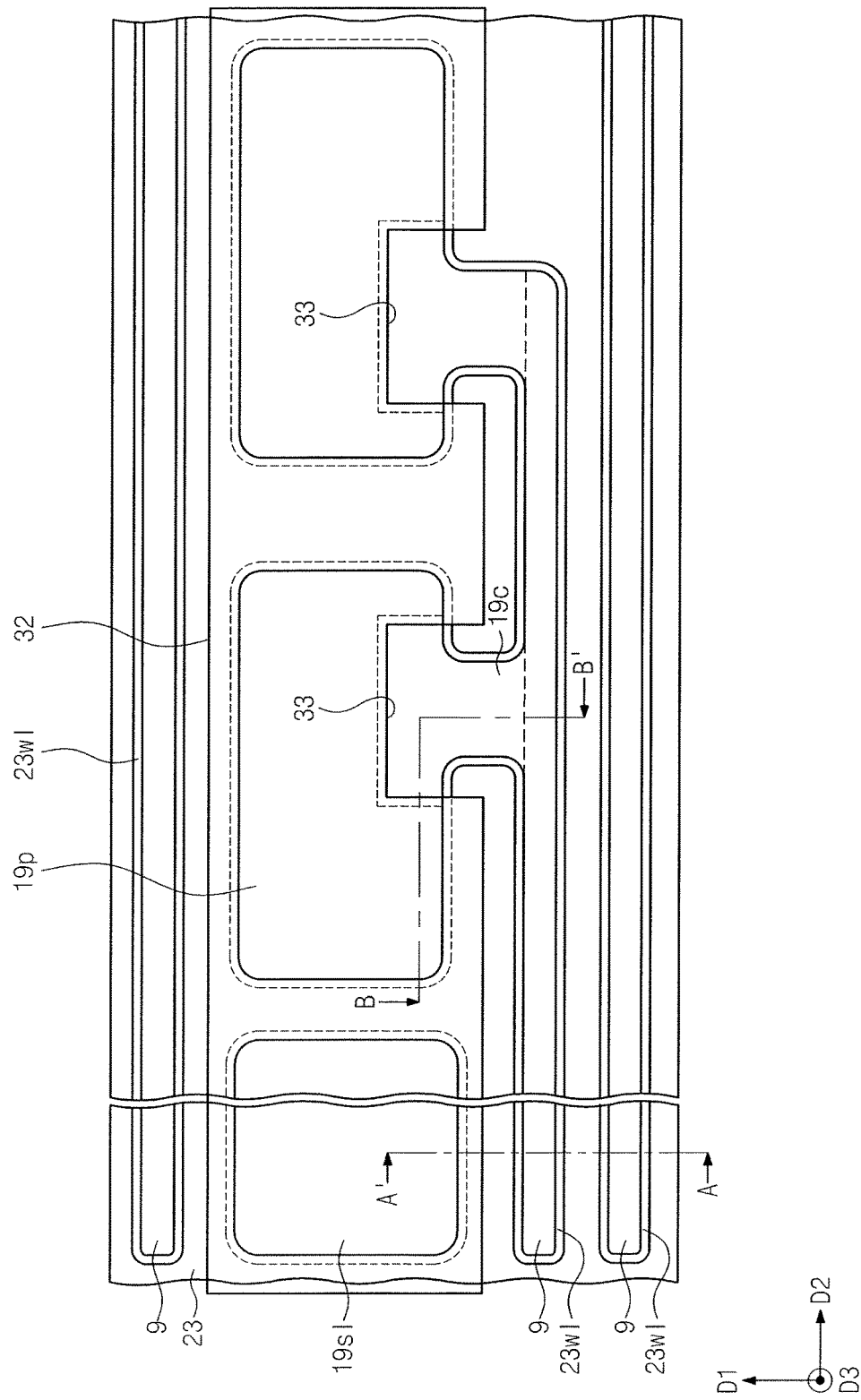
Figure 32B:
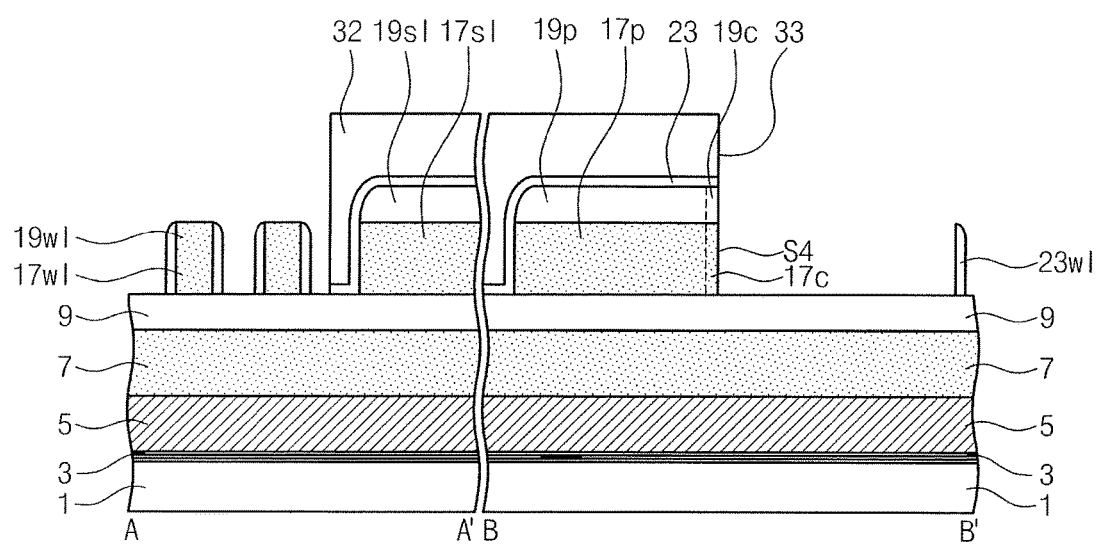

Referring to FIGS. 32A and 32B, an etching process using the second photoresist pattern 32 as an etch mask may be performed to selectively remove the third mask line portions 17wl exposed by the second photoresist pattern 32. At the same time, a large portion of the third mask connecting portion 17c exposed by the second photoresist pattern 32 may also be removed by the etching process. Accordingly, the third mask connecting portion 17c may have a portion remaining after the etching process and defining a line-shaped fourth sidewall S4 in a plan view. When viewed in a plan view, a shape of the fourth sidewall S4 may resemble that of the recessed opening 33 of the second photoresist pattern 32.

Figure 33A:
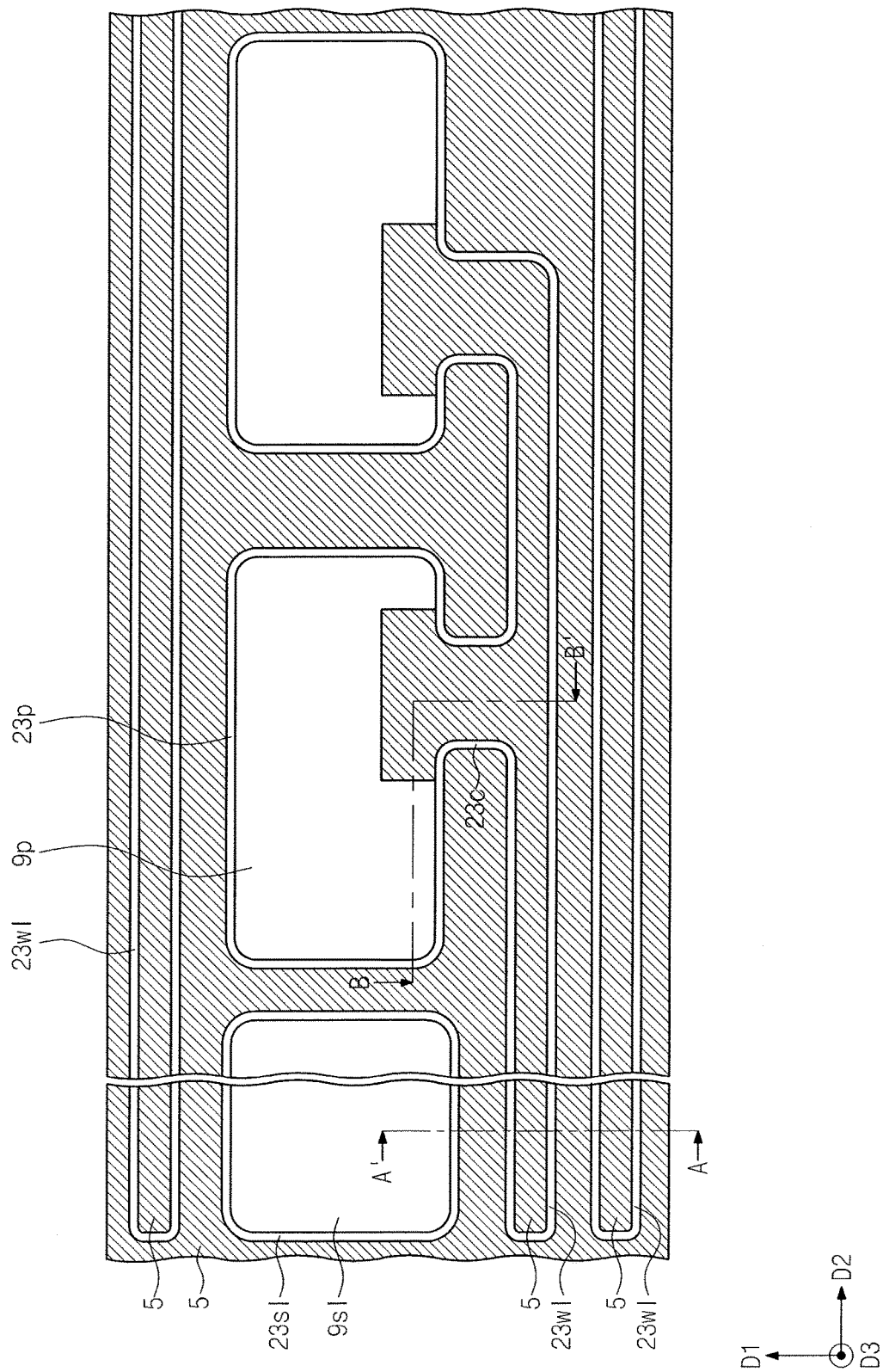
Figure 33B:
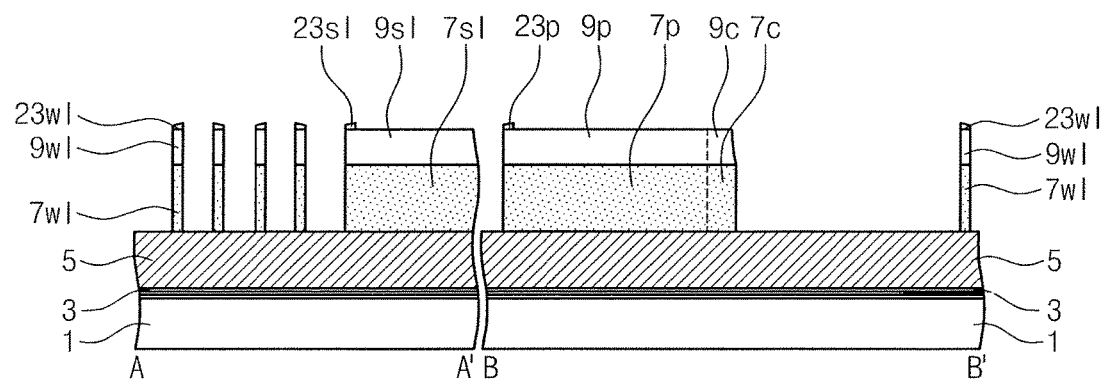

Referring to FIGS. 33A and 33B, the second photoresist pattern 32 may be removed. Thereafter, the second mask layer 9 may be etched using the first line spacers 23wl and the third mask patterns 17sl, 17p and 17c as an etch mask to form second mask patterns 9sl, 9wl, 9p and 9c.

The first mask layer 7 may be etched using the second mask patterns 9sl, 9wl, 9p and 9c as an etch mask to form first mask patterns 7sl, 7wl, 7p and 7c. The conductive layer 5 may be exposed as the result of etching process.

Figure 34A:
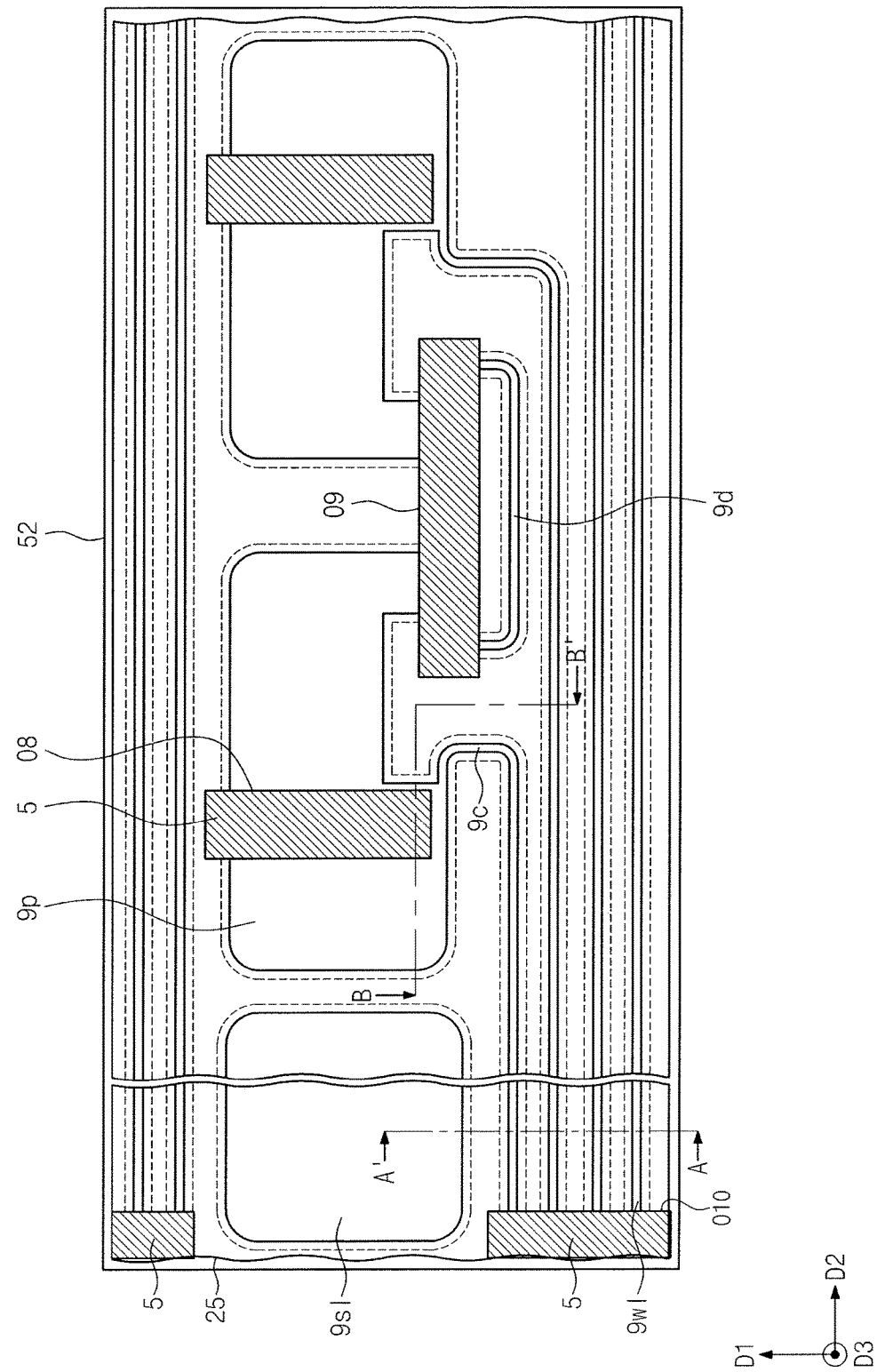
Figure 34B:
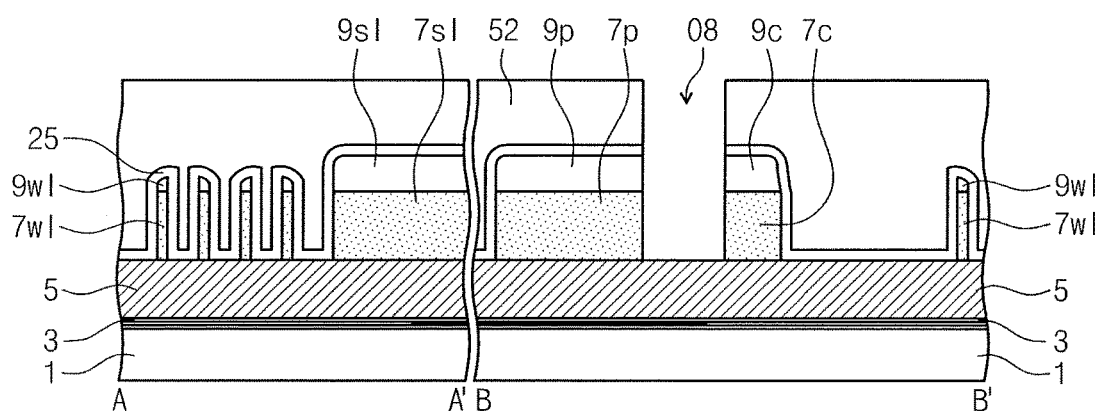

Referring to FIGS. 34A and 34B, the remaining portions of the first spacers 23sl, 23wl, 23p and 23c may be removed. A second spacer layer 25 may be conformally formed on the substrate 1. A fourth photoresist pattern 52 including eighth to tenth openings O8, O9 and O10 may be formed on the second spacer layer 25 (for example, see FIGS. 10A and 10B). The eighth opening O8 may be formed to cross a portion near a center of the second mask pad portion 9p, but it may be formed to be not overlapped with the second mask connecting portion 9c, in a plan view. The ninth opening O9 may be formed to be overlapped with a pair of the second mask connecting portion 9c, which are connected to two adjacent ones of the second mask pad portions 9p. The tenth opening O10 may be formed to be overlapped with end portions of the second mask line portions 9wl.

The second spacer layer 25, the second word line mask pattern 9wl, 9p and 9c and the first word line mask pattern 7wl, 7p and 7c may be sequentially etched using the fourth photoresist pattern 52 as an etch mask through the eighth to tenth openings O8, O9 and O10 to expose the conductive layer 5.

Figure 35A:
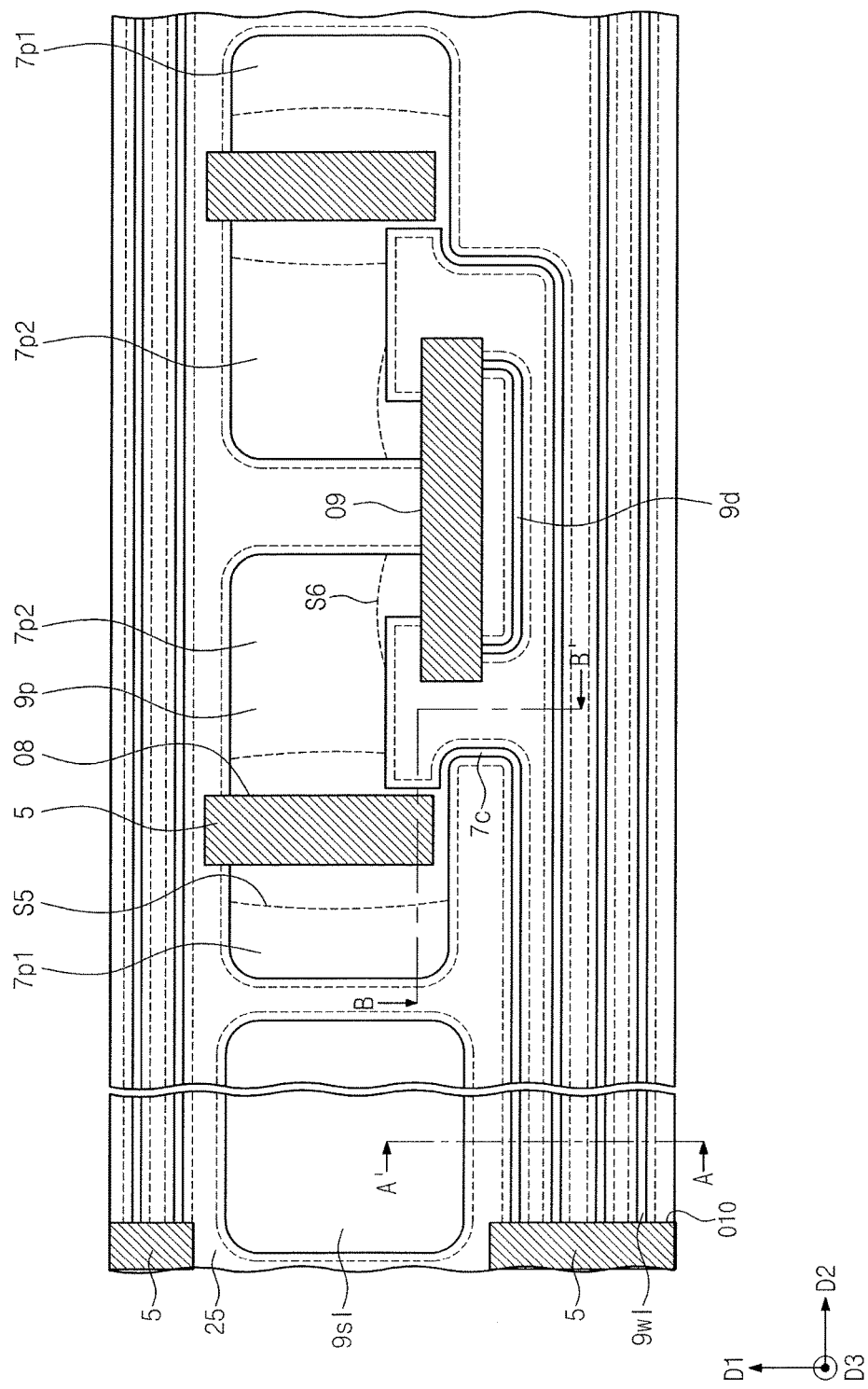
Figure 35B:
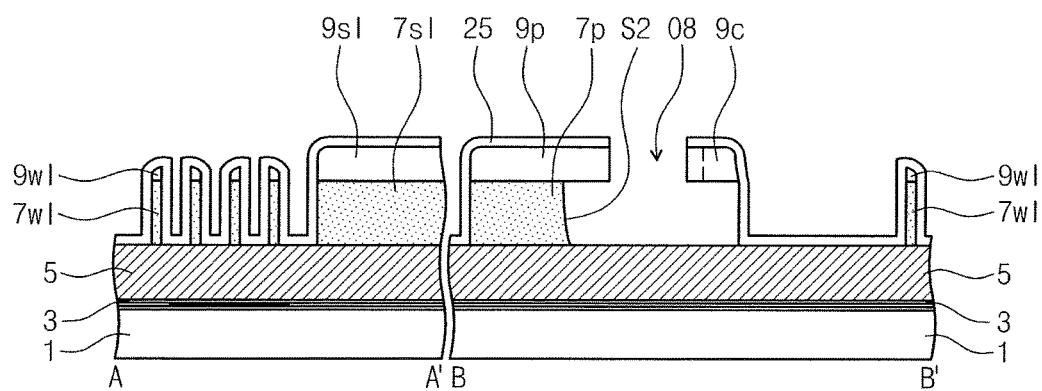

Referring to FIGS. 35A and 35B, the fourth photoresist pattern 52 may be selectively removed to expose the second spacer layer 25. An isotropic etching process may be performed to remove portions of the first word line mask pattern 7wl, 7p and 7c exposed by the eighth to tenth openings O8, O9 and O10. Accordingly, below the second mask pad portion 9p, the first mask pad portion 7p may be divided into two first mask pad portions 7p1 and 7p2.

Figure 36A:
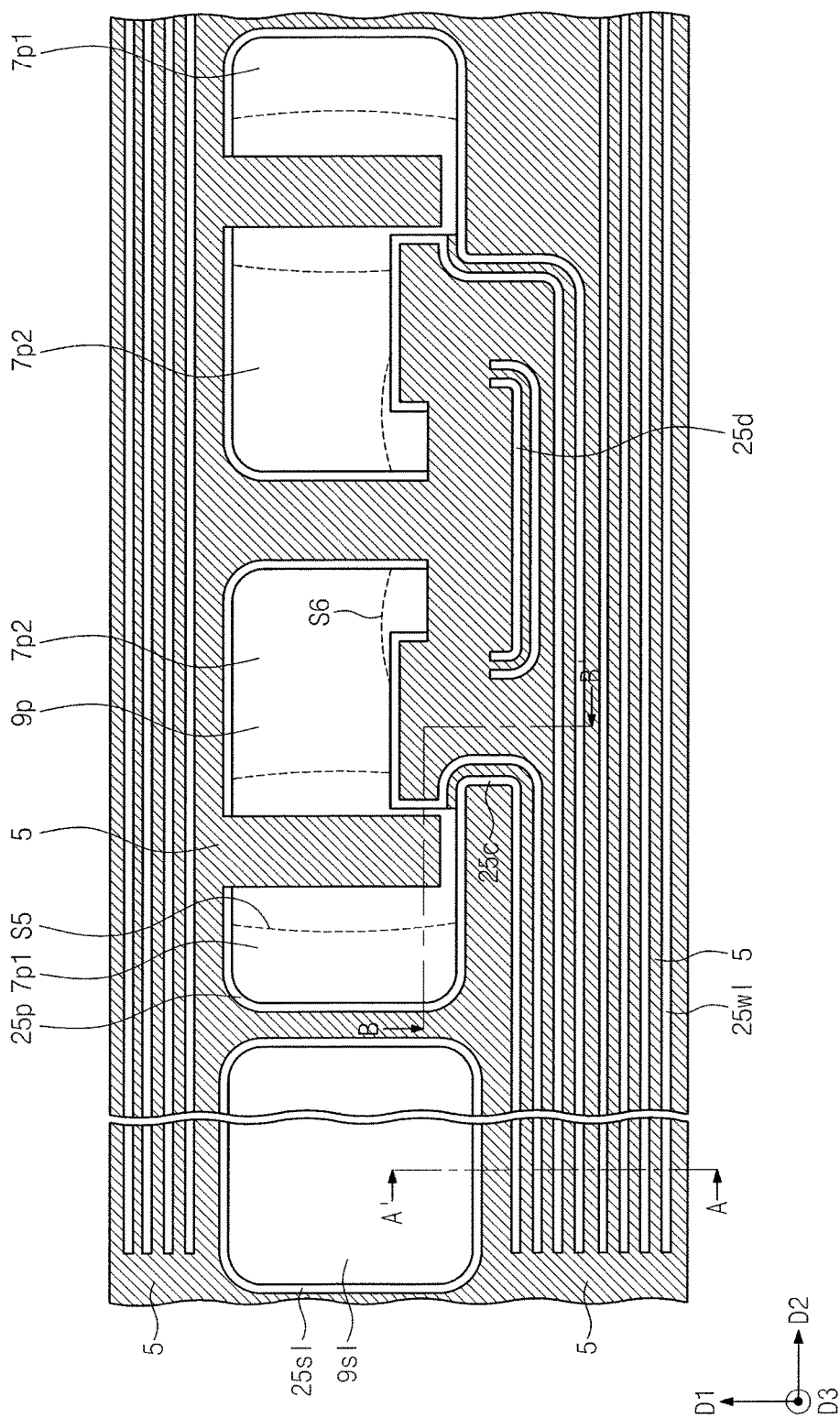
Figure 36B:
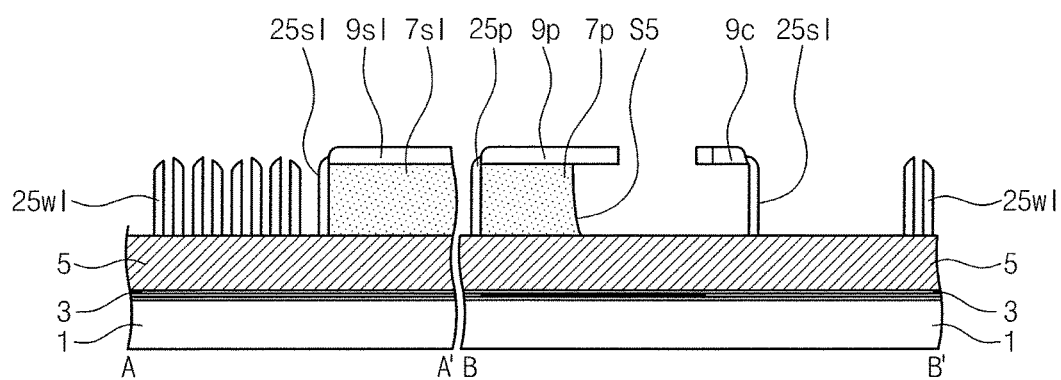

Referring to FIGS. 36A and 36B, an anisotropic etching process may be performed with respect to the second spacer layer 25 to form second spacers 25sl, 25wl, 25p, 25c and 25d. The second mask line portion 9w, the second dummy mask line portion 9d and the second mask connecting portion 9c may be removed to expose top surfaces of the first mask line portion 7wl, the first dummy mask line portion 7d and the first mask connecting portion 7c. The first mask line portion 7wl, the first dummy mask line portion 7d and the first mask connecting portion 7c may be removed to expose the conductive layer 5 thereunder.

Figure 37A:
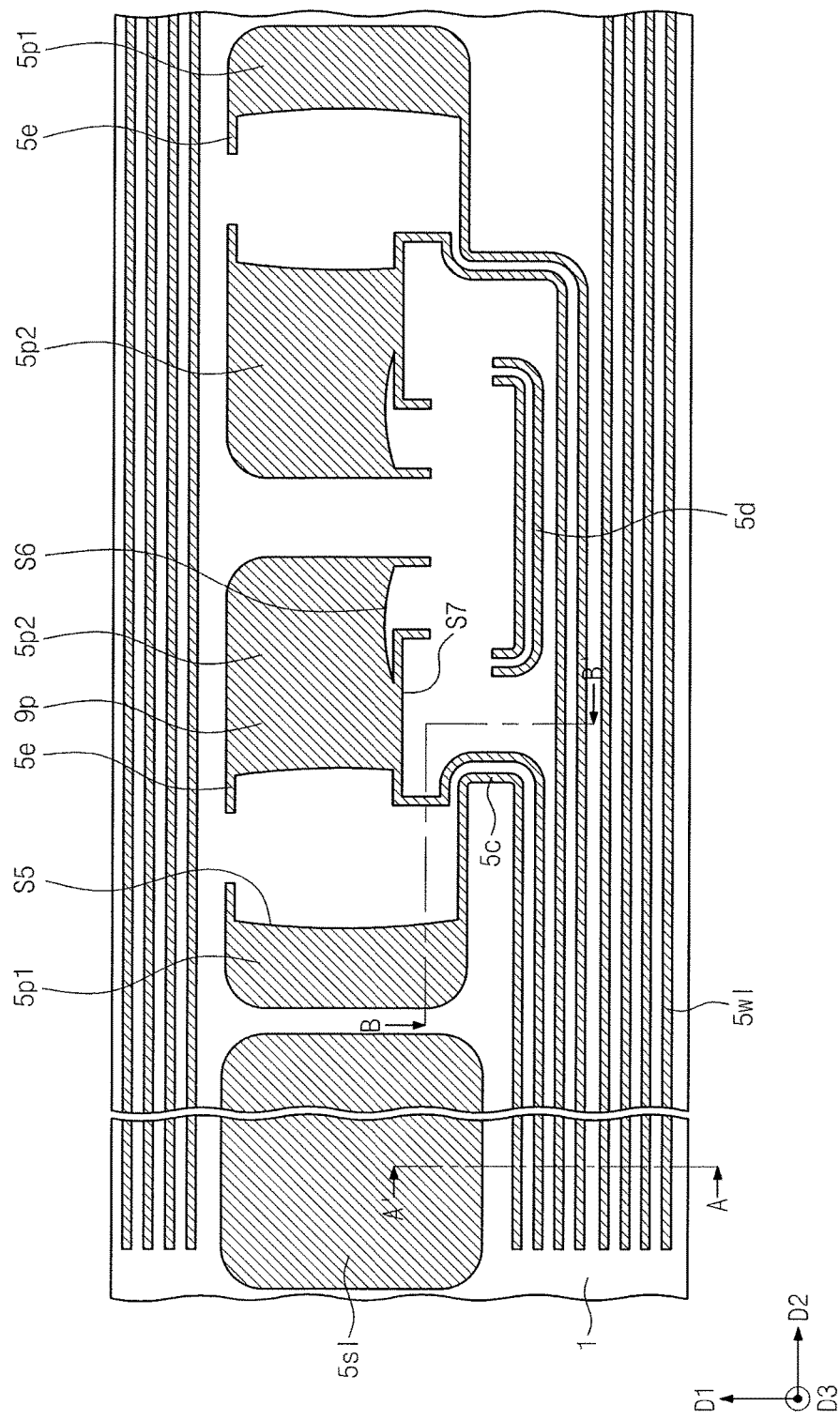
Figure 37B:
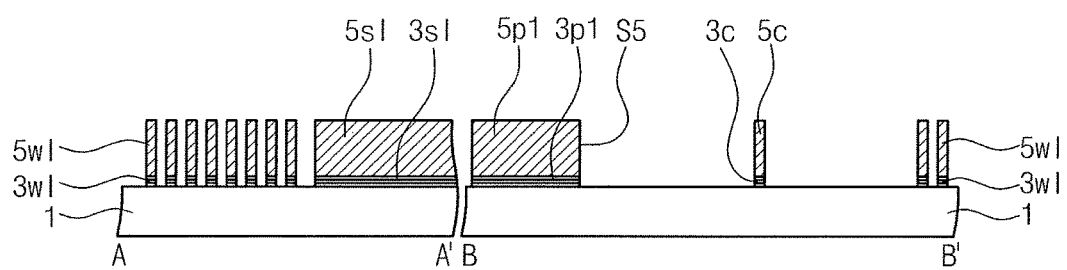

Referring to FIGS. 37A and 37B, the remaining second mask pattern 9sl, 9p and 9c may be selectively removed to expose the first mask patterns 7sl, 7p1 and 7p2 thereunder.

The conductive layer 5 and the gate insulating layer 3 may be etched using the second gate spacers 25sl, 25wl, 25p, 25c and 25d and the first mask patterns 7sl, 7p1 and 7p2 as an etch mask to form conductive patterns 5sl, 5wl, 5p1, 5p2, 5c and 5d and gate insulating patterns 3sl, 3wl, 3p1, 3p2, 3c and 3d.

Referring back to FIGS. 26A and 26B, a selection line 5sl may be patterned using an additional photoresist pattern to form a first selection line 5s/1 and a second selection line 5s/2. The additional photoresist pattern may be similar to the third photoresist pattern 42 described with reference to FIGS. 16A and 16B. In present embodiment, word lines 5wl, 5p1, 5p2 and 5c may be already separated from each other by fourth photoresist pattern 52 for node separation. Accordingly, unlike the third photoresist pattern 42 described with reference to FIGS. 16A and 16B, the additional photoresist pattern may include the only fifth opening O5 on the selection line 5sl.

During the formation of the first and second selection lines 5sl and 5s/2, an upper portion of the substrate 1 may be over-etched, and thereby a trench TR2 may be formed. When viewed in a plan view, its shape and location may be similar to those of the second trench TR2 described with reference to FIGS. 17A and 17B.

Figure 38:
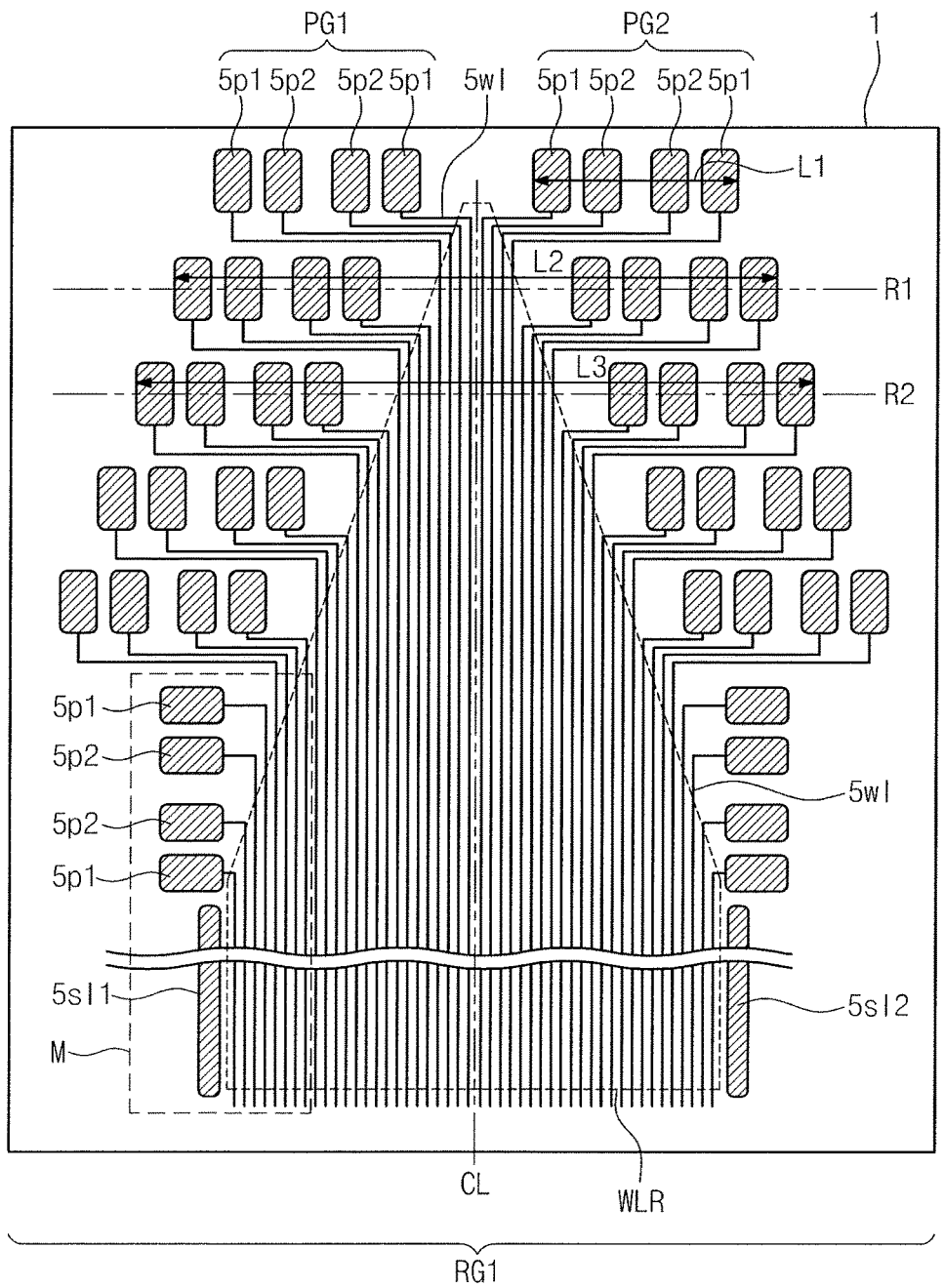
FIG. 38 illustrates a plan view of a first region of a semiconductor device according to example embodiments.

FIG. 38 is a plan view illustrating a first region of a semiconductor device according to example embodiments. In present embodiment, the detailed description of parts similar to or repeated with that described with reference to FIGS. 1A to 1C, 18A, 18B, 26A and 26B will be omitted, and only the difference will be described in detail.

Referring to FIG. 38, a plurality of word lines 5wl, 5p1, 5p2 and first and second selection lines 5s/1 and 5s/2 may be disposed on a first region RG1 of a substrate 1. The word lines 5wl, 5p1, 5p2 may include line portions 5wl and pad portions 5p1 and 5p2.

The pad portions 5p1 and 5p2 may constitute a first pad group PG1 and a second pad group PG2. Each of the first pad group PG1 and the second pad group PG2 may include a pair of first pad portions 5P1 and a pair of second pad portions 5P2. Any one of the pair of first pad portions 5*p*1 may be spaced apart from the other one of the pair of first pad portions 5*p*1 with the pair of second pad portions 5*p*2 interposed therebetween. Each of the first and second pad groups PG1 and PG2 may have a first length L1 in a first direction D1.

The first pad group PG1 and the second pad group PG2 arranged in the first direction D1 may constitute one row. For example, the first and second pad groups PG1 and PG2 may constitute a first row R1 and a second row R2. The first row R1 and the second row R2 may be spaced apart from each other in a second direction D2. The first row R1 may have a second length L2, and the second row R2 may have a third length L3. The second row R2 may have a length greater than that of the first row R1. In other words, a plurality of rows may have lengths decreasing farther away from the selection lines 5*sl* and 5*sl*2 in the second direction D2.

The first pad group PG1 and the second pad group PG2, which are arranged with one row, may have substantially mirror symmetry with respect to a center line CL therebetween.

The pad portions 5*p*1 and 5*p*2 may be arranged in the second direction D2. The selection lines 5*sl*1 and 5*sl*2 may be disposed to be adjacent to the pad portions 5*p*1 and 5*p*2. For example, the first selection line 5*sl*1 may serve as a string selection line, and the second selection line 5*sl*2 may serve as a ground selection line.

The line portions 5*wl* may be interposed between the pad portions 5*p*1 and 5*p*2 and between the selection lines 5*sl*1 and 5*sl*2. The line portions 5*wl* may be connected to the pad portions 5P1 and 5*p*2, respectively. Each of the line portions 5*wl* may include a first portion extending in the second direction D2 and a second portion extending in the first direction D1. The first portions of the line portions 5*wl* may be disposed on the word line region WLR. The first portions of the line portions 5*wl* may extend parallel to each other in the second direction D2, and may be spaced apart from each other in the first direction D1.

The word line region WLR may have a width gradually decreasing farther away from the selection lines 5*sl* and 5*sl*2 in the second direction D2. The line portions 5*wl* may be sequentially connected to the pad portions 5*p*1 and 5*p*2 along the second direction D2. Accordingly, the number of line portions 5*wl* may decrease further away from the selection lines 5*sl* and 5*sl*2 in the second direction D2. Accordingly, the word line region WLR may be a cuspidal-shaped polygon (for example, triangle shape)

The first and second selection lines 5*sl*1 and 5*sl*2 and the line portions 5*wl* interposed therebetween may constitute a string in NAND FLASH memory device. A dotted region M may include the first selection line 5*sl*1, the line portions 5*wl* and the pad portions 5*p*1 and 5*p*2 arranged along the second direction D2. Specific embodiments of the dotted region M may be similar to that described above with reference to FIGS. 1A to 1C, 18A, 18B, 26A and 26B.

By way of summation and review, an etching process is simultaneously performed with respect to the word lines, selection lines, and peripheral gate to separate from one another for node separation. The top surface of the insulating layer covering the word lines, selection lines, and peripheral gate is substantially level and at a constant distance from the substrate in all regions, i.e., both regions RG1 and RG2. Further, the substrate is over-etched by the etching process, and thereby trenches are defined in an upper portion of the substrate, e.g., to improve separation and insulation between word lines and selection lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first conductive pattern including a line portion and a pad portion connected to the line portion on a substrate;
   a gate insulating pattern and a second conductive pattern sequentially stacked on the substrate;
   a capping layer on the first and second conductive patterns; and
   a first trench defined in an upper portion of the substrate, the first trench being adjacent to a side of the second conductive pattern,
   wherein the capping layer at least partially fills the first trench, a total thickness of the capping layer on and parallel to the bottom of the first trench being smaller than a depth of the first trench.

2. The semiconductor device as claimed in claim 1, wherein a second trench is defined in an upper portion of the substrate, the second trench being adjacent to an end portion of the line portion, and the capping layer at least partially filling the second trench.

3. The semiconductor device as claimed in claim 2, further comprising a device isolation layer below the end portion of the line portion in the upper portion of the substrate, the second trench being deeper in the substrate than the device isolation layer.

4. The semiconductor device as claimed in claim 1, wherein:
   the first conductive pattern is provided in a plurality, and the line portions of the plurality of first conductive patterns are adjacent to each other, and
   an insulating layer is positioned between the capping layer and the first and second conductive patterns, at least one air gap surrounded by the insulating layer being defined between the line portions.

5. The semiconductor device as claimed in claim 1, wherein the substrate includes a string region and a peripheral region, and the first and second conductive patterns are on the string region and the peripheral region, respectively.

6. The semiconductor device as claimed in claim 5, wherein a top surface of the capping layer on the first conductive pattern is located at a substantially same level as a top surface of the capping layer on the second conductive pattern.

7. The semiconductor device as claimed in claim 1, wherein, when viewed in a plan view, the pad portion includes a first concave sidewall and a second linear sidewall adjacent to the first concave sidewall.

8. The semiconductor device as claimed in claim 1, wherein, when viewed in a plan view, the pad portion includes:

a first concave sidewall and a second concave sidewall adjacent to the first concave sidewall; and a protruding portion protruding between the first and second concave sidewalls.

9. A semiconductor device, comprising:

a device isolation layer defining at least one active region in an upper portion of a substrate;

a first conductive pattern including a first line portion and a first pad portion connecting the first line portion on the substrate; and a second conductive pattern including a second line portion and a second pad portion connecting the second line portion, wherein the first and second conductive patterns are adjacent to each other, and each of the first and second line portions crosses over the at least one active region, and wherein a first trench is defined in an upper portion of the substrate between the first and second pad portions, the first trench having a non-overlapping relationship with the device isolation layer along a vertical direction, and the first trench has a deeper depth than a depth of the device isolation layer.

10. The semiconductor device as claimed in claim 9, wherein a second trench is defined adjacent to an end portion of at least one of the first and second line portions in an upper portion of the substrate, and the second trench has a deeper depth than a depth of the device isolation layer.

11. The semiconductor device as claimed in claim 10, further comprising a spacer covering a sidewall of the second conductive pattern, the spacer being adjacent to the one side of the second conductive pattern, and a lower portion of the spacer partially filling the first trench.

12. The semiconductor device as claimed in claim 9, further comprising a capping layer on the first and second conductive patterns, the capping layer at least partially filling the first trench.

13. The semiconductor device as claimed in claim 9, wherein an air gap is defined in a space between the first and second line portions.

14. The semiconductor device as claimed in claim 9, wherein, when viewed in a plan view, at least one of the first and second pad portions includes a first concave sidewall and a second linear sidewall adjacent to the first concave sidewall.

15. The semiconductor device as claimed in claim 9, wherein, when viewed in a plan view, at least one of the first and second pad portions includes:

a first concave sidewall and a second concave sidewall adjacent to the first concave sidewall; and a protruding portion protruding between the first and second concave sidewalls.

16. A semiconductor device, comprising:

a device isolation layer defining at least one active region in an upper portion of a substrate;

a first word line and a second word line crossing the at least one active region and extending parallel to each other in a first direction, the second word line being spaced apart from the first word line in a second direction crossing the first direction; and a first selection line and a second selection line between the first and second word lines, wherein a first trench is defined in an upper portion of the substrate between the first and second selection lines, the first trench having a non-overlapping relationship with the device isolation layer along a vertical direction, and the first trench having a deeper depth than a depth of the device isolation layer.

17. The semiconductor device as claimed in claim 16, wherein:

the first word line includes a plurality of first word lines, and the second word line includes a plurality of second word lines, and the first word lines and the first selection line constitute a first string, and the second word lines and the second selection line constitute a second string.

18. The semiconductor device as claimed in claim 16, further comprising:

a first spacer covering a first sidewall of the first selection line; and a second spacer covering a second sidewall of the second selection line, the first sidewall and the second sidewall face each other, and the lower portions of the first and second spacers partially filling the first trench.

19. The semiconductor device as claimed in claim 16, wherein a second trench is defined adjacent to an end portion of at least one of the first and second word lines in an upper portion of the substrate, and the second trench has a deeper depth than a depth of the device isolation layer.

20. The semiconductor device as claimed in claim 16, further comprising a capping layer on the first and second word lines and the first and second selection lines, the capping layer at least partially filling the first trench.

* * * * *